(12) United States Patent
Lin et al.

(10) Patent No.: US 12,002,534 B2
(45) Date of Patent: Jun. 4, 2024

(54) MEMORY ARRAY WORD LINE ROUTING

(71) Applicant: Taiwan Semiconductor Manufacturing Co., Ltd., Hsinchu (TW)

(72) Inventors: Meng-Han Lin, Hsinchu (TW); Chenchen Jacob Wang, Hsinchu (TW); Yi-Ching Liu, Hsinchu (TW); Han-Jong Chia, Hsinchu (TW); Sai-Hooi Yeong, Zhubei (TW); Yu-Ming Lin, Hsinchu (TW); Yih Wang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 106 days.

(21) Appl. No.: 17/842,256

(22) Filed: Jun. 16, 2022

(65) Prior Publication Data

US 2022/0310132 A1    Sep. 29, 2022

Related U.S. Application Data

(62) Division of application No. 17/015,679, filed on Sep. 9, 2020, now Pat. No. 11,404,091.

(Continued)

(51) Int. Cl.
*G11C 5/06*    (2006.01)
*H01L 29/24*    (2006.01)
(Continued)

(52) U.S. Cl.
CPC .............. *G11C 5/063* (2013.01); *H01L 29/24* (2013.01); *H01L 29/78391* (2014.09);
(Continued)

(58) Field of Classification Search
CPC ........ G11C 5/063; H10B 51/00; H10B 51/10; H10B 51/20; H10B 51/30; H10B 51/40;
(Continued)

(56) References Cited

U.S. PATENT DOCUMENTS 6,274,453 B1    8/2001    Schlosser et al.
6,627,940 B1    9/2003    Schumann et al.
(Continued)

FOREIGN PATENT DOCUMENTS

CN    103545279 A    1/2014
CN    109075172 A    12/2018
(Continued)

*Primary Examiner* — Matthew E Warren
(74) *Attorney, Agent, or Firm* — Slater Matsil, LLP

(57) ABSTRACT

Routing arrangements for 3D memory arrays and methods of forming the same are disclosed. In an embodiment, a memory array includes a ferroelectric (FE) material contacting a first word line; an oxide semiconductor (OS) layer contacting a source line and a bit line, the FE material being disposed between the OS layer and the first word line; a dielectric material contacting the FE material, the FE material being between the dielectric material and the first word line; an inter-metal dielectric (IMD) over the first word line; a first contact extending through the IMD to the first word line, the first contact being electrically coupled to the first word line; a second contact extending through the dielectric material and the FE material; and a first conductive line electrically coupling the first contact to the second contact.

20 Claims, 79 Drawing Sheets

Related U.S. Application Data

(60) Provisional application No. 63/041,161, filed on Jun. 19, 2020.

(51) Int. Cl.
  *H01L 29/78* (2006.01)
  *H01L 29/786* (2006.01)
  *H10B 41/27* (2023.01)
  *H10B 51/00* (2023.01)
  *H10B 51/10* (2023.01)
  *H10B 51/20* (2023.01)

(52) U.S. Cl.
  CPC ......... *H01L 29/7869* (2013.01); *H10B 41/27* (2023.02); *H10B 51/00* (2023.02); *H10B 51/10* (2023.02); *H10B 51/20* (2023.02)

(58) Field of Classification Search
  CPC ... H10B 41/27; H01L 29/24; H01L 29/78391; H01L 29/7869
  See application file for complete search history.

(56) References Cited

U.S. PATENT DOCUMENTS

| | | | |
|---|---|---|---|
| 8,349,681 B2 | 1/2013 | Alsmeier et al. | |
| 9,281,044 B2 | 3/2016 | Ramaswamy et al. | |
| 9,484,389 B2 | 11/2016 | Wouters et al. | |
| 9,496,274 B2 | 11/2016 | Pachamuthu et al. | |
| 9,570,464 B1 | 2/2017 | Wakatsuki et al. | |
| 9,620,712 B2 | 4/2017 | Hayashi et al. | |
| 9,748,257 B2 | 8/2017 | Lee et al. | |
| 9,947,721 B2 | 4/2018 | Fantini | |
| 9,953,992 B1 | 4/2018 | Ogawa et al. | |
| 10,056,150 B2 * | 8/2018 | Ikeda | H10B 43/35 |
| 10,096,615 B2 | 10/2018 | Lee et al. | |
| 10,109,639 B1 | 10/2018 | DeForge et al. | |
| 10,115,681 B1 | 10/2018 | Ariyoshi | |
| 10,256,248 B2 * | 4/2019 | Lu | H01L 23/498 |
| 10,446,437 B2 | 10/2019 | Yang | |
| 10,593,399 B2 | 3/2020 | Fratin et al. | |
| 10,629,809 B2 | 4/2020 | Yamakawa | |
| 10,930,333 B2 | 2/2021 | Chen et al. | |
| 11,011,529 B2 | 5/2021 | Ramaswamy | |
| 11,133,325 B2 | 9/2021 | Dai et al. | |
| 11,152,386 B2 | 10/2021 | Or-Bach et al. | |
| 11,355,516 B2 | 6/2022 | Yang et al. | |
| 11,423,966 B2 * | 8/2022 | Lin | H10B 51/20 |
| 2002/0130345 A1 | 9/2002 | Saigoh et al. | |
| 2004/0058493 A1 | 3/2004 | Demange et al. | |
| 2010/0123177 A1 | 5/2010 | Ozaki | |
| 2010/0181610 A1 | 7/2010 | Kim et al. | |
| 2010/0207186 A1 | 8/2010 | Higashi et al. | |
| 2011/0049646 A1 | 3/2011 | Lim et al. | |
| 2011/0199804 A1 | 8/2011 | Son et al. | |
| 2012/0104484 A1 | 5/2012 | Lee et al. | |
| 2013/0161821 A1 | 6/2013 | Hwang et al. | |
| 2014/0015057 A1 | 1/2014 | Lee et al. | |
| 2014/0048868 A1 | 2/2014 | Kim et al. | |
| 2014/0160841 A1 | 6/2014 | Koval | |
| 2014/0362644 A1 | 12/2014 | Lue et al. | |
| 2015/0243674 A1 | 8/2015 | Shih et al. | |
| 2016/0027514 A1 | 1/2016 | Sim et al. | |
| 2016/0071860 A1 * | 3/2016 | Kai | H10B 43/10 257/321 |
| 2016/0118404 A1 | 4/2016 | Peng | |
| 2016/0148947 A1 | 5/2016 | Seo et al. | |
| 2016/0163686 A1 | 6/2016 | Lee et al. | |
| 2016/0181259 A1 | 6/2016 | Van Houdt et al. | |
| 2016/0322381 A1 | 11/2016 | Liu et al. | |
| 2017/0148800 A1 | 5/2017 | Nishikawa et al. | |
| 2017/0236831 A1 | 8/2017 | Kim | |
| 2017/0301684 A1 | 10/2017 | Park et al. | |
| 2017/0373079 A1 | 12/2017 | Sharangpani et al. | |
| 2018/0026044 A1 | 1/2018 | Utsumi et al. | |
| 2018/0130823 A1 | 5/2018 | Kim | |
| 2018/0269229 A1 | 9/2018 | Or-Bach et al. | |
| 2019/0067324 A1 | 2/2019 | Zhang et al. | |
| 2019/0115071 A1 | 4/2019 | Nardi et al. | |
| 2019/0123061 A1 | 4/2019 | Liu | |
| 2019/0287985 A1 * | 9/2019 | Shimojo | H10B 43/35 |
| 2020/0006378 A1 | 1/2020 | Huo | |
| 2020/0119047 A1 | 4/2020 | Yoo et al. | |
| 2020/0152502 A1 | 5/2020 | Hsu | |
| 2020/0168630 A1 | 5/2020 | Borukhov | |
| 2020/0176464 A1 * | 6/2020 | Jang | H01L 23/5226 |
| 2020/0185411 A1 | 6/2020 | Herner et al. | |
| 2020/0194431 A1 | 6/2020 | Castro et al. | |
| 2020/0227428 A1 | 7/2020 | Liu et al. | |
| 2020/0286530 A1 | 9/2020 | Lee et al. | |
| 2020/0295033 A1 | 9/2020 | Sakamoto et al. | |
| 2020/0381037 A1 | 12/2020 | Kim et al. | |
| 2021/0043654 A1 | 2/2021 | Yoo et al. | |
| 2021/0118861 A1 | 4/2021 | Yun et al. | |
| 2021/0175253 A1 | 6/2021 | Han et al. | |
| 2021/0202514 A1 | 7/2021 | Han | |
| 2021/0217772 A1 | 7/2021 | Zhang | |
| 2021/0242241 A1 * | 8/2021 | Rajashekhar | H01L 29/42344 |
| 2021/0391315 A1 | 12/2021 | Zhang | |
| 2021/0407848 A1 | 12/2021 | Chia et al. | |
| 2022/0020770 A1 | 1/2022 | Yang et al. | |
| 2022/0020771 A1 | 1/2022 | Yang et al. | |
| 2022/0037361 A1 | 2/2022 | Lin et al. | |
| 2022/0037362 A1 | 2/2022 | Lin et al. | |
| 2022/0216223 A1 | 7/2022 | Xu et al. | |

FOREIGN PATENT DOCUMENTS

| | | | |
|---|---|---|---|
| CN | 110268523 A | 9/2019 | |
| CN | 110447103 A | 11/2019 | |
| CN | 110808332 A | 2/2020 | |
| CN | 111180451 A | 5/2020 | |
| JP | 2010034109 A | 2/2010 | |
| JP | 2015122478 A | 7/2015 | |
| KR | 20090125893 A | 12/2009 | |
| KR | 20110112727 A | 10/2011 | |
| KR | 20140008622 A | 1/2014 | |
| KR | 20140024632 A | 3/2014 | |
| KR | 20170048393 A | 5/2017 | |
| KR | 20170089378 A | 8/2017 | |
| KR | 20170131945 A | 12/2017 | |
| KR | 20190012061 A | 2/2019 | |
| KR | 20190064852 A | 6/2019 | |
| KR | 20190105604 A | 9/2019 | |
| KR | 20190118751 A | 10/2019 | |
| KR | 20200008828 A | 1/2020 | |
| KR | 20200035469 A | 4/2020 | |
| KR | 20210045538 A | 4/2021 | |
| TW | 461083 B | 10/2001 | |
| TW | 201510994 A | 3/2015 | |
| TW | 201737434 A | 10/2017 | |
| TW | 201814839 A | 4/2018 | |
| TW | 201905916 A | 2/2019 | |
| TW | 201913971 A | 4/2019 | |
| TW | 201946253 A | 12/2019 | |
| TW | 202010102 A | 3/2020 | |
| WO | 2018136730 A1 | 7/2018 | |
| WO | 2021029916 A1 | 2/2021 | |
| WO | WO-2021029916 A1 * | 2/2021 | G11C 5/063 |

\* cited by examiner

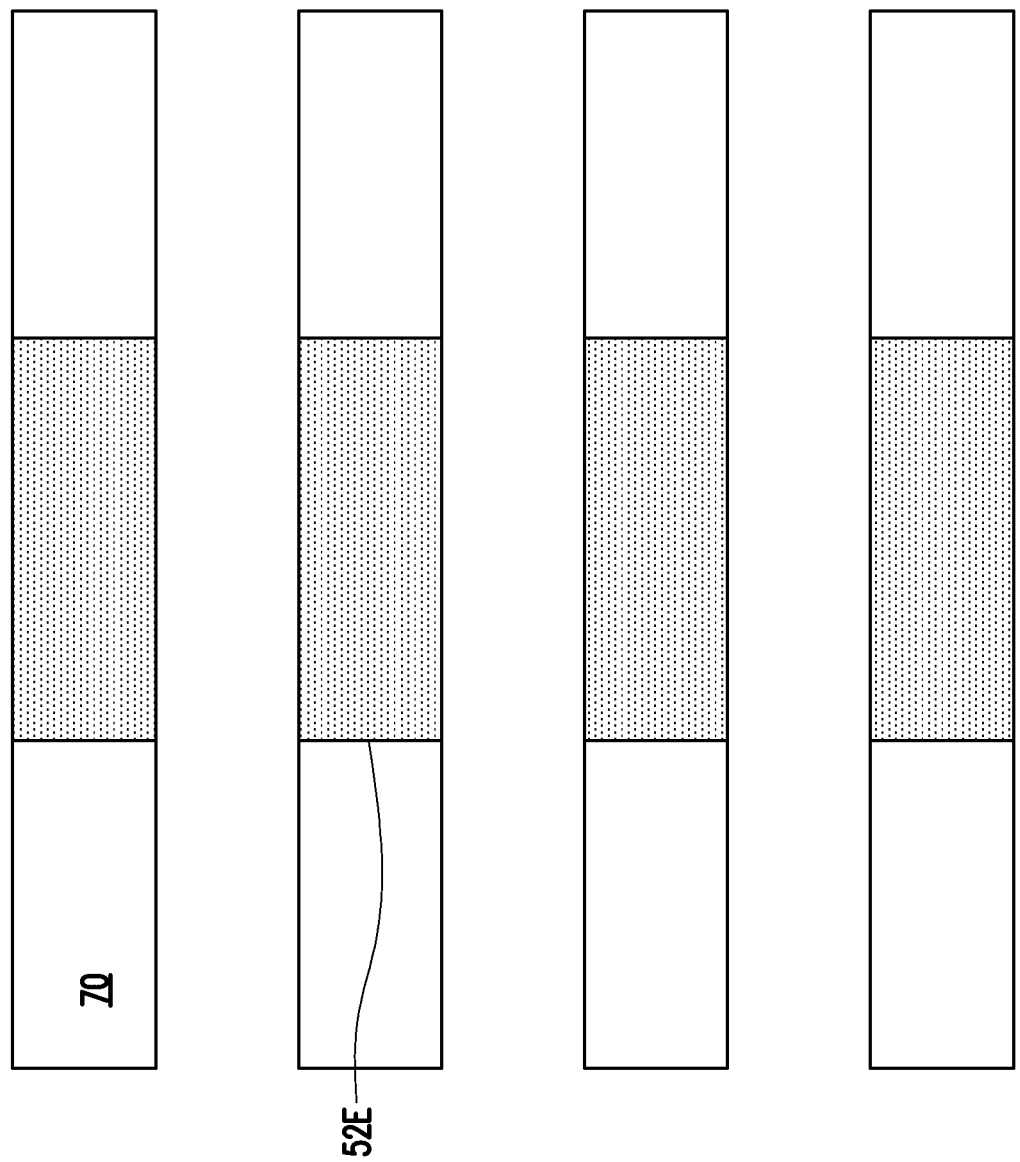

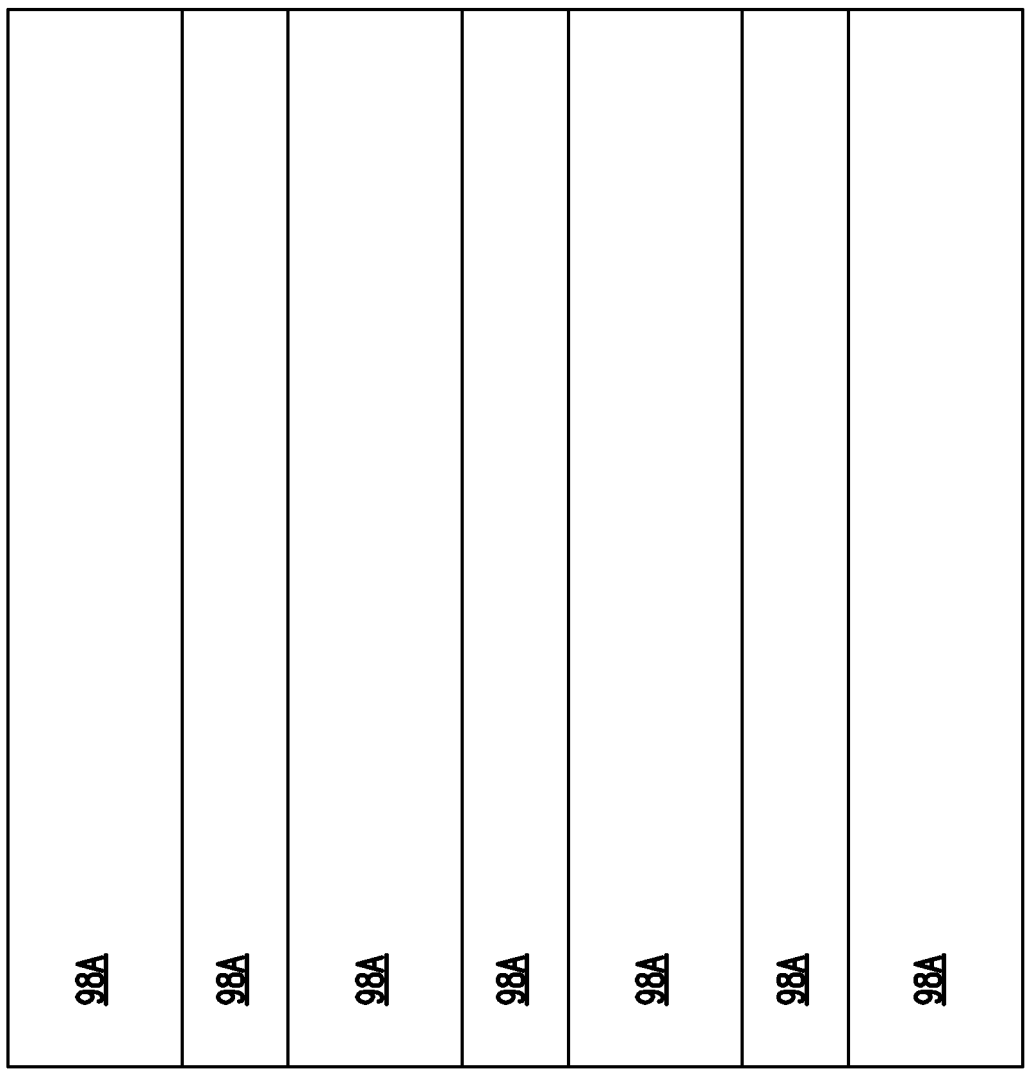

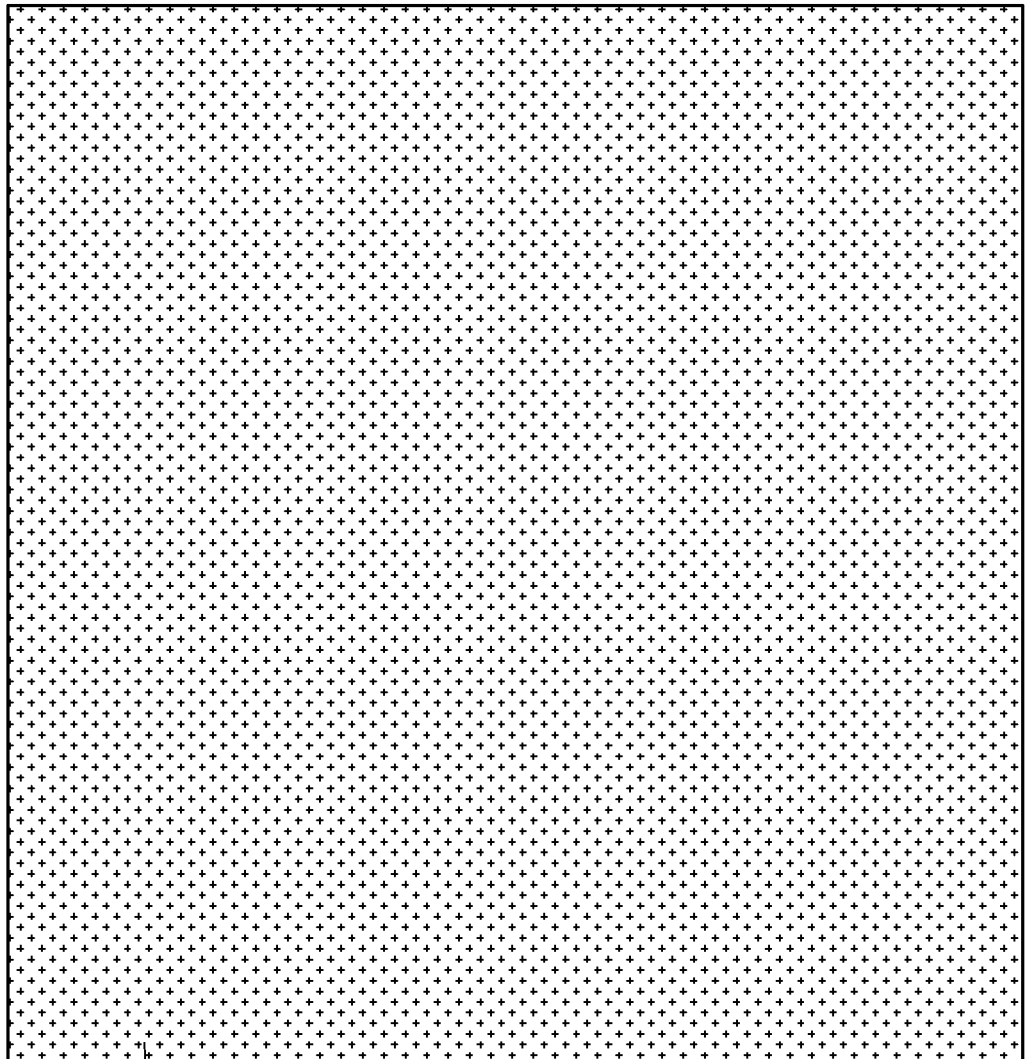

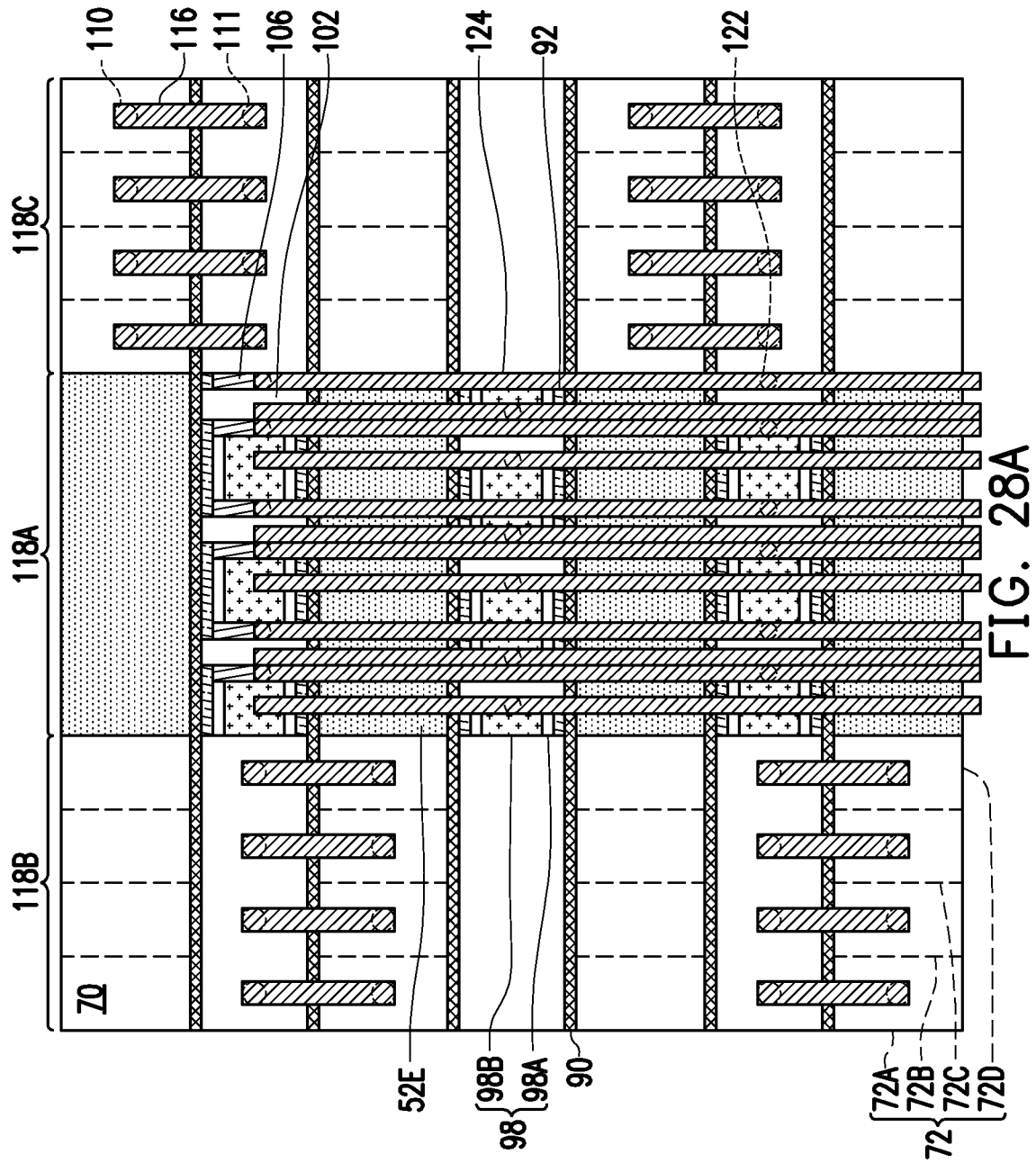

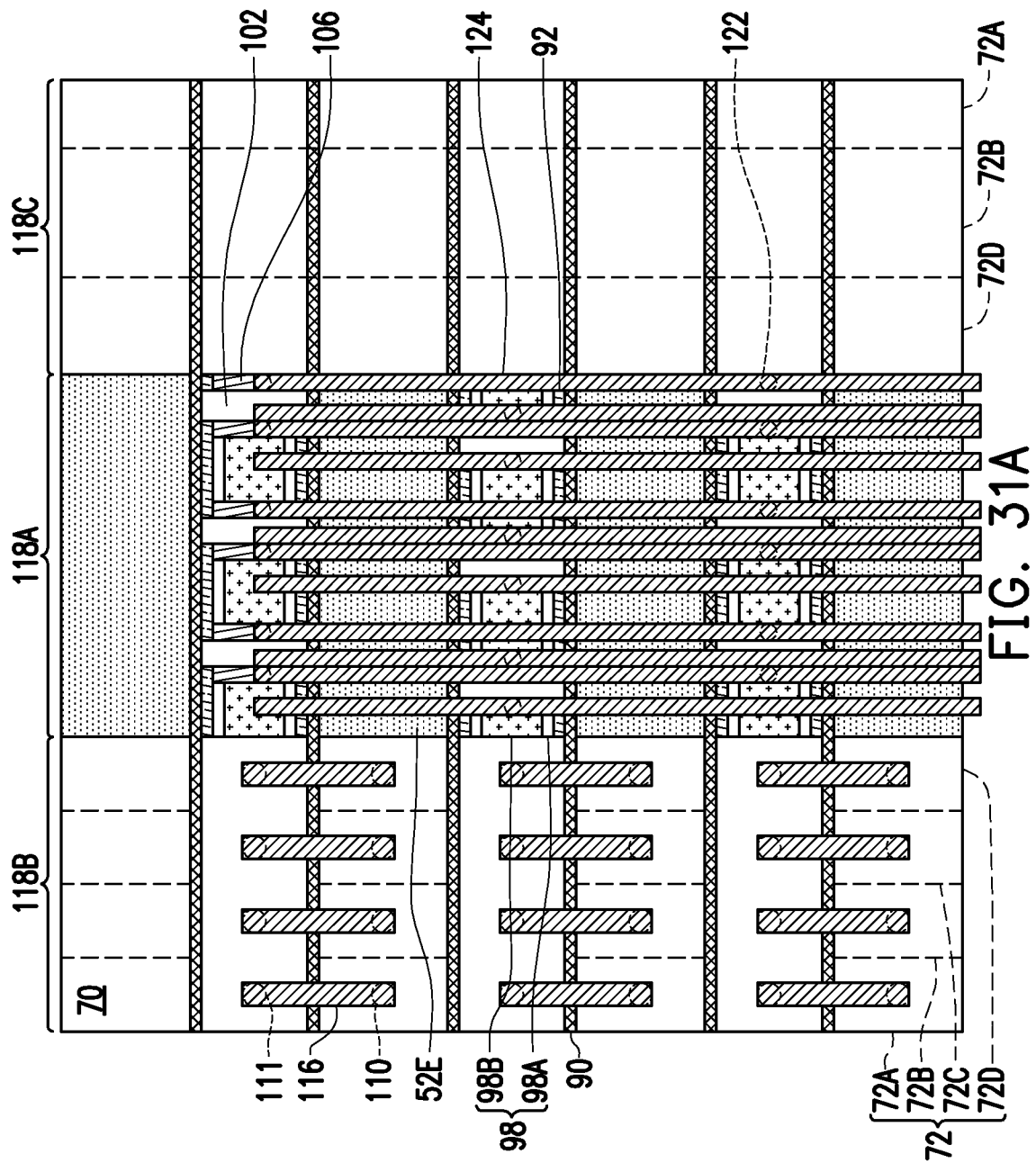

MEMORY ARRAY WORD LINE ROUTING

PRIORITY CLAIM AND CROSS-REFERENCE

This application is a divisional of U.S. application Ser. No. 17/015,679, entitled "Memory Array Word Line Routing," and filed on Sep. 9, 2020; which claims the benefit of U.S. Provisional Application No. 63/041,161, filed on Jun. 19, 2020; which applications are hereby incorporated herein by reference.

BACKGROUND

Semiconductor memories are used in integrated circuits for electronic applications, including radios, televisions, cell phones, and personal computing devices, as examples. Semiconductor memories include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered.

On the other hand, non-volatile memories can keep data stored on them. One type of non-volatile semiconductor memory is ferroelectric random access memory (FERAM, or FRAM). Advantages of FERAM include its fast write/read speed and small size.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8, 9, 10, 11, 12, 13, 14, 15A, 15B, 15C, 16A, 16B, 16C, 17A, 17B, 17C, 18A, 18B, 18C, 19A, 19B, 19C, 20A, 20B, 20C, 21A, 21B, 21C, 22A, 22B, 22C, 23A, 23B, 23C, 24A, 24B, 24C, 24D, 25A, 25B, 25C, 25D, 25E, 25F, 26A, 26B, 26C, 26D, 27A, 27B, 27C, 27D, 28A, 28B, 29, 30, 31A, 31B, 32A, 32B, 32C, 32D, 32E, 32F, 33A, 33B, 33C, 33D, 34, 35, and 36 illustrate varying views of manufacturing a memory array in accordance with some embodiments.

DETAILED DESCRIPTION

Figure 1A:
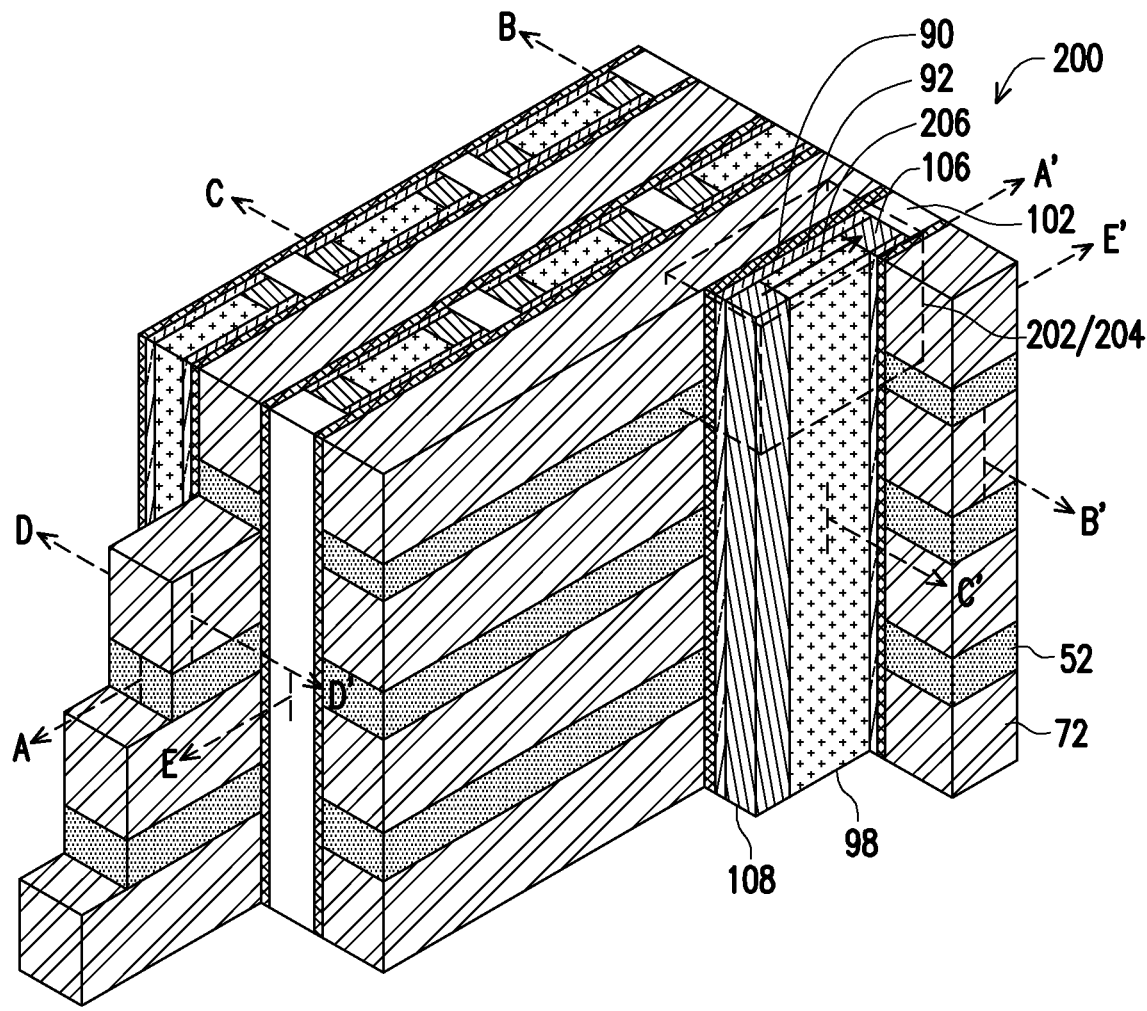
FIGS. 1A and 1B illustrate a perspective view and a circuit diagram of a memory array in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide routing for a 3D memory array with a plurality of vertically stacked memory cells. The stacked memory cells may be vertically stacked over a complementary metal oxide semiconductor (CMOS) under array (CUA), which may be a logic die. The stacked memory cells include word lines extending in a direction parallel to a major surface of the CUA in a staircase structure in which respective lengths of the word lines decrease in a direction away from the CUA. Dielectric materials may separate and vertically and horizontally isolate adjacent word lines from one another and inter-metal dielectrics (IMDs) may be formed over the word lines. Respective word lines may be electrically coupled to the CUA by contacts which extend through the ILD over the respective word line, extend over the 3D memory array in a first direction perpendicular to the direction in which the word line extends, and extend through the 3D memory array itself, such as through a dielectric material adjacent the word line in the first direction. Coupling the word lines to the CUA through the contacts routed in this manner requires less masking steps than conventional processes, which saves time and expenses. Moreover, the conventional processes may be associated with an area penalty, which is saved by routing the contacts through the dielectric material adjacent the word lines. Thus the 3D memory array is routed in a smaller area.

Figure 1B:
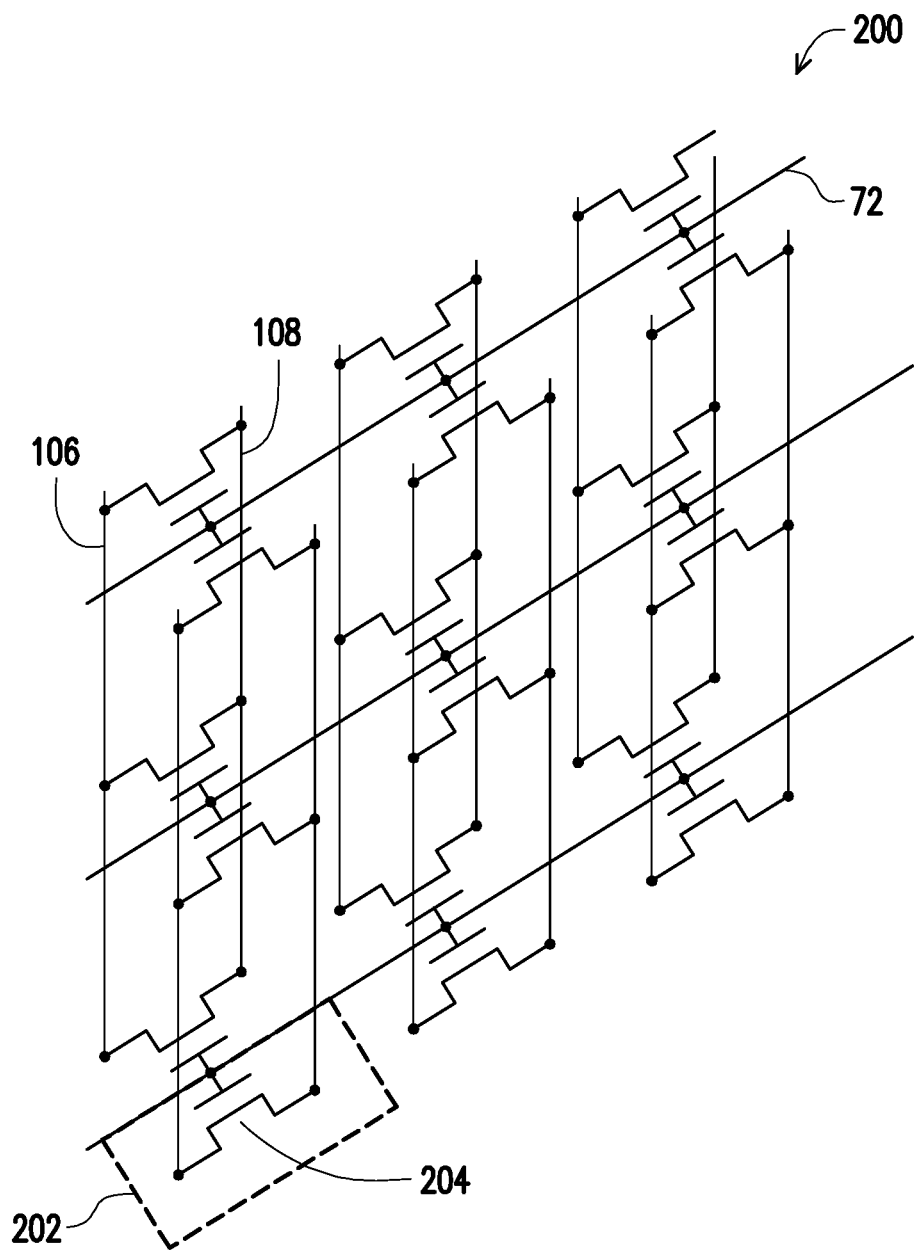

FIGS. 1A and 1B illustrate examples of a memory array 200, according to some embodiments. FIG. 1A illustrates an example of a portion of the memory array 200 in a three-dimensional view, in accordance with some embodiments, and FIG. 1B illustrates a circuit diagram of the memory array 200. The memory array 200 includes a plurality of memory cells 202, which may be arranged in a grid of rows and columns. The memory cells 202 may further stacked vertically to provide a three dimensional memory array, thereby increasing device density. The memory array 200 may be disposed in the back end of line (BEOL) of a semiconductor die. For example, the memory array 200 may be disposed in the interconnect layers of the semiconductor die, such as above one or more active devices (e.g., transistors) formed on a semiconductor substrate.

In some embodiments, the memory array 200 is a ferroelectric random access memory (FERAM), an NOR memory array, or the like. Each of the memory cells 202 may include a transistor 204 with a ferroelectric (FE) material 90 as a gate dielectric. In some embodiments, the transistor 204 can be a thin film transistor or the like. In some embodiments, a gate of each transistor 204 is electrically coupled to a respective word line (e.g., a conductive line 72), a first source/drain region of each transistor 204 is electrically coupled to a respective bit line (e.g., a conductive line 106), and a second source/drain region of each transistor 204 is electrically coupled to a respective source line (e.g., a conductive line 108), which electrically couples the second source/drain region to ground. The memory cells 202 in a same horizontal row of the memory array 200 may share a common word line, while the memory cells 202 in a same vertical column of the memory array 200 may share a common source line and a common bit line.

The memory array 200 includes a plurality of vertically stacked conductive lines 72 (e.g., word lines) with dielectric layers 52 disposed between adjacent ones of the conductive lines 72. The conductive lines 72 extend in a direction parallel to a major surface of an underlying substrate (not separately illustrated in FIGS. 1A and 1B), which may be a CUA, such as a logic die. The conductive lines 72 may have a staircase configuration such that lower conductive lines 72 are longer than and extend laterally past endpoints of upper conductive lines 72. For example, in FIG. 1A, multiple, stacked layers of conductive lines 72 are illustrated with topmost conductive lines 72 being the shortest and bottommost conductive lines 72 being the longest. Respective lengths of the conductive lines 72 may increase in a direction towards the underlying substrate. In this manner, a portion of each of the conductive lines 72 may be accessible from above the memory array 200, and conductive contacts may be made to an exposed portion of each of the conductive lines 72.

The memory array 200 further includes a plurality of conductive lines 106 (e.g., bit lines) and a plurality of conductive lines 108 (e.g., source lines). The conductive lines 106 and the conductive lines 108 may each extend in a direction perpendicular to the conductive lines 72. Dielectric materials 102 are disposed between and isolate adjacent ones of the conductive lines 106 and the conductive lines 108. Pairs of the conductive lines 106 and the conductive lines 108 along with an intersecting conductive line 72 define boundaries of each memory cell 202, and dielectric materials 98 are disposed between and isolate adjacent pairs of the conductive lines 106 and the conductive lines 108. In some embodiments, the conductive lines 108 are electrically coupled to ground. Although FIG. 1A illustrates a particular placement of the conductive lines 106 relative to the conductive lines 108, it should be appreciated that the placement of the conductive lines 106 and the conductive lines 108 may be flipped in other embodiments.

The memory array 200 may also include an oxide semiconductor (OS) layer 92. The OS layer 92 may provide channel regions for the transistors 204 of the memory cells 202. For example, when an appropriate voltage (e.g., higher than a respective threshold voltage ($V_{th}$) of a corresponding transistor 204) is applied through a corresponding conductive line 72, a region of the OS layer 92 that intersects the conductive line 72 may allow current to flow from the conductive lines 106 to the conductive lines 108 (e.g., in the direction indicated by arrow 206).

The FE material 90 is disposed between the conductive lines 72 and the OS layer 92, and the FE material 90 may provide gate dielectrics for the transistors 204. Accordingly, the memory array 200 may also be referred to as a ferroelectric random access memory (FERAM) array. The FE material 90 may be polarized in one of two different directions, and the polarization direction may be changed by applying an appropriate voltage differential across the FE material 90 and generating an appropriate electric field. The polarization may be relatively localized (e.g., generally contained within each boundaries of the memory cells 202), and a continuous region of the FE material 90 may extend across a plurality of memory cells 202. Depending on a polarization direction of a particular region of the FE material 90, a threshold voltage of a corresponding transistor 204 varies, and a digital value (e.g., a 0 or a 1) can be stored. For example, when a region of the FE material 90 has a first electrical polarization direction, the corresponding transistor 204 may have a relatively low threshold voltage, and when the region of the FE material 90 has a second electrical polarization direction, the corresponding transistor 204 may have a relatively high threshold voltage. The difference between the two threshold voltages may be referred to as the threshold voltage shift. A larger threshold voltage shift makes it easier (e.g., less error prone) to read the digital value stored in the corresponding memory cell 202.

To perform a write operation on a memory cell 202, a write voltage is applied across a portion of the FE material 90 corresponding to the memory cell 202. The write voltage can be applied, for example, by applying appropriate voltages to a corresponding conductive line 72 (e.g., a corresponding word line) and the corresponding conductive lines 106 and conductive lines 108 (e.g., corresponding bit and source lines). By applying the write voltage across the portion of the FE material 90, a polarization direction of the region of the FE material 90 can be changed. As a result, the corresponding threshold voltage of the corresponding transistor 204 can be switched from a low threshold voltage to a high threshold voltage or vice versa and a digital value can be stored in the memory cell 202. Because the conductive lines 72 intersect the conductive lines 106 and the conductive lines 108, individual memory cells 202 may be selected for the write operation.

To perform a read operation on the memory cell 202, a read voltage (e.g., a voltage between the low and high threshold voltages) is applied to the corresponding conductive line 72 (e.g., the corresponding word line). Depending on the polarization direction of the corresponding region of the FE material 90, the transistor 204 of the memory cell 202 may or may not be turned on. As a result, the corresponding conductive line 106 may or may not be discharged through the corresponding conductive line 108 (e.g., the corresponding source line that is coupled to ground), and the digital value stored in the memory cell 202 can be determined. Because the conductive lines 72 intersect the conductive lines 106 and the conductive lines 108, individual memory cells 202 may be selected for the read operation.

FIG. 1A further illustrates reference cross-sections of the memory array 200 that are used in later figures. Cross-section A-A' is along a longitudinal axis of conductive lines 72 and in a direction, for example, parallel to the direction of current flow across the OS layer 92 of the transistors 204. Cross-section B-B' is perpendicular to the cross-section A-A', the longitudinal axis of the conductive lines 72, and a longitudinal axis of conductive lines 106 and conductive lines 108. The cross-section B-B' extends through the dielectric materials 98 and the dielectric materials 102. Cross-section C-C' is parallel to the cross-section B-B' and extends through the conductive lines 106. Subsequent figures refer to these reference cross-sections for clarity. Cross-section D-D' is parallel to the cross-section B-B' and extends through conductive lines 106 in a staircase region of the memory array 200. Cross-section E-E' is parallel to the cross-section A-A' and extends through the dielectric materials 102.

FIGS. 2 through 36 are views of intermediate stages in the manufacturing of the memory array 200, in accordance with some embodiments. FIGS. 2 through 14, 15B, 16B, 17B, 18B, 19B, 20B, 21B, 22B, 23B, 24B, 25B, 26B, 27B, 31B, 32B, and 33B are illustrated along reference cross-section A-A' illustrated in FIG. 1A. FIGS. 15C, 16C, 17C, 18C, 19C, 20C, 21C, 22C, 23C, 24C, 25C, and 32D are illustrated along reference cross-section B-B' illustrated in FIG. 1A. FIGS. 24D, 25D, 28B, and 32E are illustrated along reference cross-section C-C' illustrated in FIG. 1A. FIGS. 26D, 27D, and 33D are illustrated along reference cross-section D-D' illustrated in FIG. 1A. FIGS. 26C, 27C, 32C, and 33C are illustrated along reference cross-section E-E' illustrated in FIG. 1A. FIGS. 15A, 16A, 17A, 18A, 19A, 20A, 21A, 22A, 23A, 24A, 25A, 25F, 26A, 27A, 28A, 29, 30, 31A, 32A, 33A, 34, 35, and 36 illustrate a top-down view. FIGS. 25E and 32F illustrate a perspective view.

Figure 2:
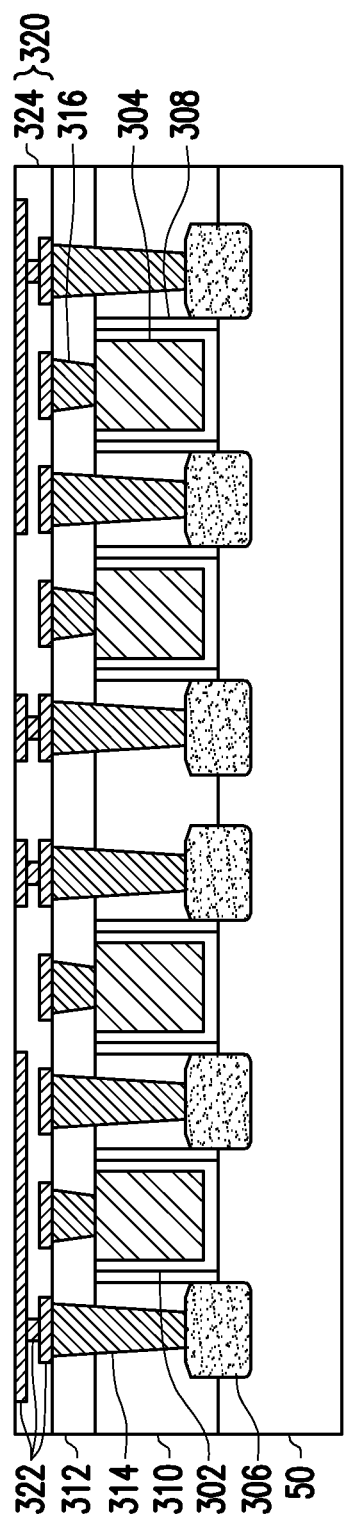

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be an integrated circuit die, such as a logic die, a memory die, an ASIC die, or the like. The substrate 50 may be a complementary metal oxide semiconductor (CMOS) die and may be referred to as a CMOS under array (CUA). The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

FIG. 2 further illustrates circuits that may be formed over the substrate 50. The circuits include transistors at a top surface of the substrate 50. The transistors may include gate dielectric layers 302 over top surfaces of the substrate 50 and gate electrodes 304 over the gate dielectric layers 302. Source/drain regions 306 are disposed in the substrate 50 on opposite sides of the gate dielectric layers 302 and the gate electrodes 304. Gate spacers 308 are formed along sidewalls of the gate dielectric layers 302 and separate the source/drain regions 306 from the gate electrodes 304 by appropriate lateral distances. The transistors may comprise fin field effect transistors (FinFETs), nanostructure (e.g., nanosheet, nanowire, gate-all-around, or the like) FETS (nano-FETs), planar FETs, the like, or combinations thereof, and may be formed by gate-first processes or gate-last processes.

A first ILD 310 surrounds and isolates the source/drain regions 306, the gate dielectric layers 302, and the gate electrodes 304 and a second ILD 312 is over the first ILD 310. Source/drain contacts 314 extend through the second ILD 312 and the first ILD 310 and are electrically coupled to the source/drain regions 306 and gate contacts 316 extend through the second ILD 312 and are electrically coupled to the gate electrodes 304. An interconnect structure 320 including one or more stacked dielectric layers 324 and conductive features 322 formed in the one or more dielectric layers 324 is over the second ILD 312, the source/drain contacts 314, and the gate contacts 316. The interconnect structure 320 may be electrically connected to the gate contacts 316 and the source/drain contacts 314 to form functional circuits. In some embodiments, the functional circuits formed by the interconnect structure 320 may comprise logic circuits, memory circuits, sense amplifiers, controllers, input/output circuits, image sensor circuits, the like, or combinations thereof. Although FIG. 2 discusses transistors formed over the substrate 50, other active devices (e.g., diodes or the like) and/or passive devices (e.g., capacitors, resistors, or the like) may also be formed as part of the functional circuits.

Figure 3:
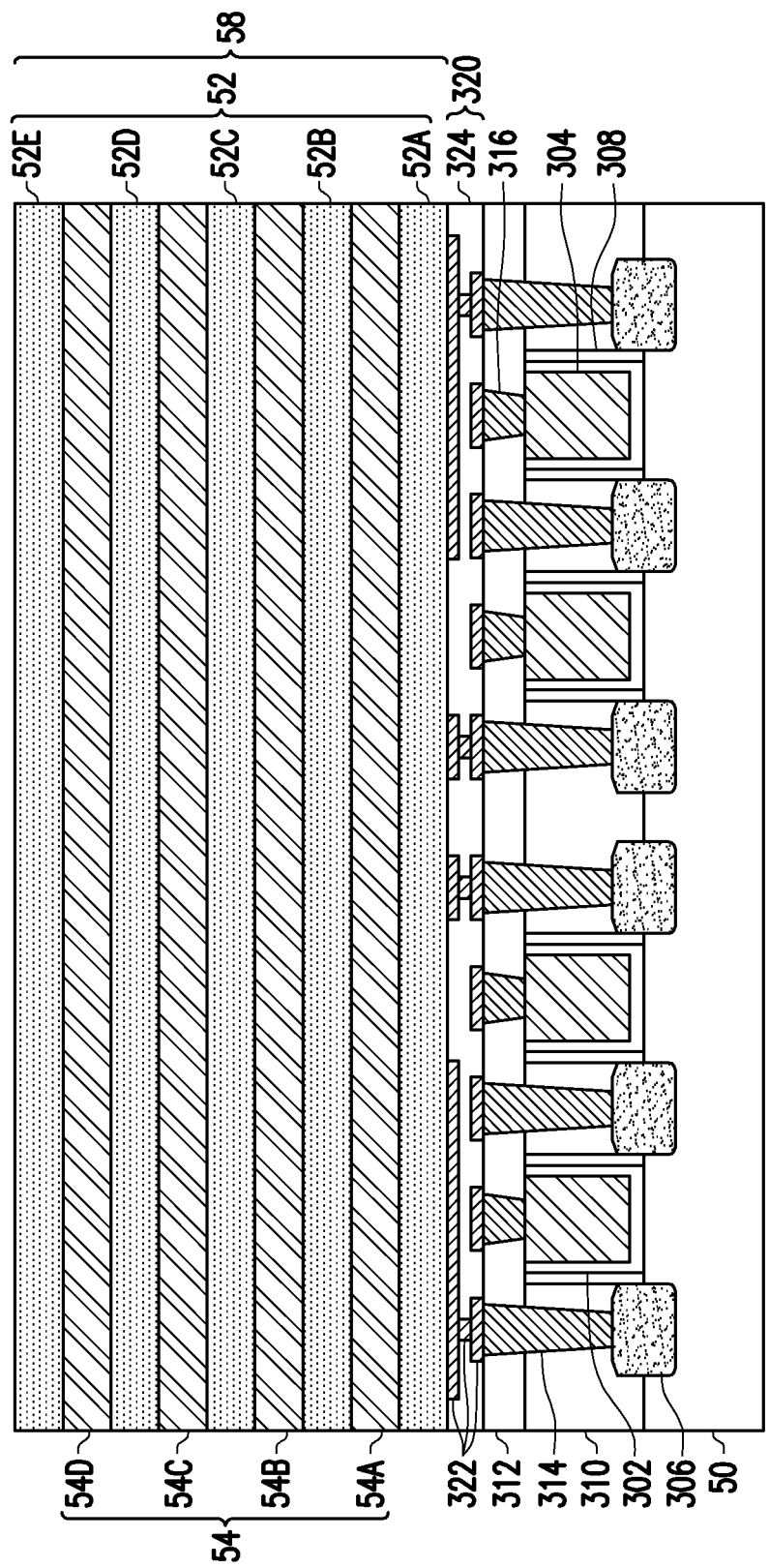

In FIG. 3, a multi-layer stack 58 is formed over the structure of FIG. 2. The substrate 50, the transistors, the ILDs, and the interconnect structure 320 may be omitted from subsequent drawings for the purposes of simplicity and clarity. Although the multi-layer stack 58 is illustrated as contacting the dielectric layers 324 of the interconnect structure 320, any number of intermediate layers may be disposed between the substrate 50 and the multi-layer stack 58. For example, one or more interconnect layers comprising conductive features in insulting layers (e.g., low-k dielectric layers) may be disposed between the substrate 50 and the multi-layer stack 58. In some embodiments, the conductive features may be patterned to provide power, ground, and/or signal lines for the active devices on the substrate 50 and/or the memory array 200 (see FIGS. 1A and 1B).

The multi-layer stack 58 includes alternating layers of conductive layers 54A-54D (collectively referred to as conductive layers 54) and dielectric layers 52A-52E (collectively referred to as dielectric layers 52). The conductive layers 54 may be patterned in subsequent steps to define conductive lines 72 (e.g., the word lines). The conductive layers 54 may comprise conductive materials, such as, copper, titanium, titanium nitride, tantalum, tantalum nitride, tungsten, ruthenium, aluminum, cobalt, silver, gold, nickel, chromium, hafnium, platinum, combinations thereof, or the like. The dielectric layers 52 may comprise insulating materials, such as silicon oxide, silicon nitride, silicon oxynitride, combinations thereof, or the like. The conductive layers 54 and the dielectric layers 52 may each be formed using, for example, chemical vapor deposition (CVD), atomic layer deposition (ALD), physical vapor deposition (PVD), plasma enhanced CVD (PECVD), or the like. Although FIG. 3 illustrates a particular number of the conductive layers 54 and the dielectric layers 52, other embodiments may include different numbers of the conductive layers 54 and the dielectric layers 52.

Figure 4:
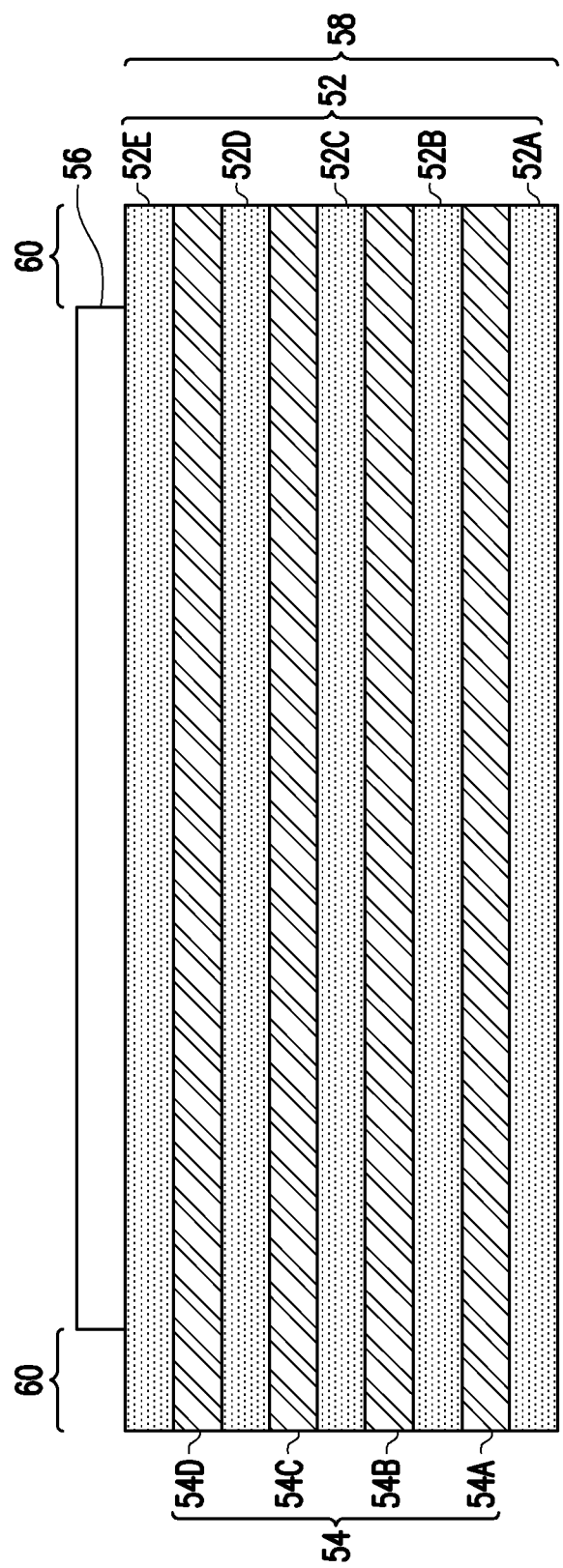

In FIG. 4 a photoresist 56 is formed over the multi-layer stack 58. The photoresist 56 can be formed by using a spin-on technique and can be patterned using acceptable photolithography techniques. Patterning the photoresist 56 may expose the multi-layer stack 58 in regions 60, while masking remaining portions of the multi-layer stack 58. For example, a topmost layer of the multi-layer stack 58 (e.g., the dielectric layer 52E) may be exposed in the regions 60.

Figure 5:
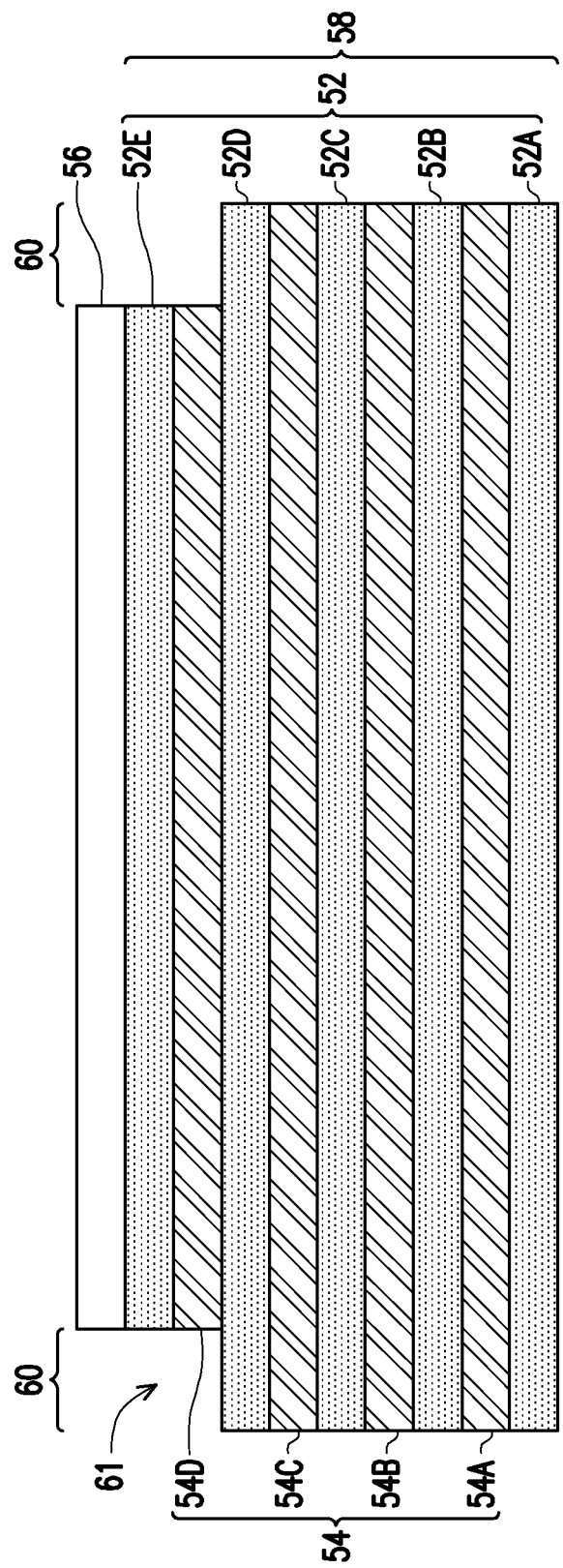

In FIG. 5, the exposed portions of the multi-layer stack 58 in the regions 60 are etched using the photoresist 56 as a mask. The etching may be any acceptable etch process, such as wet or dry etching, reactive ion etching (RIE), neutral beam etching (NBE), the like, or a combination thereof. The etching may be anisotropic. The etching may remove portions of the dielectric layer 52E and the conductive layer 54D in the regions 60 and define openings 61. Because the dielectric layer 52E and the conductive layer 54D have different material compositions, etchants used to remove exposed portions of these layers may be different. In some embodiments, the conductive layer 54D acts as an etch stop layer while etching the dielectric layer 52E, and the dielectric layer 52D acts as an etch stop layer while etching conductive layer 54D. As a result, the portions of the dielectric layer 52E and the conductive layer 54D may be selectively removed without removing remaining layers of the multi-layer stack 58, and the openings 61 may be extended to a desired depth. Alternatively, a timed etch processes may be used to stop the etching of the openings 61 after the openings 61 reach a desired depth. In the resulting structure, the dielectric layer 52D is exposed in the regions 60.

Figure 6:
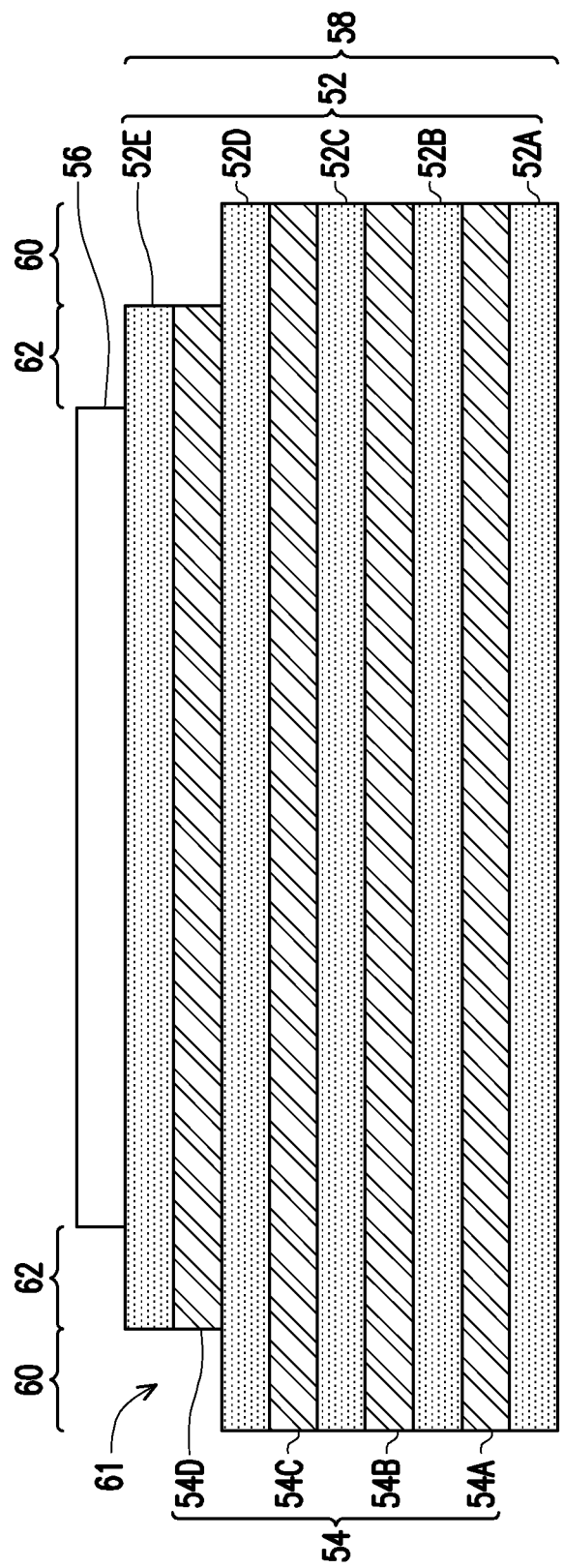

In FIG. 6, the photoresist 56 is trimmed to expose additional portions of the multi-layer stack 58. The photoresist 56 can be trimmed using acceptable photolithography techniques. As a result of the trimming, a width of the photoresist 56 is reduced and portions of the multi-layer stack 58 in the regions 60 and regions 62 may be exposed. For example, top surfaces of the dielectric layer 52D may be exposed in the regions 60, and top surfaces of the dielectric layer 52E may be exposed in the regions 62.

Figure 7:
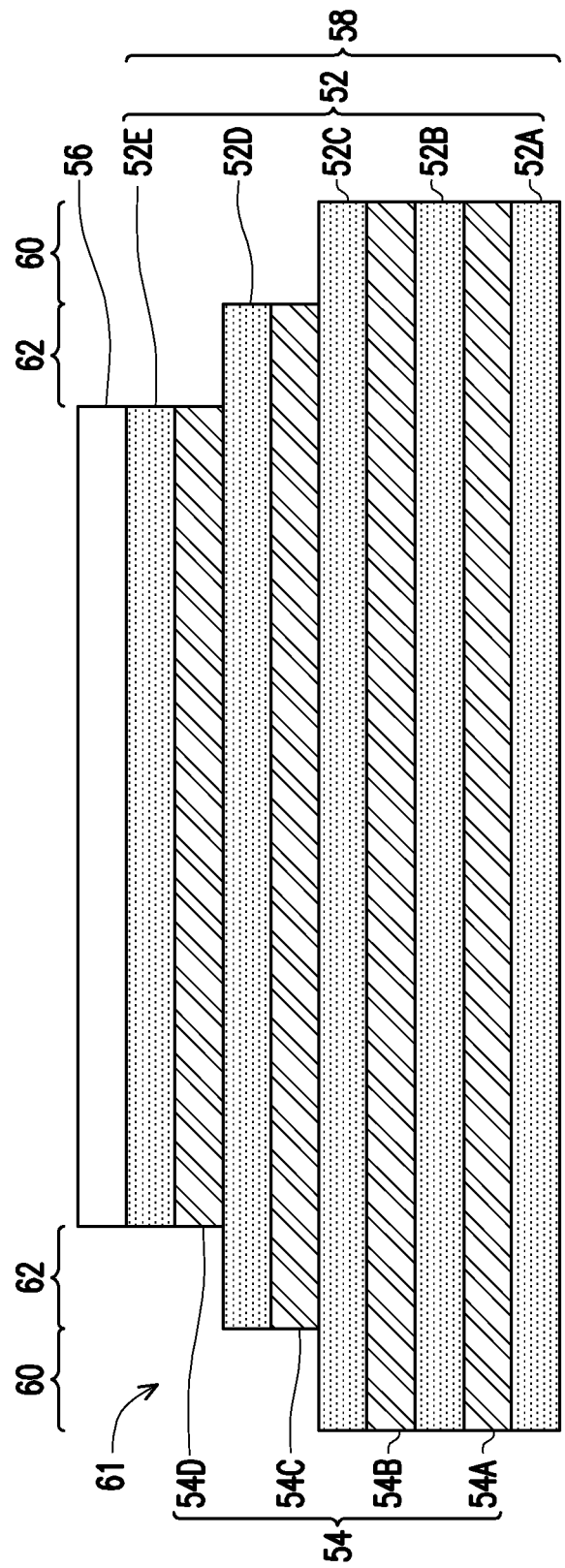

In FIG. 7, portions of the dielectric layer 52E, the conductive layer 54D, the dielectric layer 52D, and the conductive layer 54C in the regions 60 and the regions 62 are removed by acceptable etching processes using the photoresist 56 as a mask. The etching may be any acceptable etch process, such as wet or dry etching, RIE, NBE, the like, or a combination thereof. The etching may be anisotropic. The etching may extend the openings 61 further into the multi-layer stack 58. Because the conductive layers 54D and 54C and the dielectric layers 52E and 52D have different material compositions, etchants used to remove exposed portions of these layers may be different. In some embodiments, the conductive layer 54D acts as an etch stop layer while etching the dielectric layer 52E; the dielectric layer 52D acts as an etch stop layer while etching conductive layer 54D; the conductive layer 54C acts as an etch stop layer while etching the dielectric layer 52D; and the dielectric layer 52C acts as an etch stop layer while etching the conductive layer 54C. As a result, portions of the conductive layers 54D and 54C and the dielectric layers 52E and 52D may be selectively removed without removing remaining layers of the multi-layer stack 58, and the openings 61 may be extended to a desired depth. Further, during the etching processes, unetched portions of the conductive layers 54 and dielectric layers 52 act as a mask for underlying layers, and as a result a previous pattern of the dielectric layer 52E and the conductive layer 54D (see FIG. 6) may be transferred to the underlying dielectric layer 52D and the underlying conductive layer 54C. In the resulting structure, the dielectric layer 52C is exposed in the regions 60, and the dielectric layer 52D is exposed in the regions 62.

Figure 8:
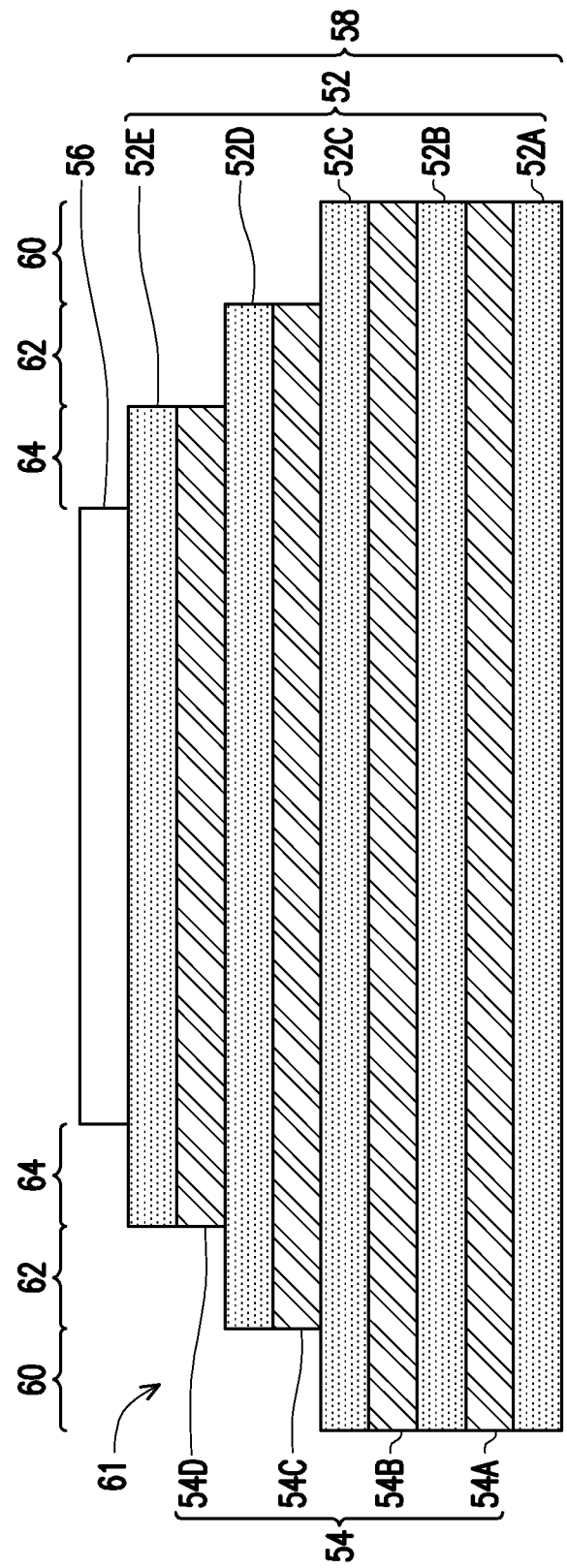

In FIG. 8, the photoresist 56 is trimmed to expose additional portions of the multi-layer stack 58. The photoresist can be trimmed using acceptable photolithography techniques. As a result of the trimming, a width of the photoresist 56 is reduced, and portions of the multi-layer stack 58 in the regions 60, the regions 62, and regions 64 may be exposed. For example, top surfaces of the dielectric layer 52C may be exposed in the regions 60; top surfaces of the dielectric layer 52D may be exposed in the regions 62; and top surfaces of the dielectric layer 52E may be exposed in the regions 64.

Figure 9:
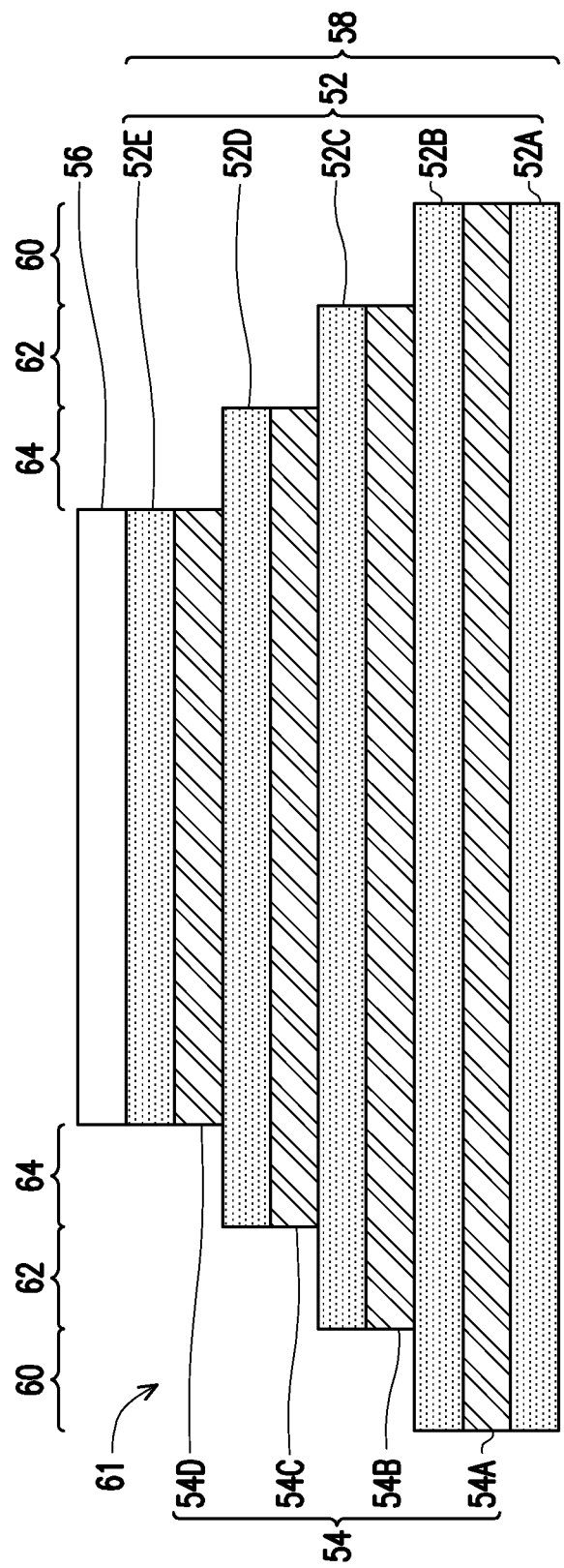

In FIG. 9, portions of the dielectric layers 52E, 52D, and 52C and the conductive layers 54D, 54C, and 54B in the regions 60, the regions 62, and the regions 64 are removed by acceptable etching processes using the photoresist 56 as a mask. The etching may be any acceptable etch process, such as wet or dry etching, RIE, NBE, the like, or a combination thereof. The etching may be anisotropic. The etching may extend the openings 61 further into the multi-layer stack 58. Because the dielectric layers 52C-52E and the conductive layers 54B-54D have different material compositions, etchants used to remove exposed portions of these layers may be different. In some embodiments, the conductive layer 54D acts as an etch stop layer while etching the dielectric layer 52E; the dielectric layer 52D acts as an etch stop layer while etching conductive layer 54D; the conductive layer 54C acts as an etch stop layer while etching the dielectric layer 52D; the dielectric layer 52C acts as an etch stop layer while etching the conductive layer 54C; the conductive layer 54B acts as an etch stop layer while etching the dielectric layer 52C; and the dielectric layer 52B acts as an etch stop layer while etching the conductive layer 54B. As a result, portions of the dielectric layers 52C-52E and the conductive layers 54B-54D may be selectively removed without removing remaining layers of the multi-layer stack 58, and the openings 61 may be extended to a desired depth. Further, during the etching processes, unetched portions of the dielectric layers 52 and the conductive layers 54 act as a mask for underlying layers, and as a result a previous pattern of the dielectric layers 52E and 52D and the conductive layers 54D and 54C (see FIG. 8) may be transferred to the underlying dielectric layers 52D and 52C and the underlying conductive layers 54C and 54B. In the resulting structure, the dielectric layer 52B is exposed in the regions 60; the dielectric layer 52C is exposed in the regions 62; and the dielectric layer 52D is exposed in the regions 64.

Figure 10:
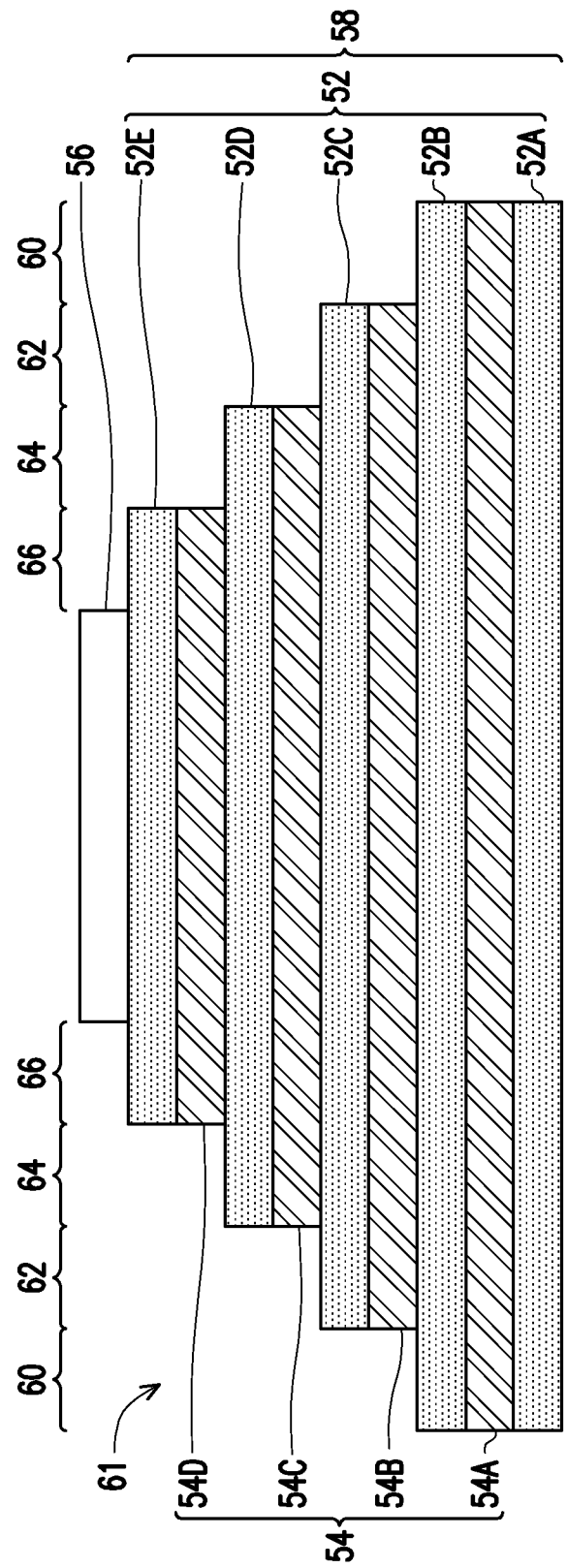

In FIG. 10, the photoresist 56 is trimmed to expose additional portions of the multi-layer stack 58. The photoresist can be trimmed using acceptable photolithography techniques. As a result of the trimming, a width of the photoresist 56 is reduced, and portions of the multi-layer stack 58 in the regions 60, the regions 62, the regions 64, and regions 66 may be exposed. For example, top surfaces of the dielectric layer 52B may be exposed in the regions 60; top surfaces of the dielectric layer 52C may be exposed in the regions 62; top surfaces of the dielectric layer 52D may be exposed in the regions 64; and top surfaces of the dielectric layer 52E may be exposed in the regions 66.

Figure 11:
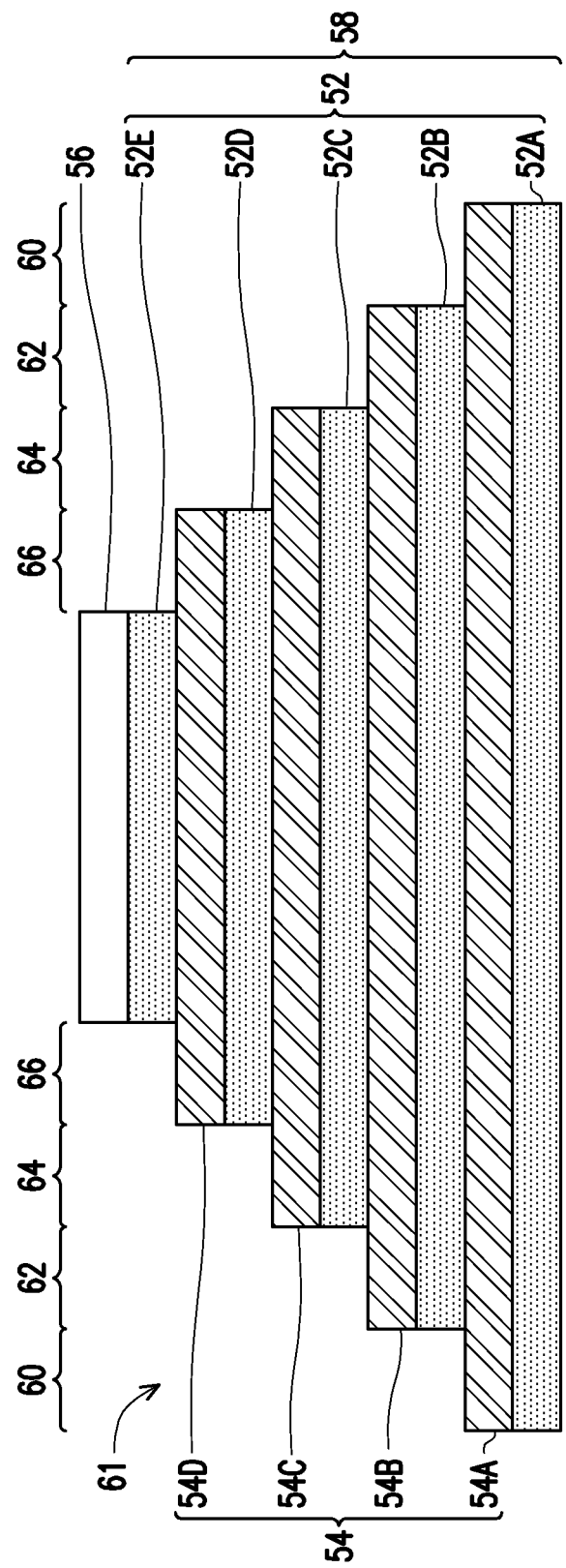

In FIG. 11, portions of the dielectric layers 52E, 52D, 52C, and 52B in the regions 60, the regions 62, the regions 64, and the regions 66 are removed by acceptable etching processes using the photoresist 56 as a mask. The etching may be any acceptable etch process, such as wet or dry etching, RIE, NBE, the like, or a combination thereof. The etching may be anisotropic. The etching may extend the openings 61 further into the multi-layer stack 58. In some embodiments, the conductive layer 54D acts as an etch stop layer while etching the dielectric layer 52E; the conductive layer 54C acts as an etch stop layer while etching the dielectric layer 52D; the conductive layer 54B acts as an etch stop layer while etching the dielectric layer 52C; and the conductive layer 54A acts as an etch stop layer etching the dielectric layer 52B. As a result, portions of the dielectric layers 52B-52E may be selectively removed without removing remaining layers of the multi-layer stack 58, and the openings 61 may be extended to a desired depth. Further, during the etching processes, unetched portions of the conductive layers 54 act as a mask for underlying layers, and as a result a previous pattern of the conductive layers 54B-54D (see FIG. 10) may be transferred to the underlying dielectric layers 52B-52D. In the resulting structure, the conductive layer 54A is exposed in the regions 60; the conductive layer 54B is exposed in the regions 62; the conductive layer 54C is exposed in the regions 64; and the conductive layer 54D is exposed in the regions 66.

Figure 12:
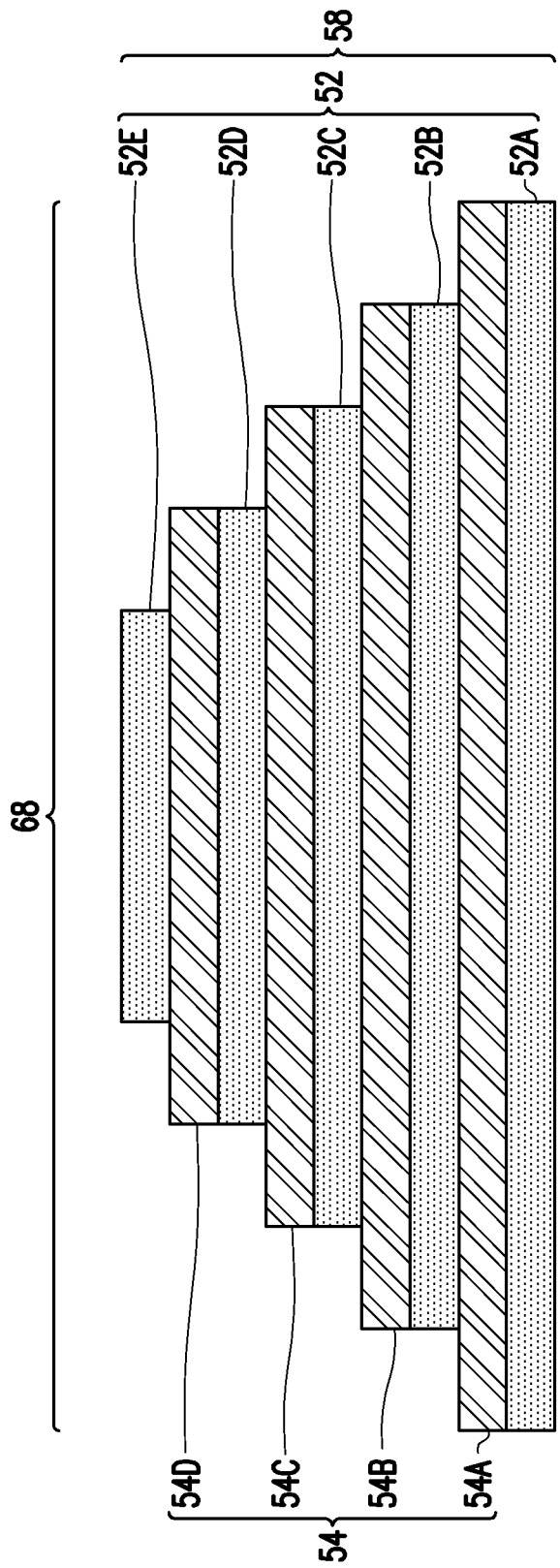

In FIG. 12 the photoresist 56 may be removed, such as by an acceptable ashing or wet strip process. Thus, a staircase structure 68 is formed. The staircase structure 68 comprises a stack of alternating ones of the conductive layers 54 and the dielectric layers 52. Lower conductive layers 54 are longer and extend laterally past upper conductive layers 54, and a width of each of the conductive layers 54 increases in a direction towards the substrate 50. As a result, conductive contacts can be made from above the staircase structure 68 to each of the conductive layers 54 in subsequent processing steps.

Figure 13:
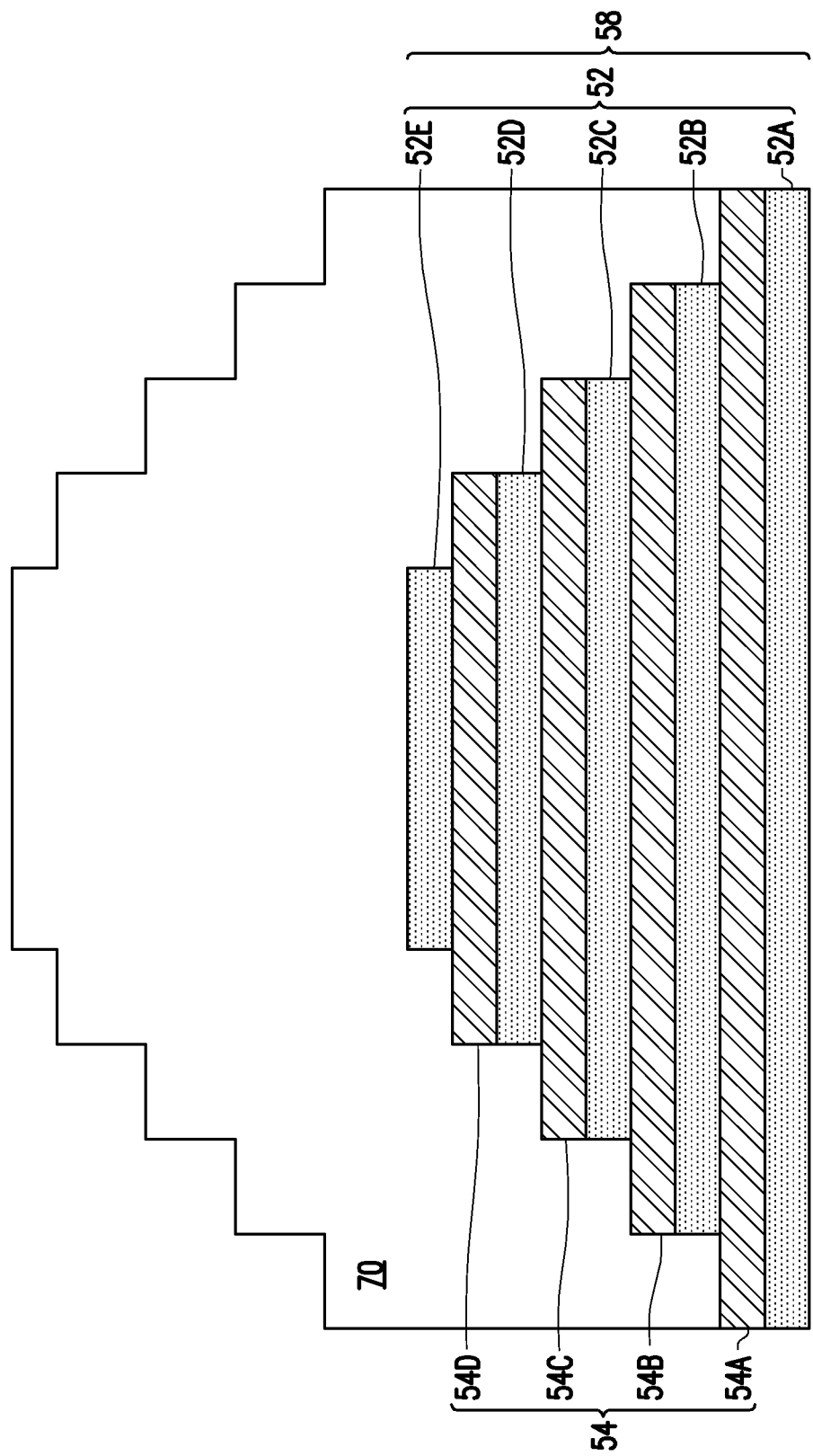

In FIG. 13, an inter-metal dielectric (IMD) 70 is deposited over the multi-layer stack 58. The IMD 70 may be formed of a dielectric material, and may be deposited by any suitable method, such as CVD, PECVD, flowable CVD (FCVD), or the like. The dielectric materials may include phospho-silicate glass (PSG), boro-silicate glass (BSG), boron-doped phospho-silicate glass (BPSG), undoped silicate glass (USG), or the like. In some embodiments, the IMD 70 may comprise an oxide (e.g., silicon oxide or the like), a nitride (e.g., silicon nitride or the like), a combination thereof or the like. Other dielectric materials formed by any acceptable process may be used. The IMD 70 extends along sidewalls of the conductive layers 54B-54D and sidewalls of the dielectric layers 52B-52E. Further, the IMD 70 may contact top surfaces of the conductive layers 54A-54D and the dielectric layer 52E.

Figure 14:
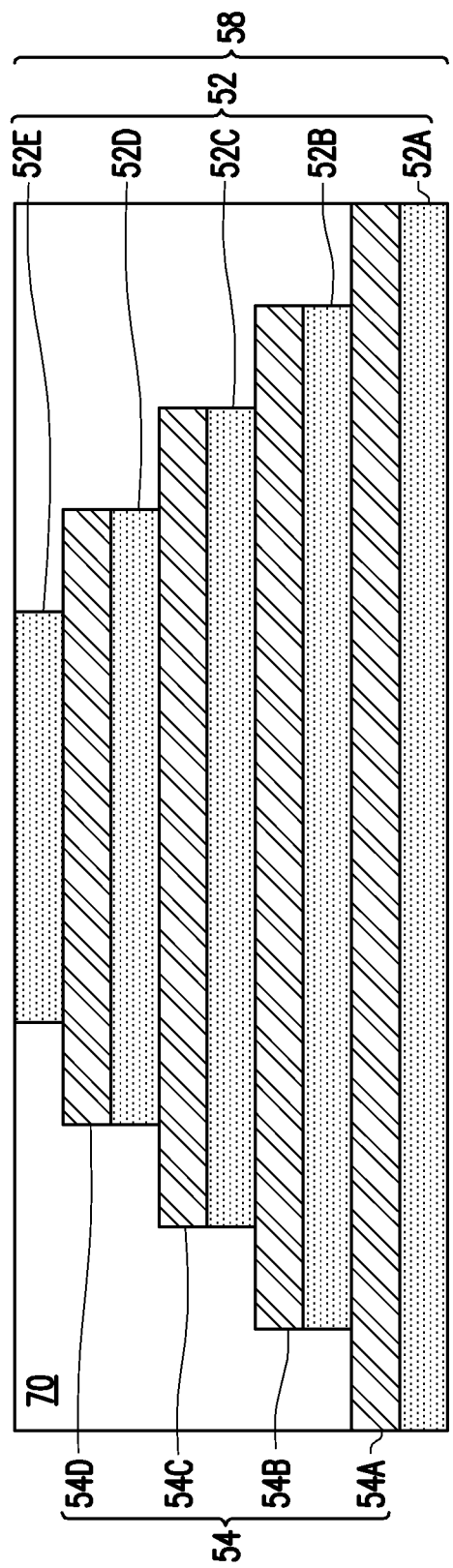

In FIG. 14, a removal process is applied to the IMD 70 to remove excess dielectric material over the multi-layer stack 58. In some embodiments, the removal process may be a planarization process, such as a chemical mechanical polish (CMP), an etch-back process, combinations thereof, or the like. The planarization process exposes the multi-layer stack 58 such that top surfaces of the multi-layer stack 58 and IMD 70 are level after the planarization process is complete.

In FIGS. 15A through 17C, trenches are formed in the multi-layer stack 58, thereby defining conductive lines 72. The conductive lines 72 may correspond to word lines in the memory array 200 and the conductive lines 72 may provide gate electrodes for the resulting transistors 204 of the memory array 200. In FIGS. 15A through 18C, figures ending in "A" illustrate a top-down view, figures ending in "B" illustrate a cross-sectional view along line A-A' of FIG. 1A, and figures ending in "C" illustrate a cross-sectional view along line B-B' of FIG. 1A.

Figure 15A:
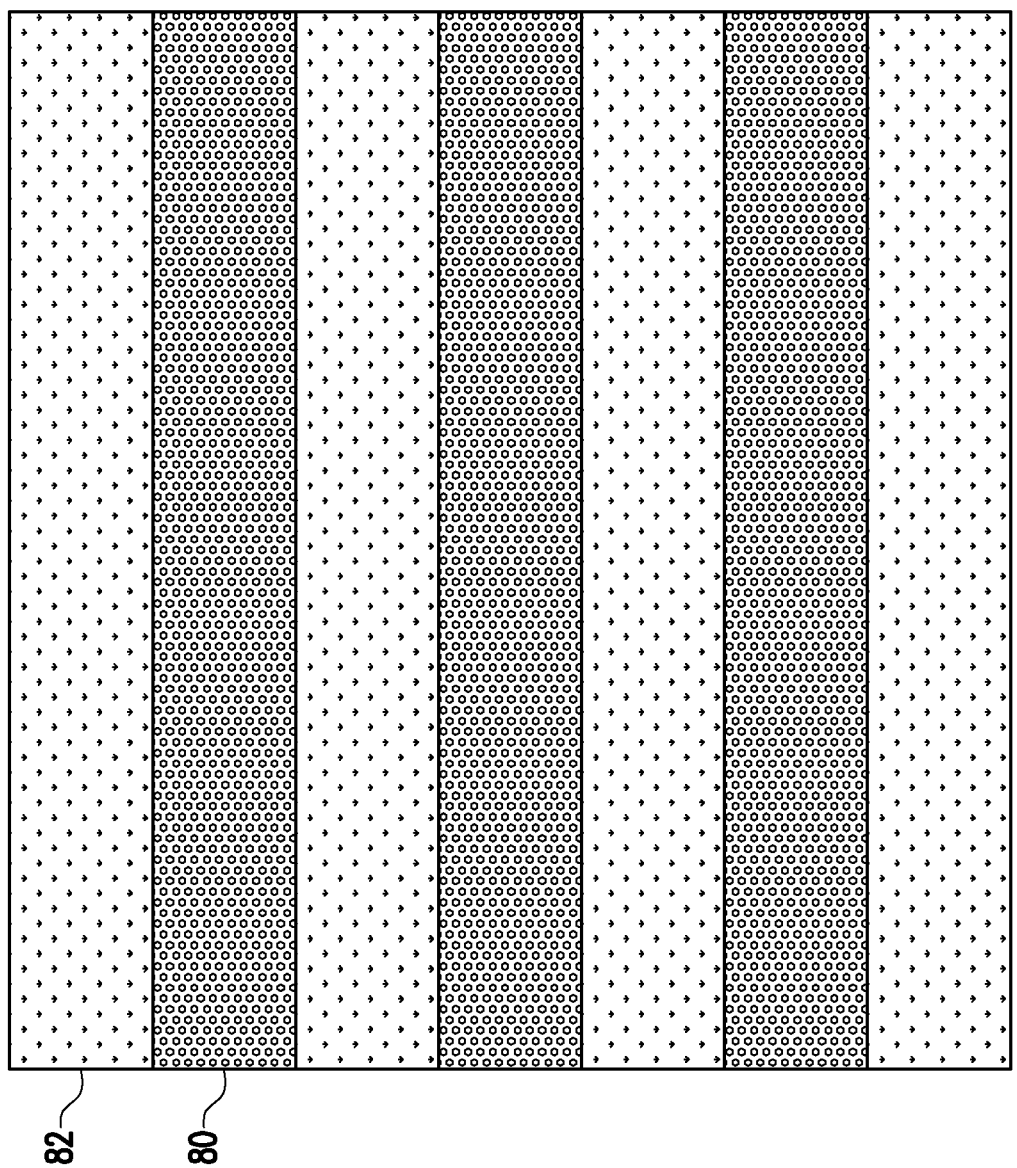
Figure 15B:
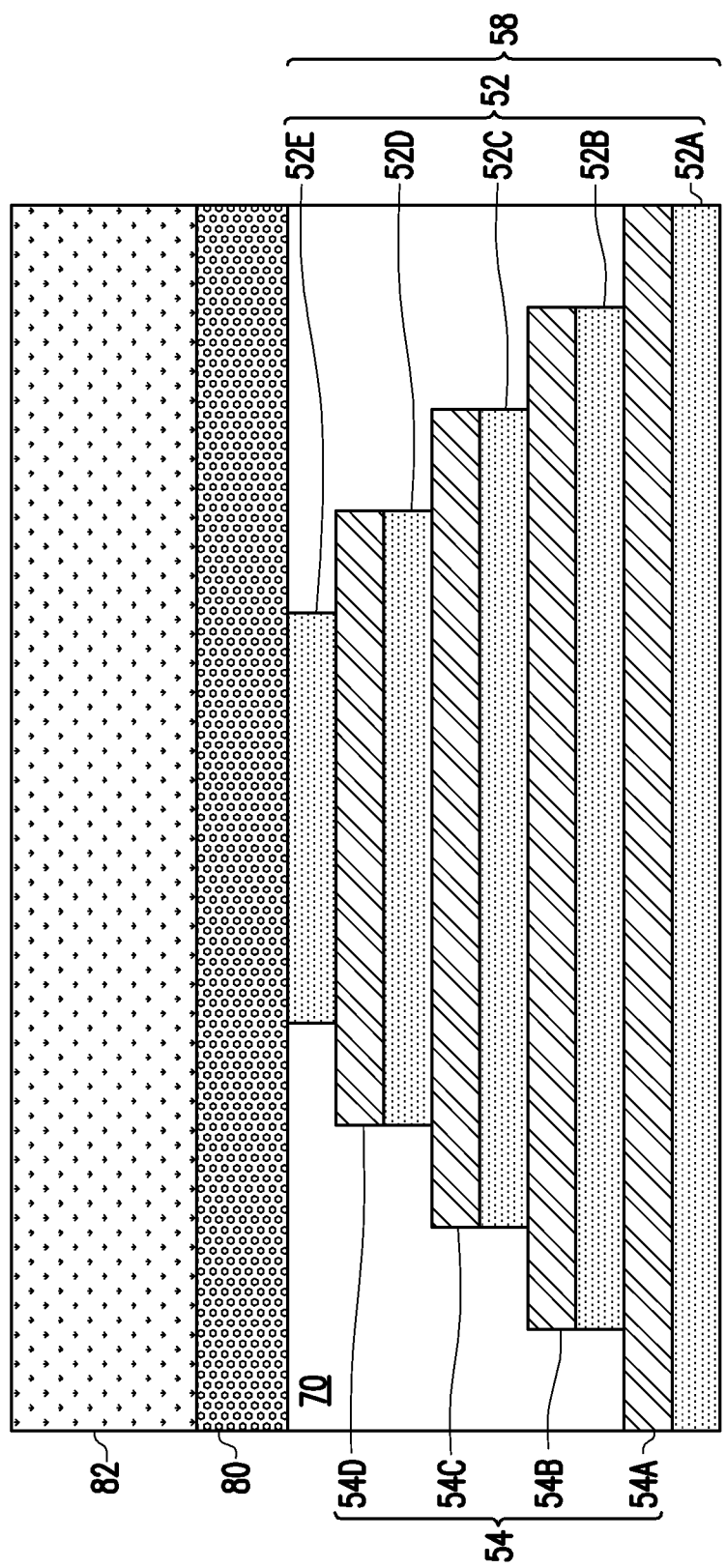
Figure 15C:
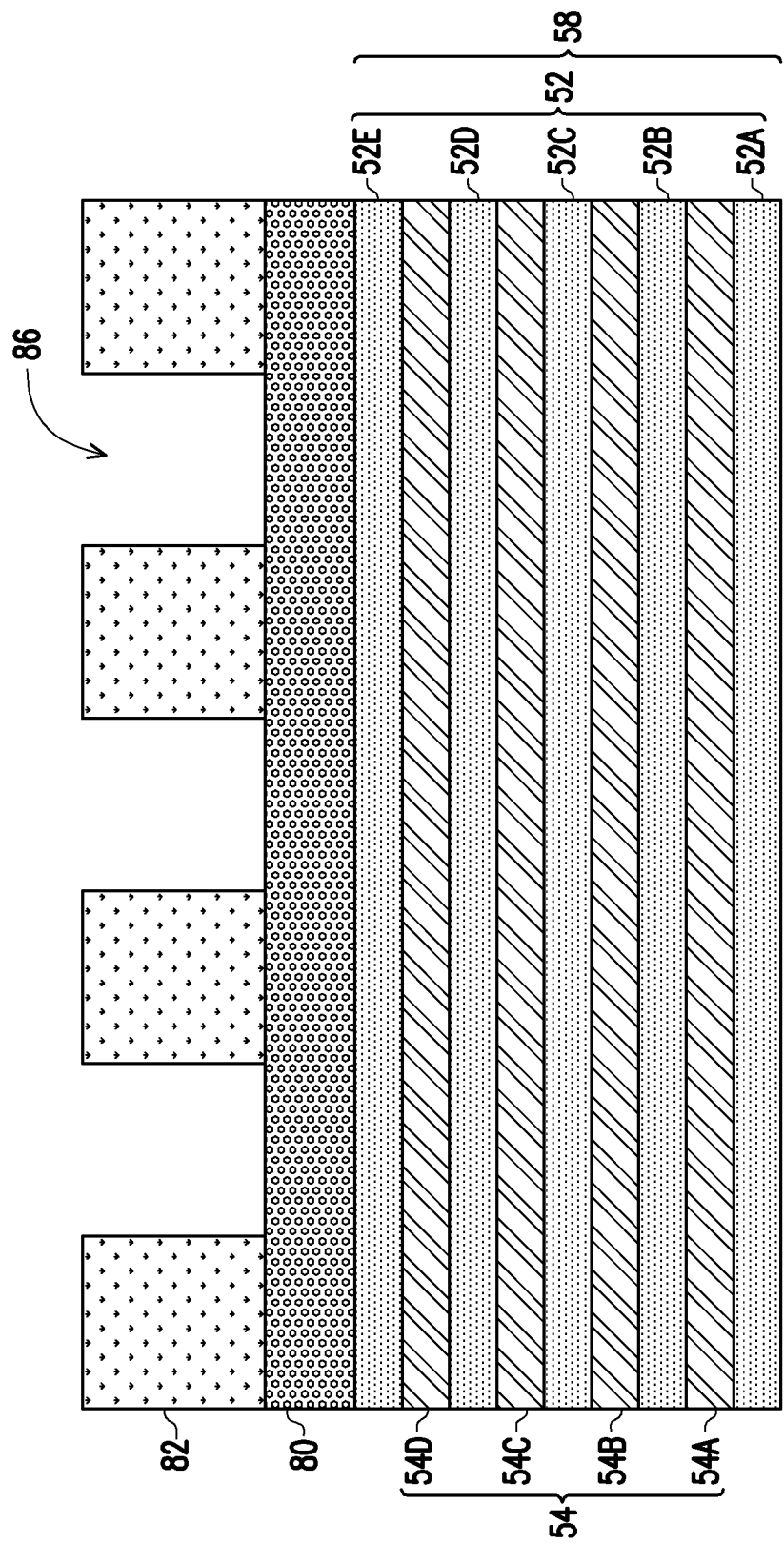

In FIGS. 15A through 15C a hard mask 80 is deposited over the multi-layer stack 58 and the IMD 70. The hard mask 80 may include, for example, silicon nitride, silicon oxynitride, or the like, which may be deposited by CVD, PVD, ALD, PECVD, or the like. A photoresist 82 is formed and patterned over the hard mask 80. The hard mask 80 can be formed by using a spin-on technique and can be patterned using acceptable photolithography techniques.

Figure 16A:
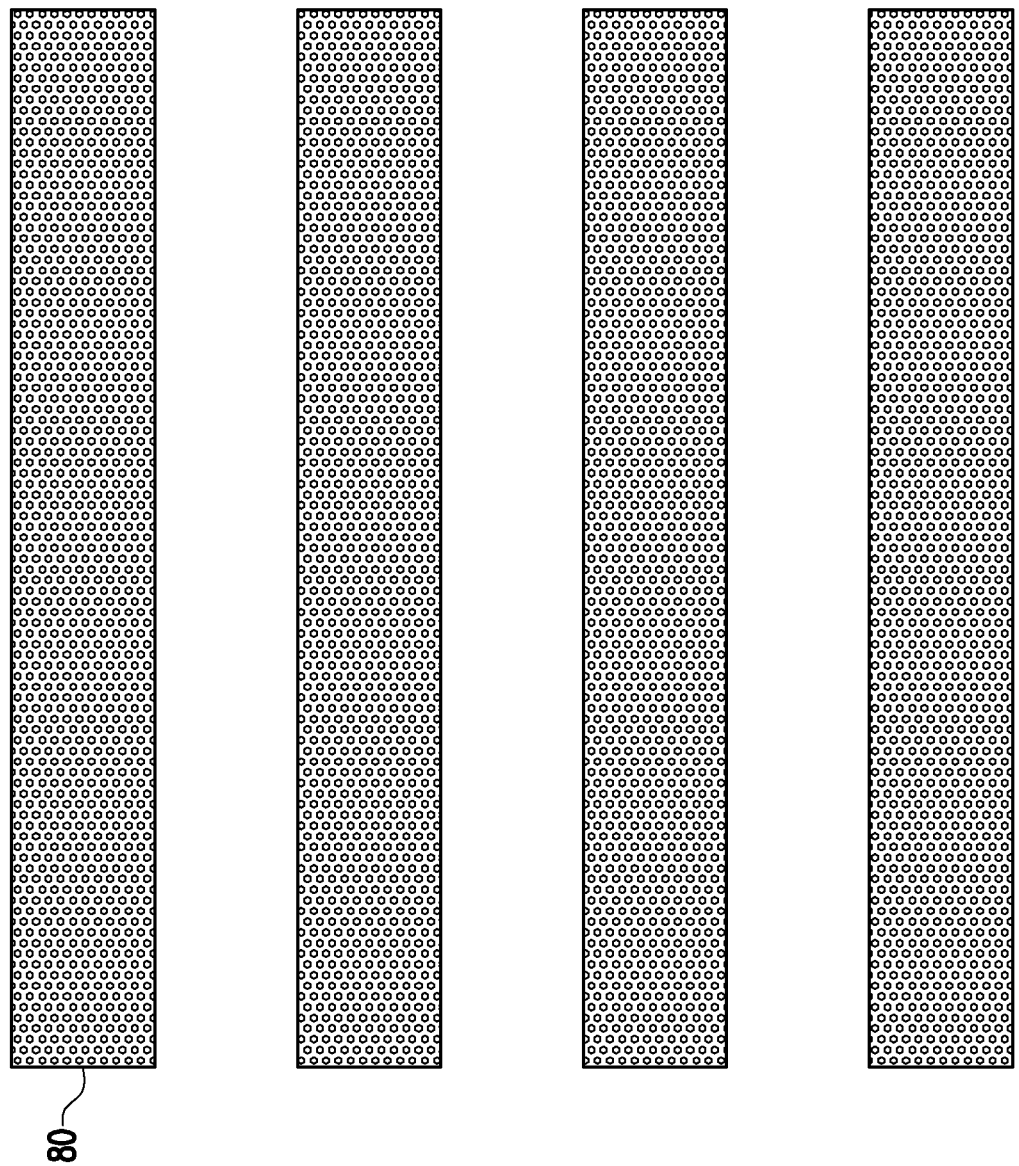
Figure 16B:
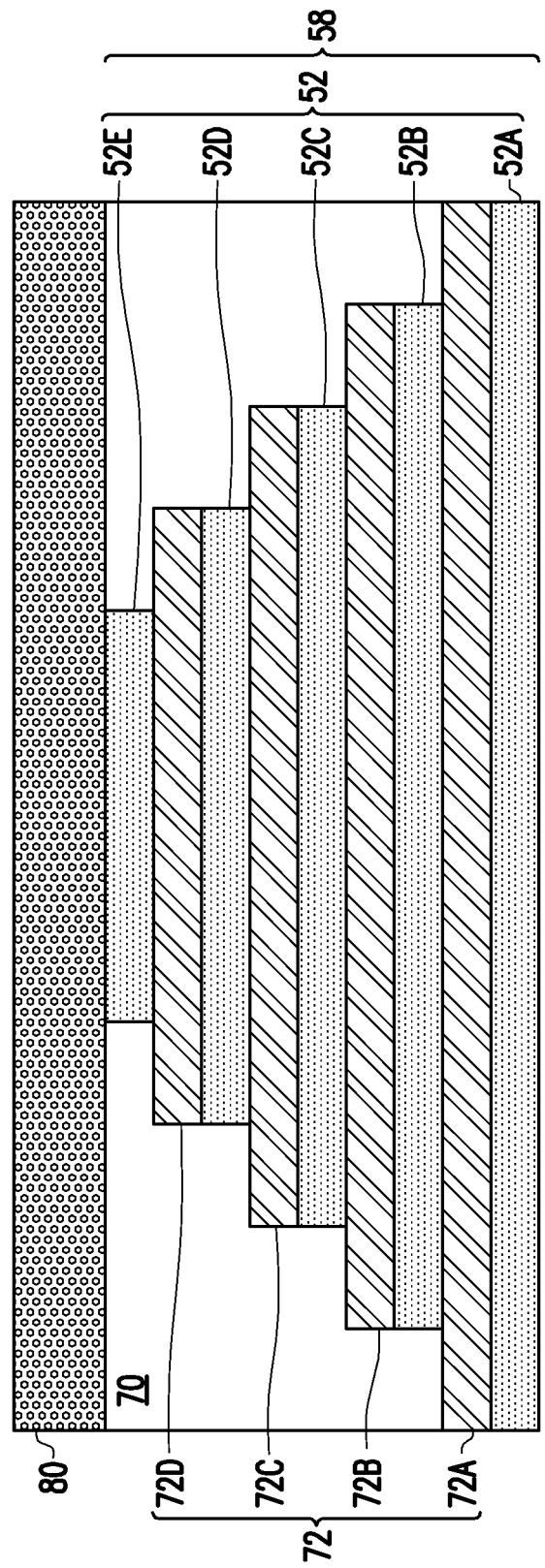
Figure 16C:
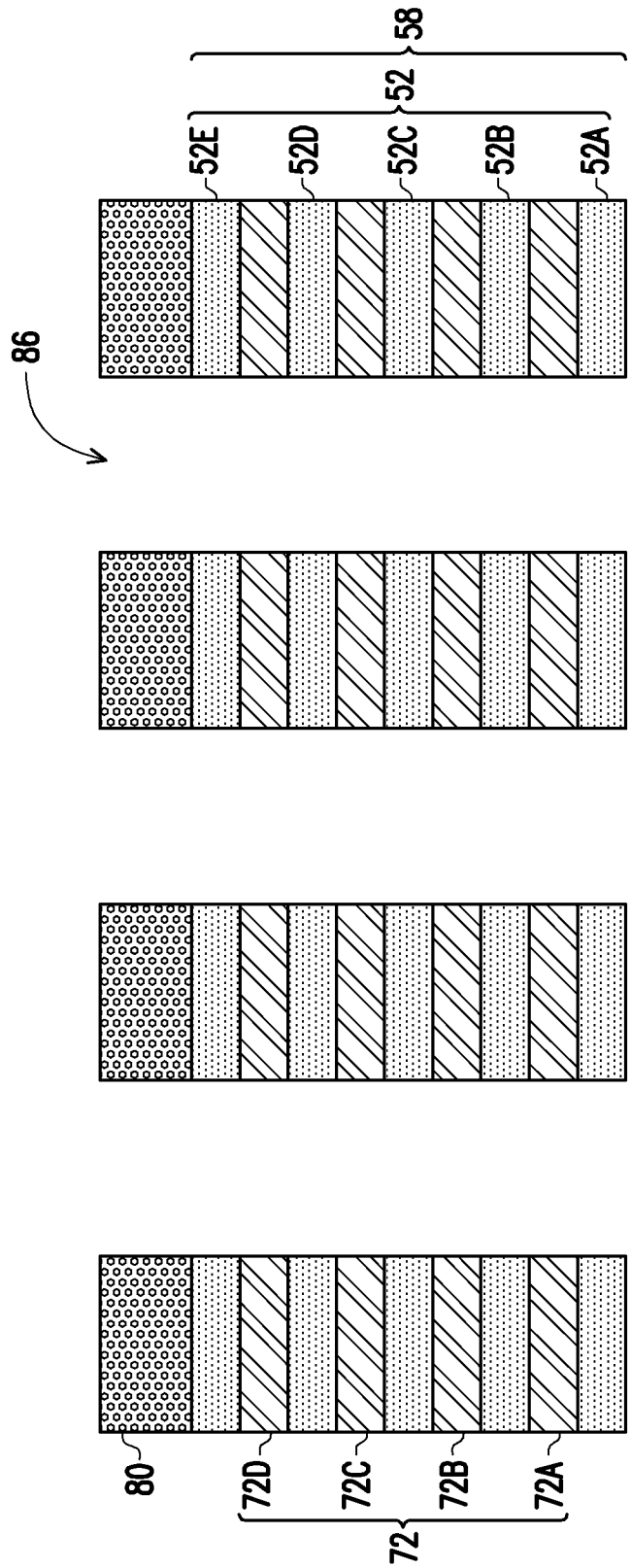

In FIGS. 16A through 16C, a pattern of the photoresist 82 is transferred to the hard mask 80 using an acceptable etching process, such as wet or dry etching, RIE, NBE, the like, or a combination thereof. The etching may be anisotropic. Thus, trenches 86 are formed in the hard mask 80.

Figure 17B:
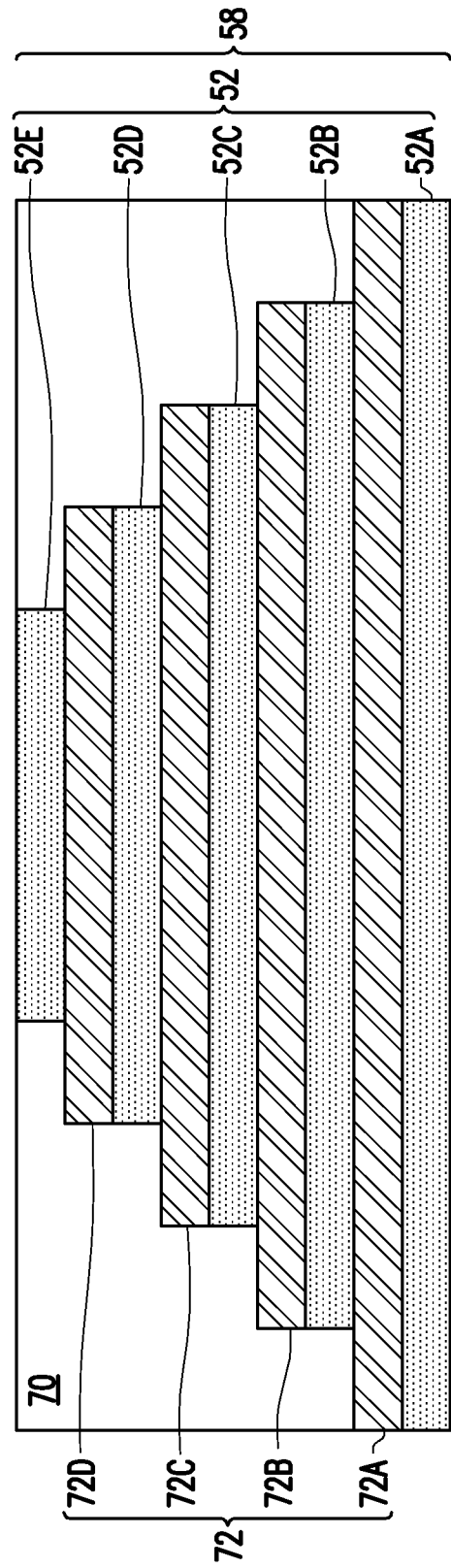
Figure 17C:
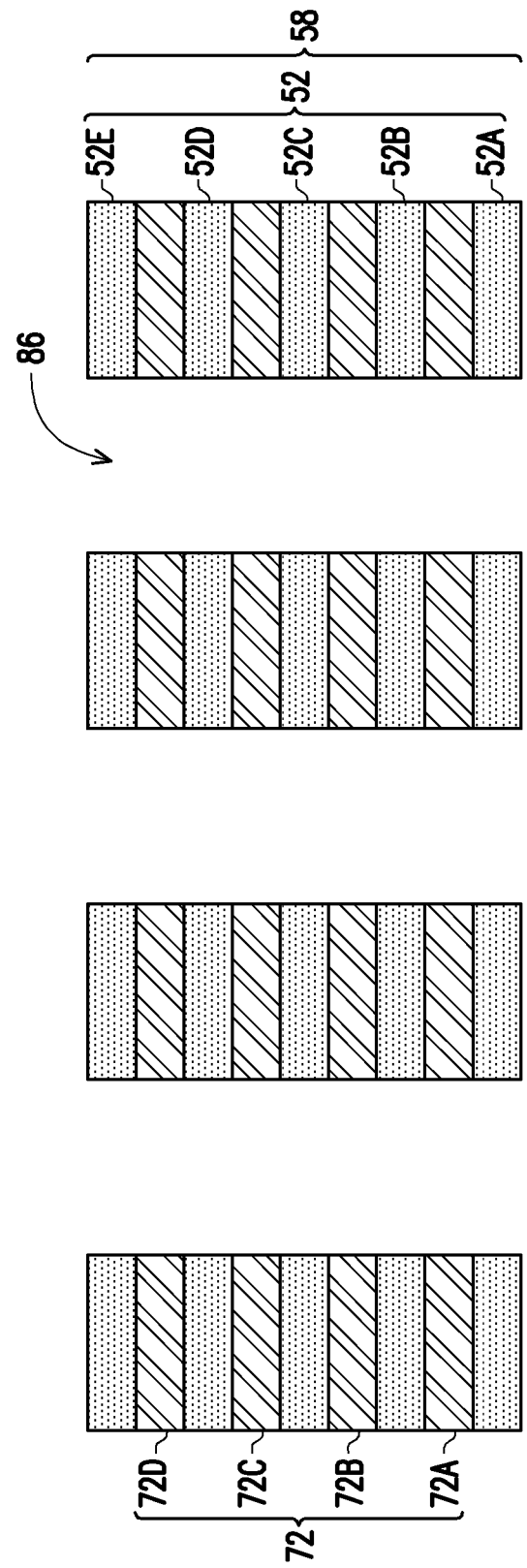

Further in FIGS. 16A through 16C, a pattern of the hard mask 80 is transferred to the multi-layer stack 58 using one or more acceptable etching processes, such as wet or dry etching, RIE, NBE, the like, or a combination thereof. The etching processes may be anisotropic. Thus, trenches 86 extending through the multi-layer stack 58 are formed. The conductive lines 72A-72D (e.g., word lines, collectively referred to as conductive lines 72) are formed from the conductive layers 54A-54D. By etching the trenches 86 through the conductive layers 54, adjacent conductive lines 72 can be separated from each other. In FIGS. 17A through 17C, the hard mask 80 may be removed by an acceptable process, such as a wet etching process, a dry etching process, a planarization process, combinations thereof, or the like.

Figure 18B:
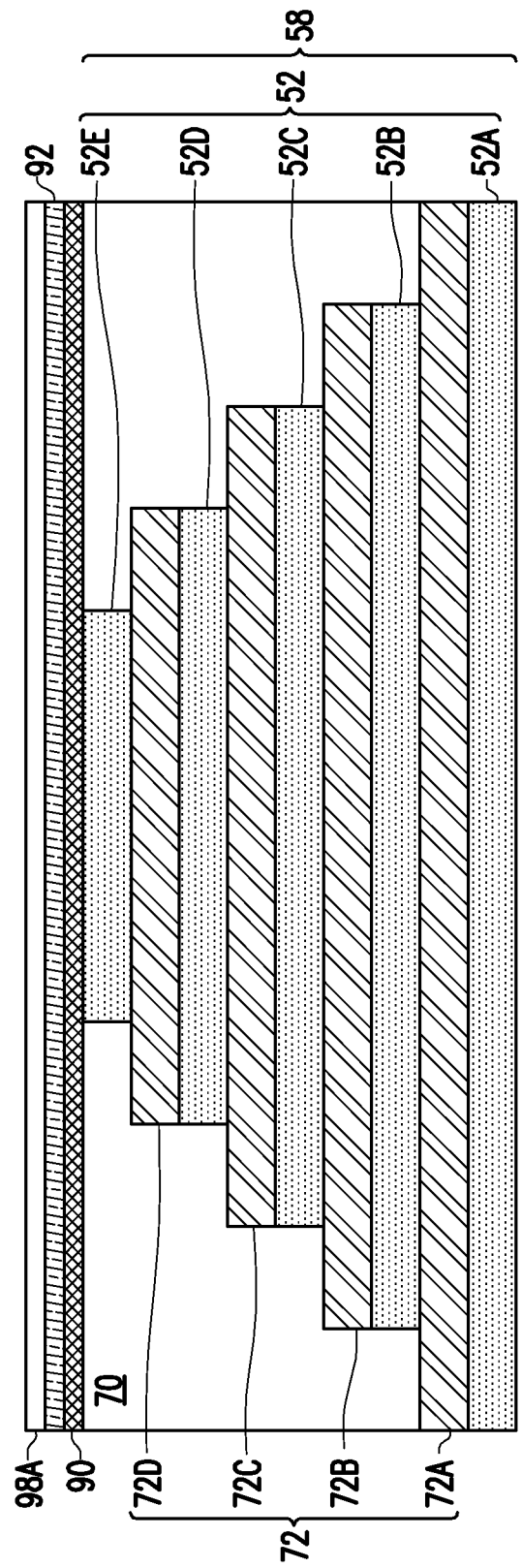
Figure 18C:
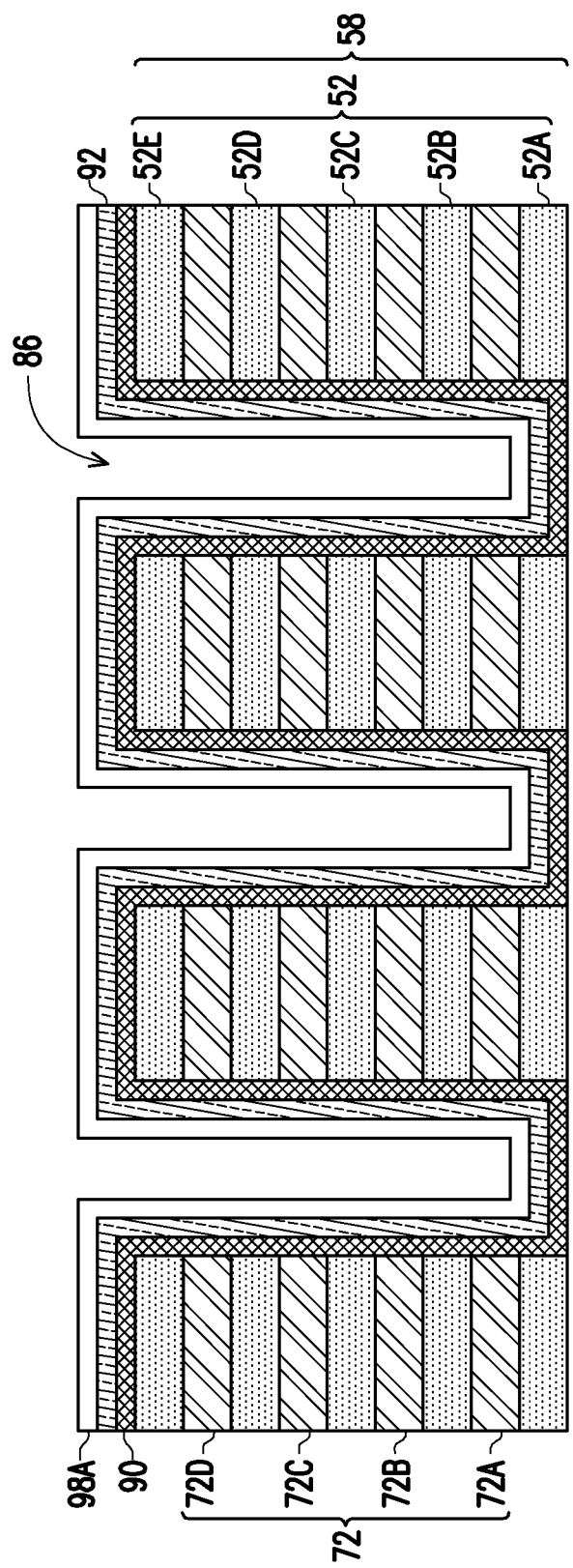

FIGS. 18A through 21C illustrate forming and patterning channel regions for the transistors 204 (see FIG. 1A) in the trenches 86. In FIGS. 18A through 18C, an FE material 90, an OS layer 92, and a first dielectric layer 98A are deposited in the trenches 86. The FE material 90 may be deposited conformally in the trenches 86 along sidewalls of the conductive lines 72 and the dielectric layers 52 and along top surfaces of the dielectric layer 52E, the substrate 50, and the IMD 70. The FE material 90 may comprise a material that is capable of switching between two different polarization directions by applying an appropriate voltage differential across the FE material 90. For example, the FE material 90 may be a high-k dielectric material, such as a hafnium (Hf) based dielectric materials or the like. In some embodiments, the FE material 90 comprises hafnium oxide, hafnium zirconium oxide, silicon-doped hafnium oxide, or the like. In some embodiments, the FE material 90 may comprise barium titanium oxide ($BaTiO_3$), lead titanium oxide ($PbTiO_3$), lead zirconium oxide ($PbZrO_3$), lithium niobium oxide ($LiNbO_3$), sodium niobium oxide ($NaNbO_3$), potassium niobium oxide ($KNbO_3$), potassium tantalum oxide ($KTaO_3$), bismuth scandium oxide ($BiScO_3$), bismuth iron oxide ($BiFeO_3$), hafnium erbium oxide ($Hf_{1-x}Er_xO$), hafnium lanthanum oxide ($Hf_{1-x}La_xO$), hafnium yttrium oxide ($Hf_{1-x}Y_xO$), hafnium gadolinium oxide ($Hf_{1-x}Gd_xO$), hafnium aluminum oxide ($Hf_{1-x}Al_xO$), hafnium zirconium oxide ($Hf_{1-x}Zr_xO$), hafnium titanium oxide ($Hf_{1-x}Ti_xO$), hafnium tantalum oxide ($Hf_{1-x}Ta_xO$), aluminum scandium nitride (AlScN), or the like. In some embodiments, the FE material 90 may comprise different ferroelectric materials or different types of memory materials. For example, in some embodiments, the FE material 90 may be replaced with a non-ferroelectric material, such as a multilayer memory structure comprising a layer of $SiN_x$ between two $SiO_x$ layers (e.g., an ONO structure). The FE material 90 may be deposited by CVD, PVD, ALD, PECVD, or the like.

The OS layer 92 is conformally deposited in the trenches 86 over the FE material 90. The OS layer 92 comprises materials suitable for providing channel regions for the transistors 204 (see FIG. 1A). For example, the OS layer 92 may include zinc oxide (ZnO), indium tungsten oxide (InWO), indium gallium zinc oxide (InGaZnO), indium zinc oxide (InZnO), indium tin oxide (ITO), polycrystalline silicon (poly-Si), amorphous silicon (a-Si), combinations thereof, or the like. The OS layer 92 may be deposited by CVD, PVD, ALD, PECVD, or the like. The OS layer 92 may extend along sidewalls and bottom surfaces of the trenches 86 over the FE material 90.

The first dielectric layer 98A is deposited in the trenches 86 over the OS layer 92. The first dielectric layer 98A may include, for example, silicon oxide, silicon nitride, silicon oxynitride, or the like, which may be deposited by CVD, PVD, ALD, PECVD, or the like. The first dielectric layer 98A may extend along sidewalls and bottom surfaces of the trenches 86 over the OS layer 92.

Figure 19A:
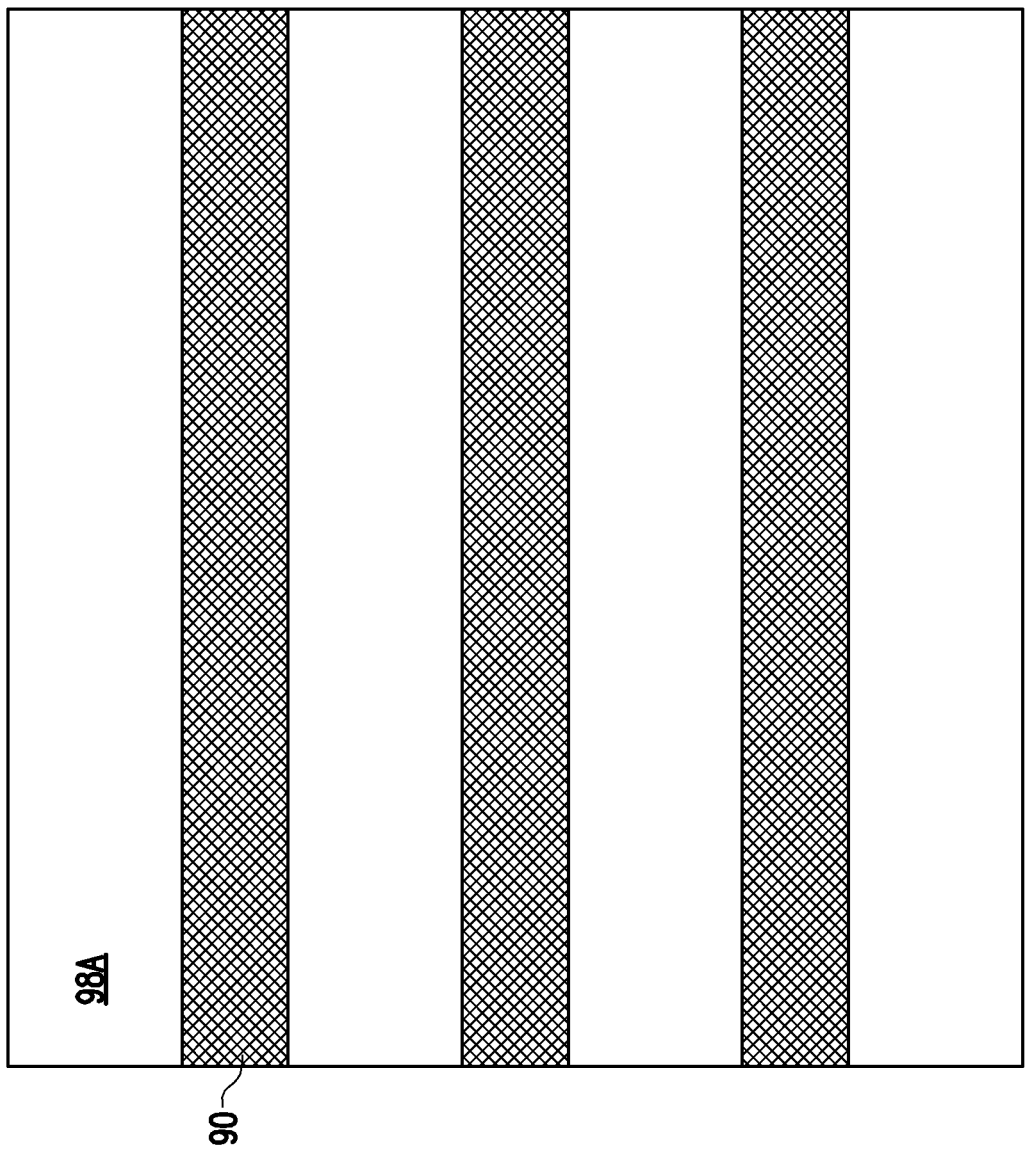
Figure 19B:
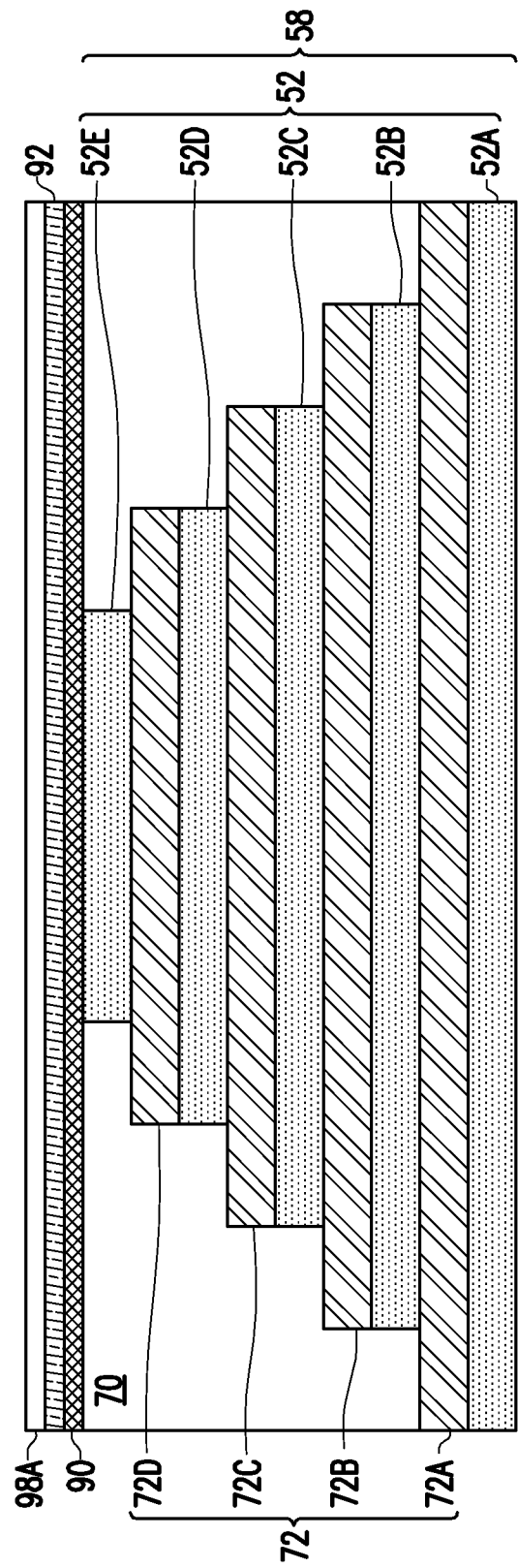
Figure 19C:
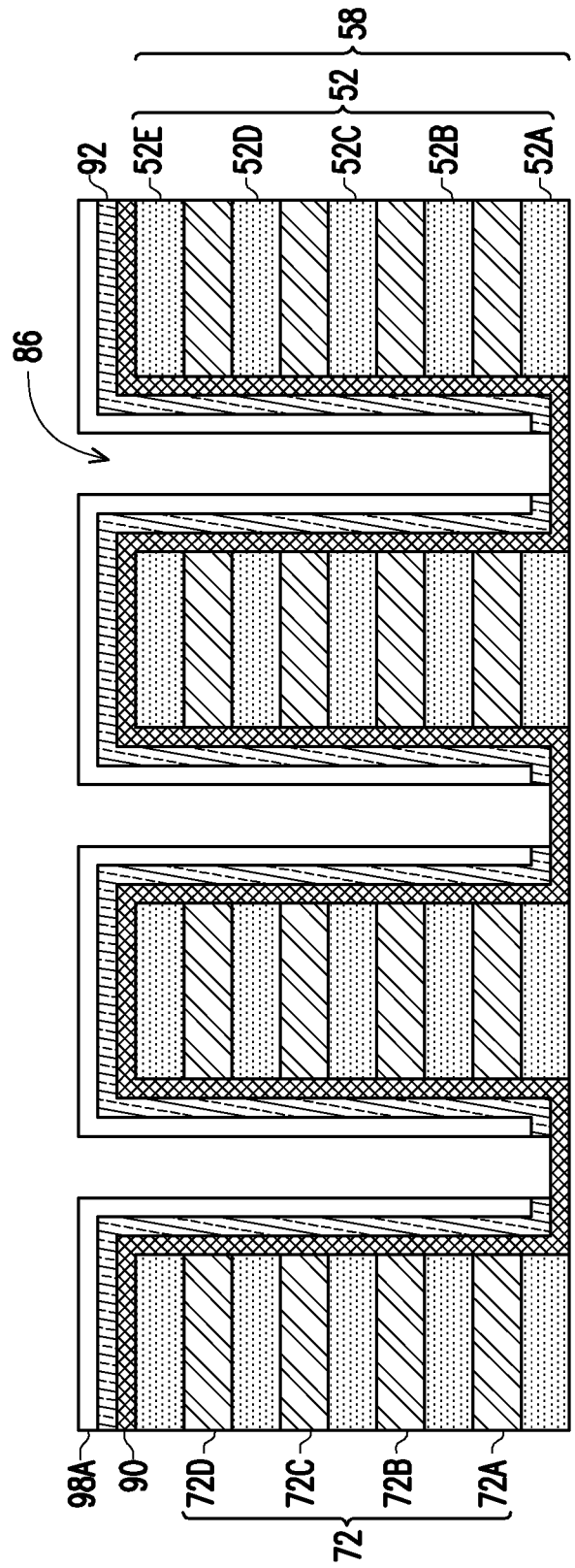

In FIGS. 19A through 19C, bottom portions of the first dielectric layer 98A and the OS layer 92 are removed in the trenches 86. The bottom portions of the first dielectric layer 98A may be removed using a combination of photolithography and etching. The etching may be any acceptable etch process, such as wet or dry etching, RIE, NBE, the like, or a combination thereof. The etching may be anisotropic.

The first dielectric layer 98A may then be used as an etch mask to etch through the bottom portions of the OS layer 92 in the trenches 86. The etching may be any acceptable etch process, such as wet or dry etching, RIE, NBE, the like, or a combination thereof. The etching may be anisotropic. Etching the OS layer 92 may expose portions of the FE material 90 on bottom surfaces of the trenches 86. Thus, portions of the OS layer 92 on opposing sidewalls of the trenches 86 may be separated from each other, which improves isolation between the memory cells 202 of the memory array 200 (see FIG. 1A). In some embodiments (not separately illustrated), the etching may further extend the trenches 86 through the FE material 90. Thus portions of the FE material 90 on opposing sidewalls of the trenches 86 may be separated from each other, which further improves isolation between the memory cells 202 of the memory array 200.

Figure 20B:
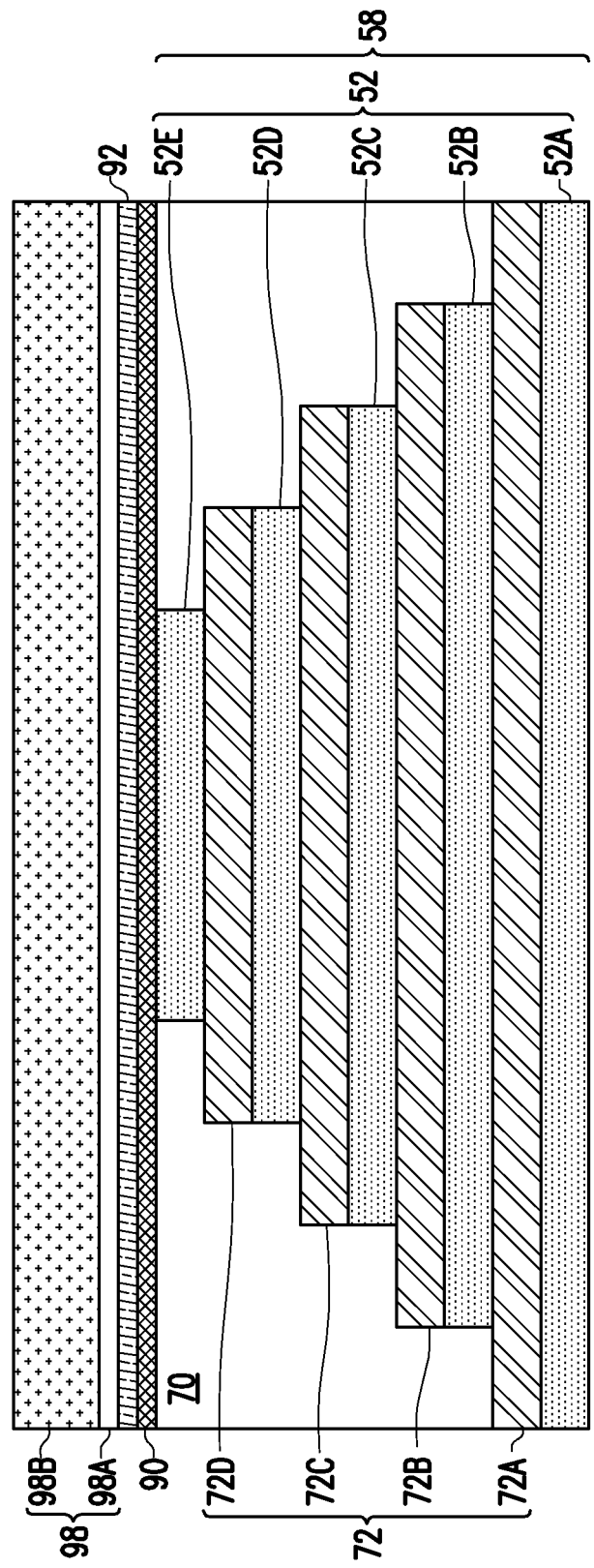
Figure 20C:
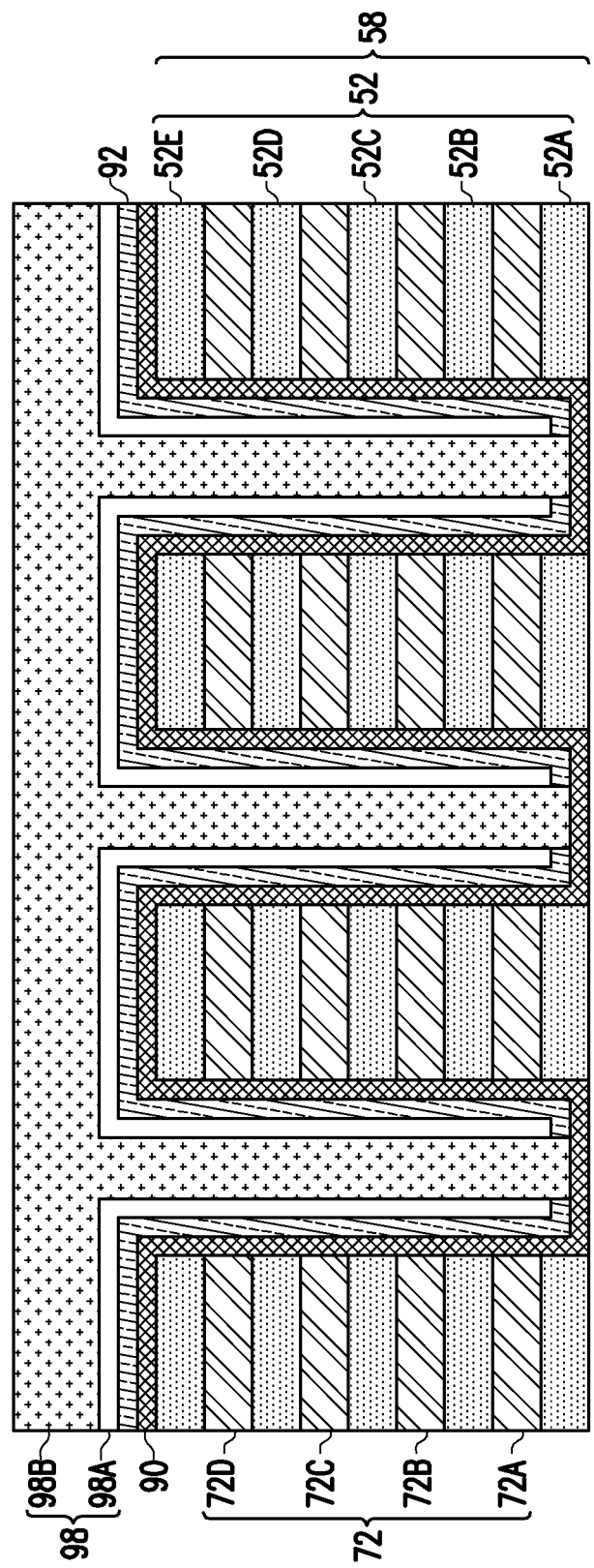

In FIGS. 20A through 20C, additional dielectric materials 98B are deposited to fill remaining portions of the trenches 86. The additional dielectric materials 98B may be formed of materials and by processes the same as or similar to those of the first dielectric layer 98A. The additional dielectric materials 98B and the first dielectric layer 98A may be referred to collectively as dielectric materials 98.

Figure 21A:
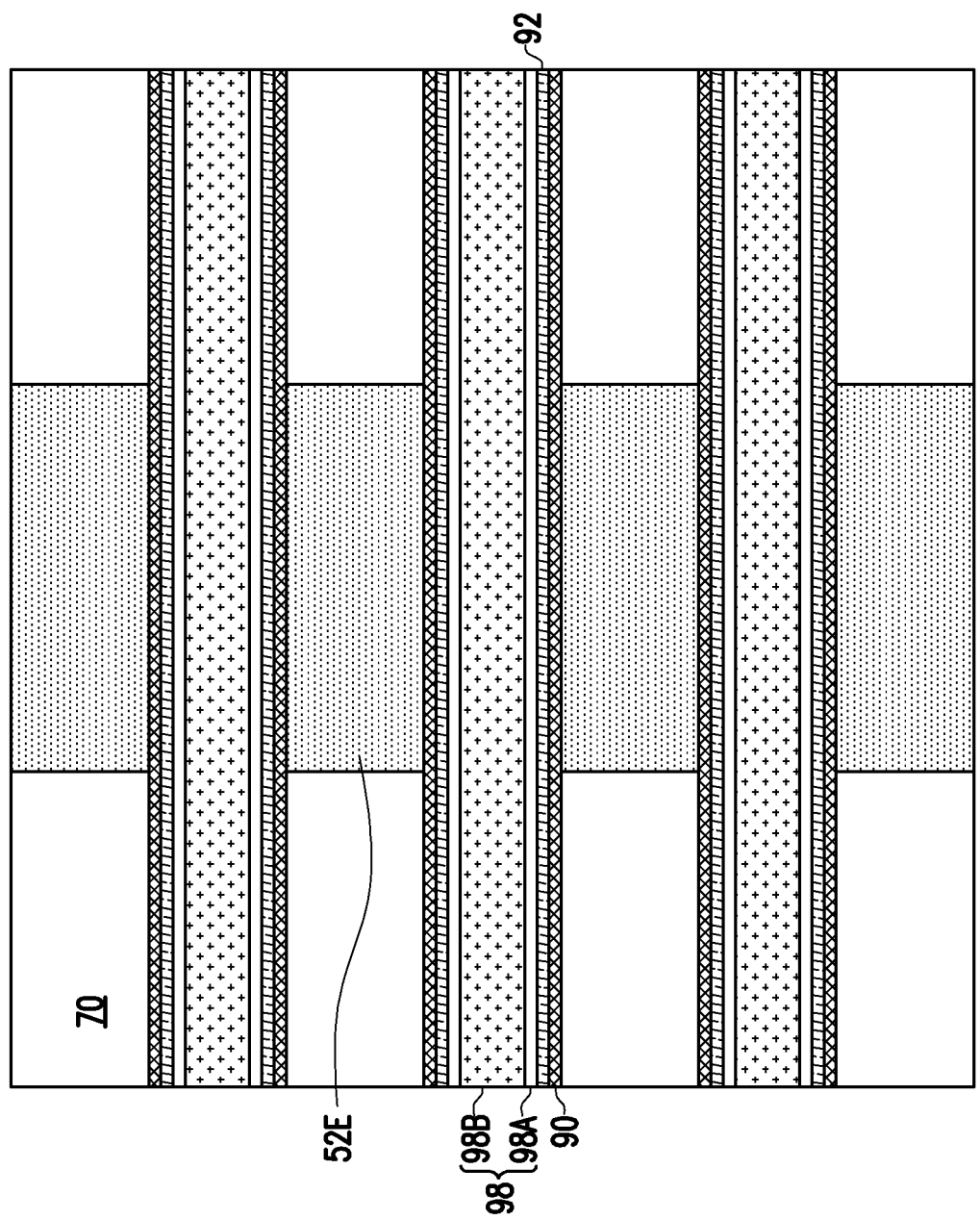
Figure 21B:
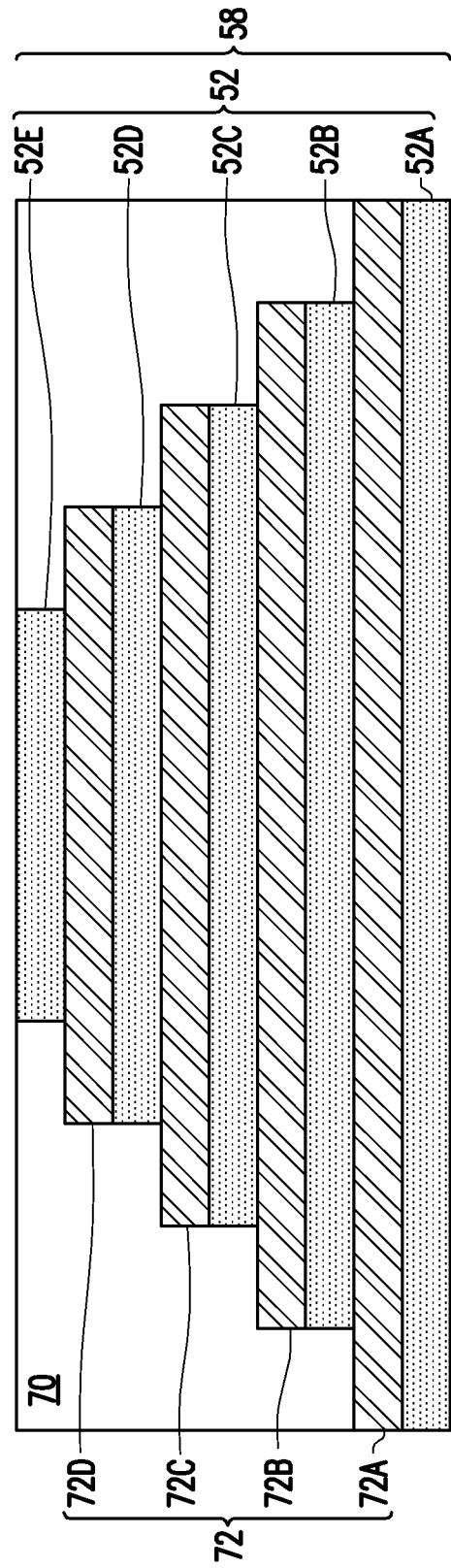
Figure 21C:
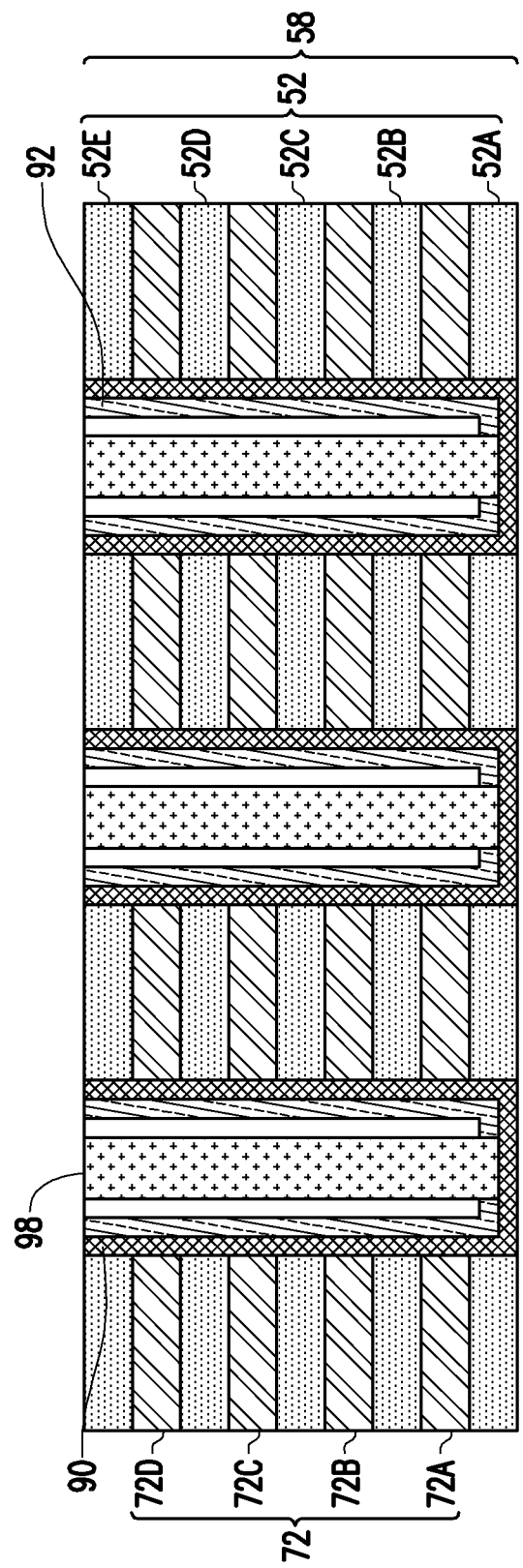

In FIGS. 21A through 21C, a removal process is applied to the dielectric materials 98, the OS layer 92, and the FE material 90 to remove excess materials over the multi-layer stack 58. In some embodiments, a planarization process such as a CMP, an etch-back process, combinations thereof, or the like may be utilized. The planarization process exposes the multi-layer stack 58 such that top surfaces of the multi-layer stack 58 (e.g., the dielectric layer 52E), the FE material 90, the OS layer 92, the dielectric materials 98, and the IMD 70 are level after the planarization process is complete.

FIGS. 22A through 25D illustrate intermediate steps of manufacturing dielectric materials 102, conductive lines 106 (e.g., bit lines), and conductive lines 108 (e.g., source lines) in the memory array 200. The conductive lines 106 and the conductive lines 108 may extend in a direction perpendicular to the conductive lines 72 such that individual memory cells 202 of the memory array 200 may be selected for read and write operations.

Figure 22A:
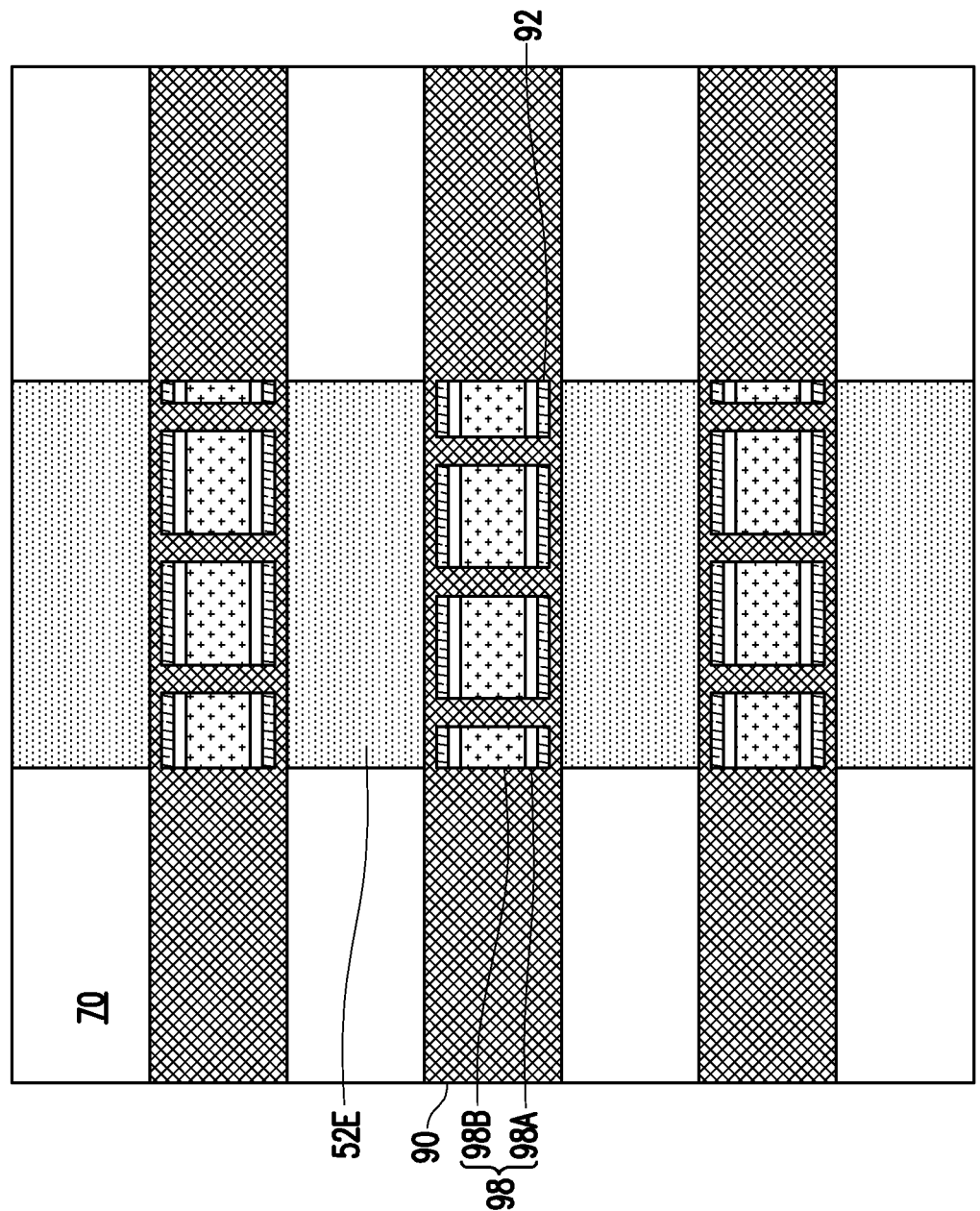
Figure 22B:
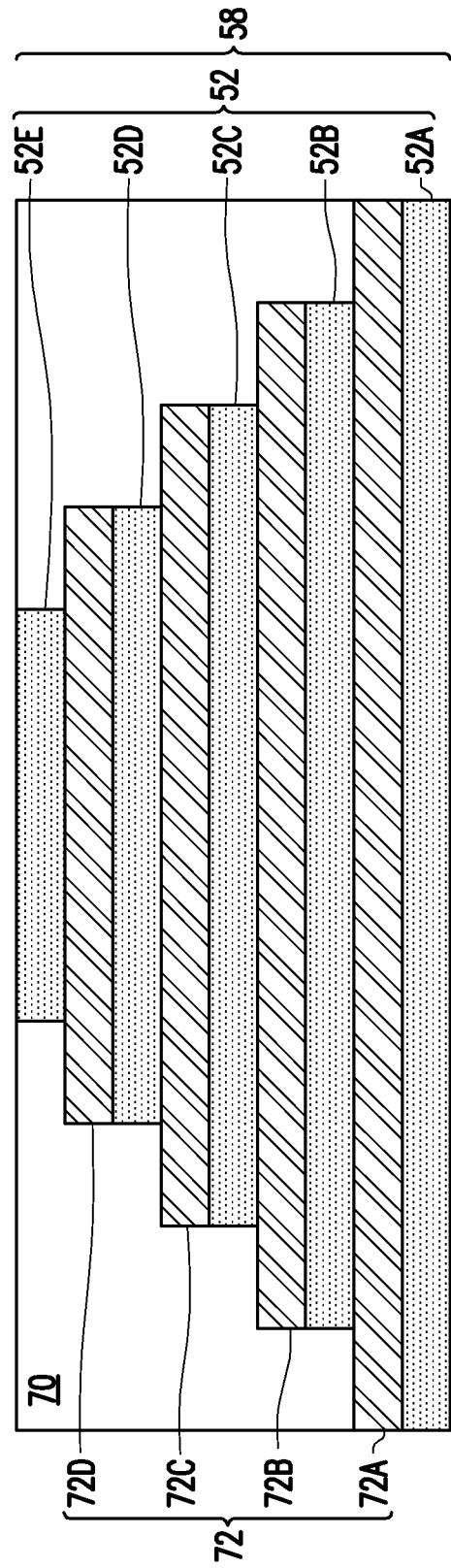
Figure 22C:
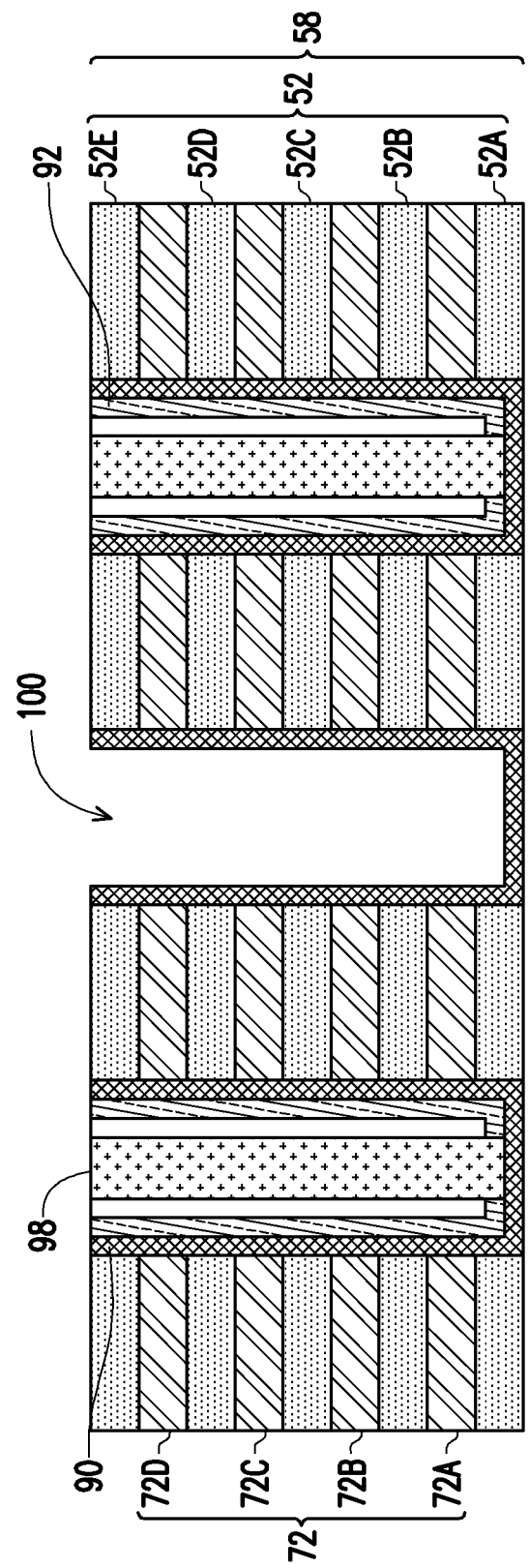

In FIGS. 22A through 22C, trenches 100 are patterned through the dielectric materials 98 and the OS layer 92. The trenches 100 may be patterned in the dielectric materials 98 and the OS layer 92 through a combination of photolithography and etching. The etching may be any acceptable etching processes, such as wet or dry etching, RIE, NBE, the like, or a combination thereof. The etching may be anisotropic. The trenches 100 may be disposed between opposing sidewalls of the FE material 90 and the trenches 100 may physically separate adjacent stacks of the memory cells 202 in the memory array 200 (see FIG. 1A).

As illustrated in FIG. 22A, the trenches 100 may be formed in peripheral areas adjacent the IMD 70 by patterning the dielectric materials 98 and the OS layer 92. Dielectric materials (such as the dielectric materials 102, discussed below with respect to FIGS. 23A through 23C) may be subsequently formed in the trenches 100 in the peripheral areas adjacent the IMD 70 and the dielectric materials may be subsequently patterned to form conductive contacts (such as the contacts 111, discussed below with respect to FIGS. 27A through 27D) to underlying structures, such as the interconnect structures 320.

Figure 23A:
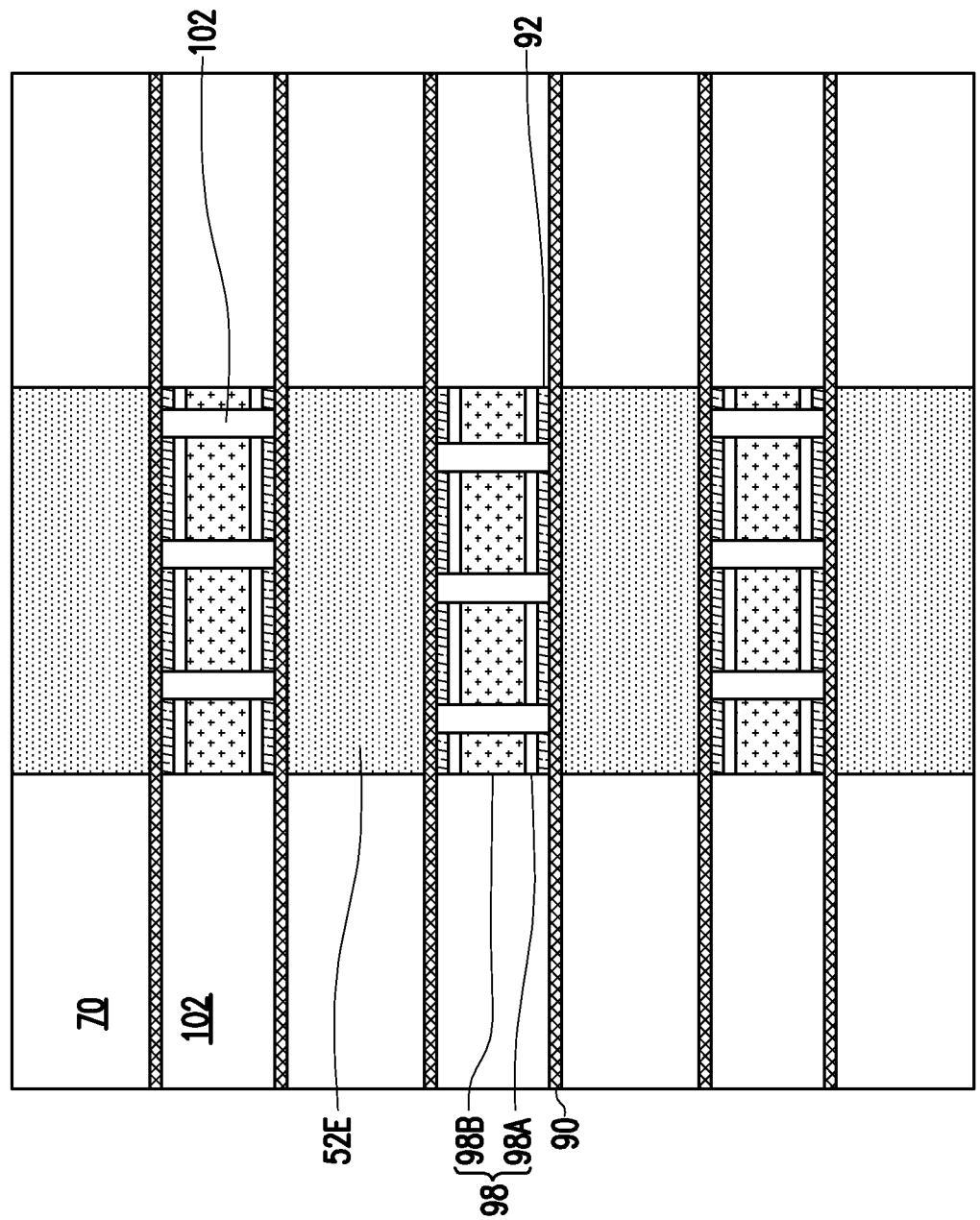
Figure 23B:
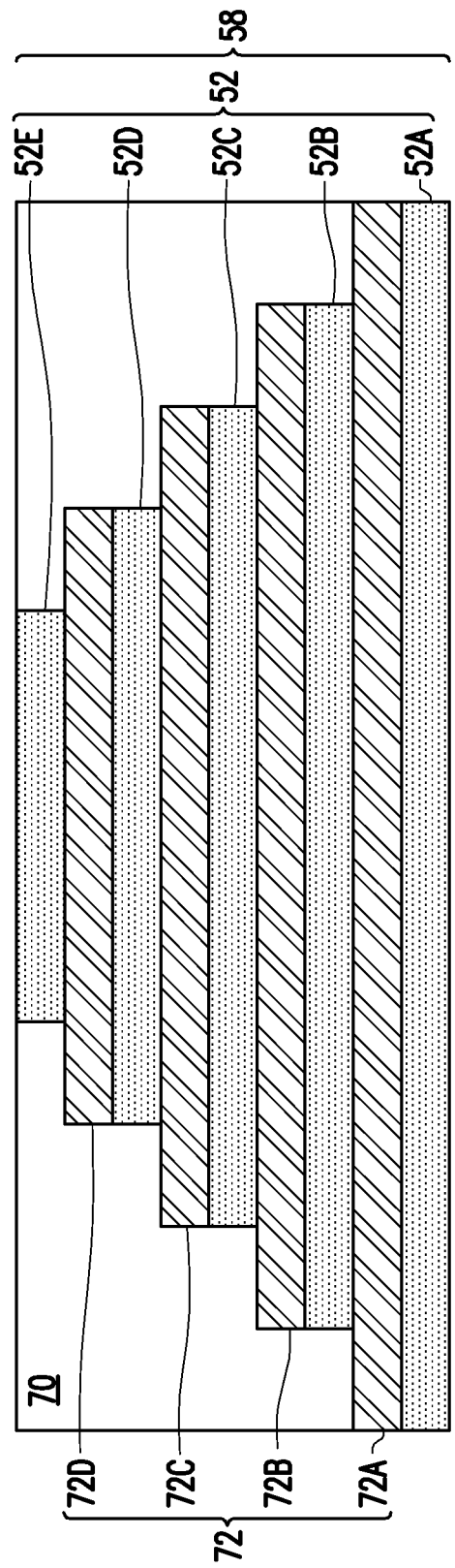
Figure 23C:
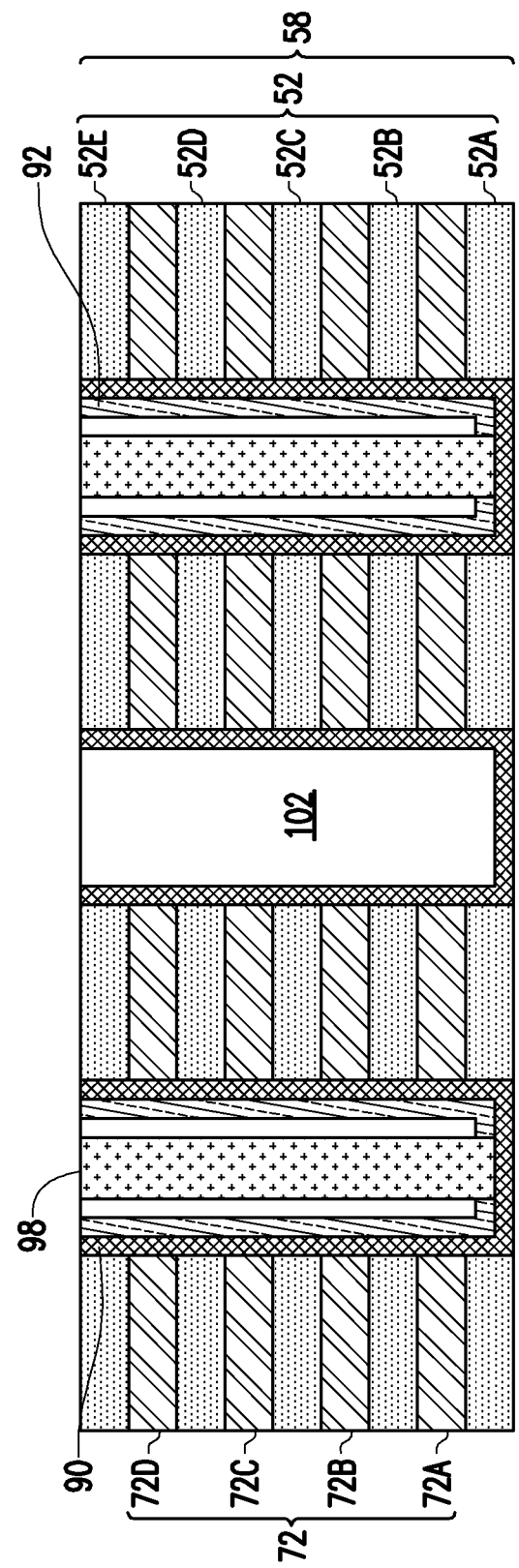
Figure 24A:
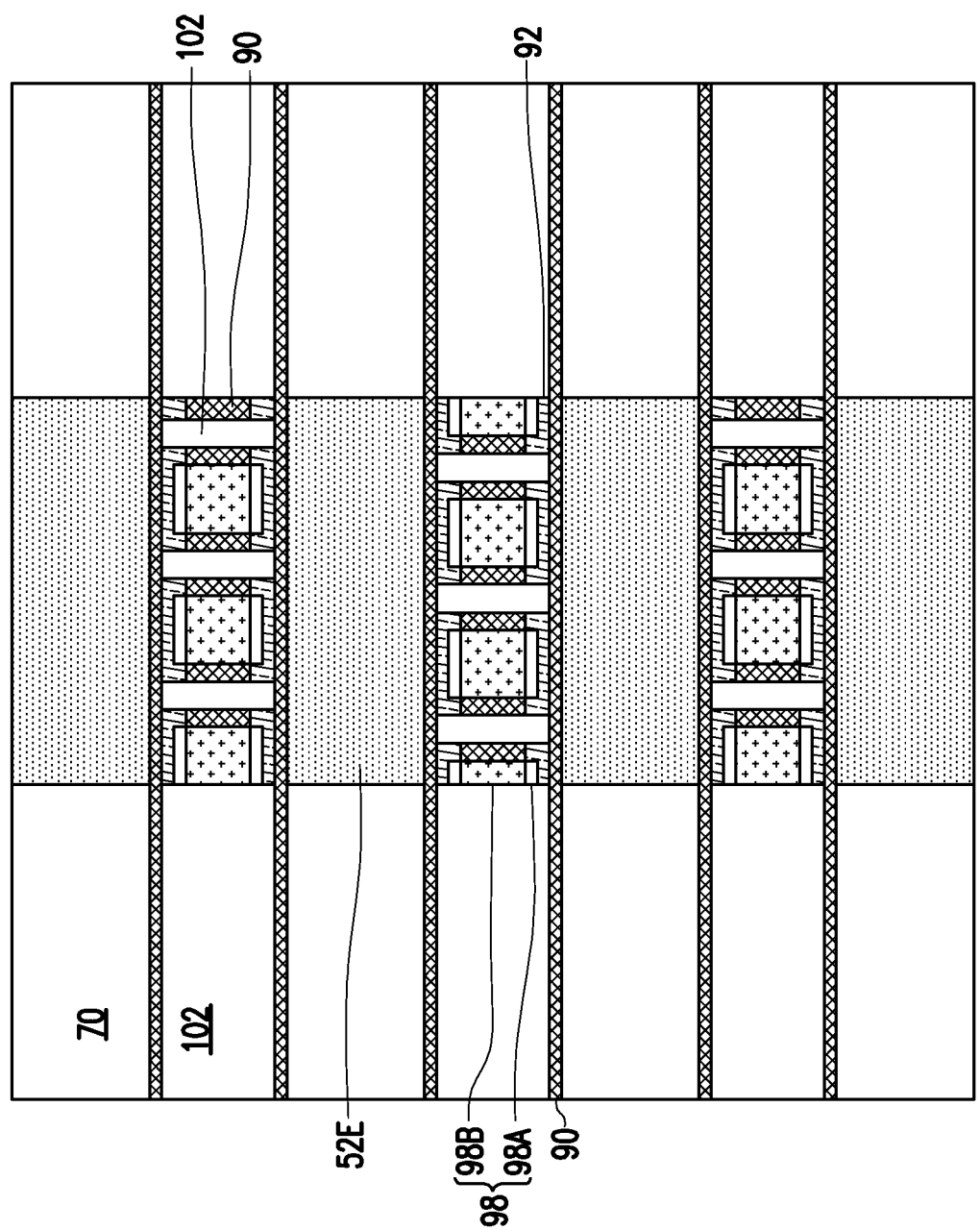
Figure 24B:
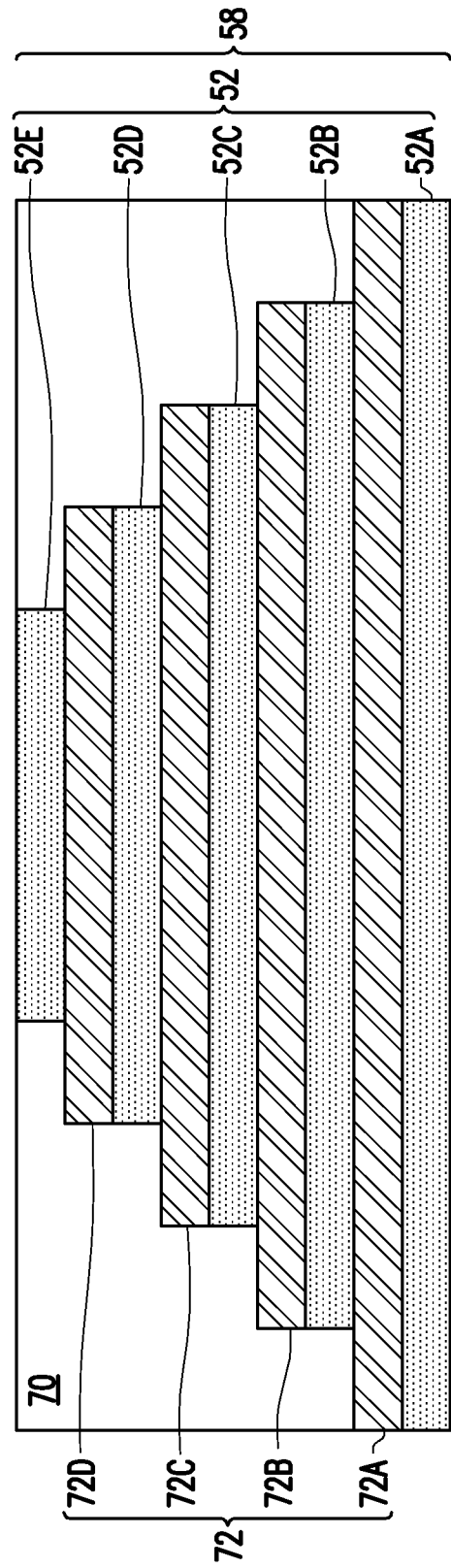
Figure 24C:
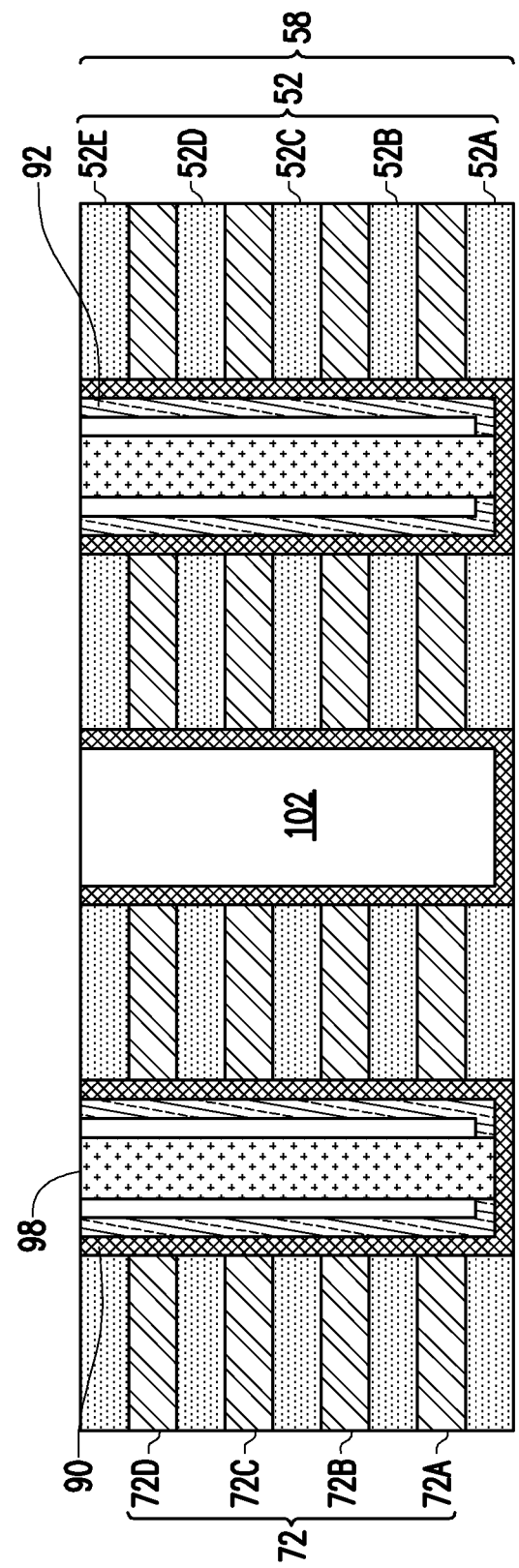
Figure 24D:
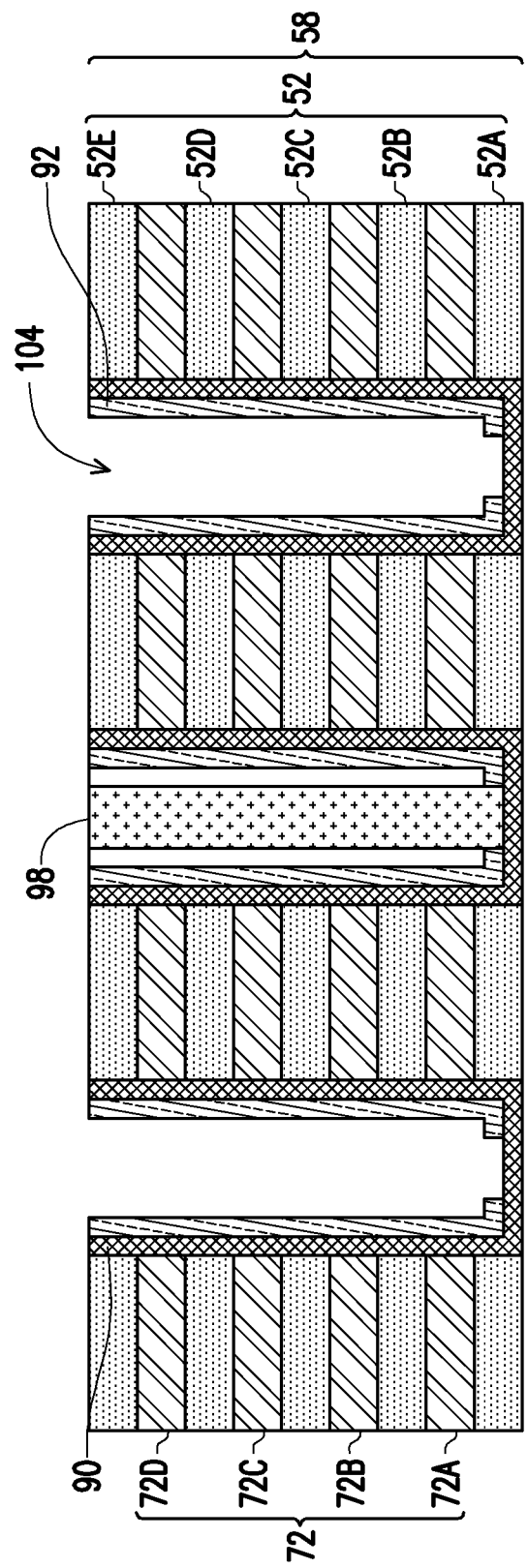

In FIGS. 23A through 23C, dielectric materials 102 are deposited in and fill the trenches 100. The dielectric materials 102 may include, for example, silicon oxide, silicon nitride, silicon oxynitride, or the like, which may be deposited by CVD, PVD, ALD, PECVD, or the like. The dielectric materials 102 may extend along sidewalls and bottom surfaces of the trenches 100 over the OS layer 92. After deposition, a planarization process (e.g., a CMP, an etch-back, or the like) may be performed to remove excess portions of the dielectric materials 102. In the resulting structure, top surfaces of the multi-layer stack 58, the FE material 90, the OS layer 92, the dielectric materials 98, the dielectric materials 102, and the IMD 70 may be substantially level (e.g., within process variations).

In some embodiments, materials of the dielectric materials 98 and the dielectric materials 102 may be selected so that they may be etched selectively relative each other. For example, in some embodiments, the dielectric materials 98 are an oxide and the dielectric materials 102 are a nitride. In some embodiments, the dielectric materials 98 are a nitride and the dielectric materials 102 are an oxide. Other materials are also possible.

In FIGS. 24A through 24D, trenches 104 are patterned through the dielectric materials 98. The trenches 104 may be subsequently used to form conductive lines. The trenches 104 may be patterned through the dielectric materials 98 using a combination of photolithography and etching. The etching may be any acceptable etch process, such as wet or dry etching, RIE, NBE, the like, or a combination thereof. The etching may be anisotropic. The etching may use etchants that etch the dielectric materials 98 without significantly etching the dielectric materials 102. A pattern of the trenches 104 may correspond to that of subsequently formed conductive lines (such as the conductive lines 106 and the conductive lines 108, discussed below with respect to FIGS. 25A through 25D). Portions of the dielectric materials 98 may remain between each pair of the trenches 104, and the dielectric materials 102 may be disposed between adjacent pairs of the trenches 104.

Figure 25A:
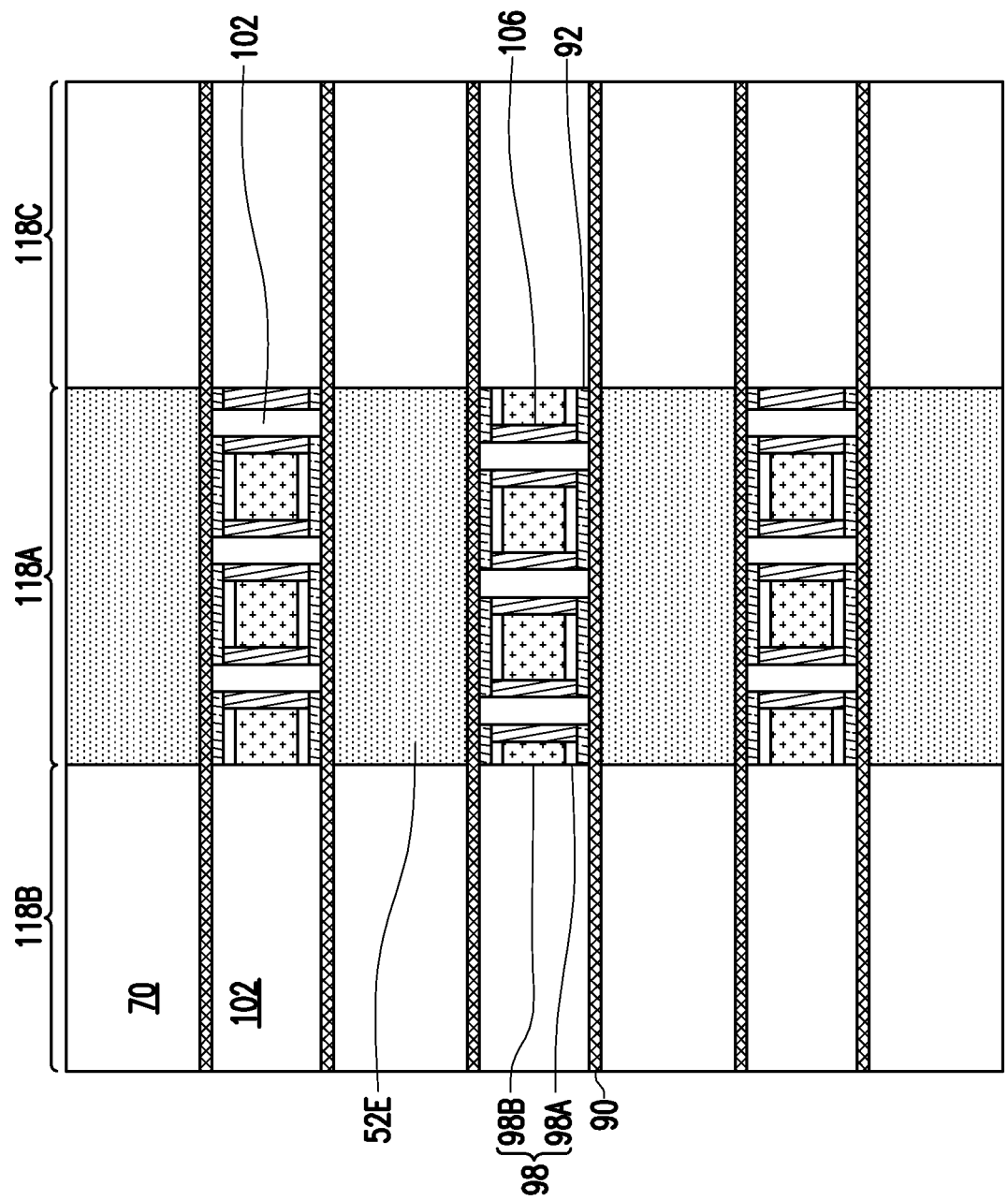
Figure 25B:
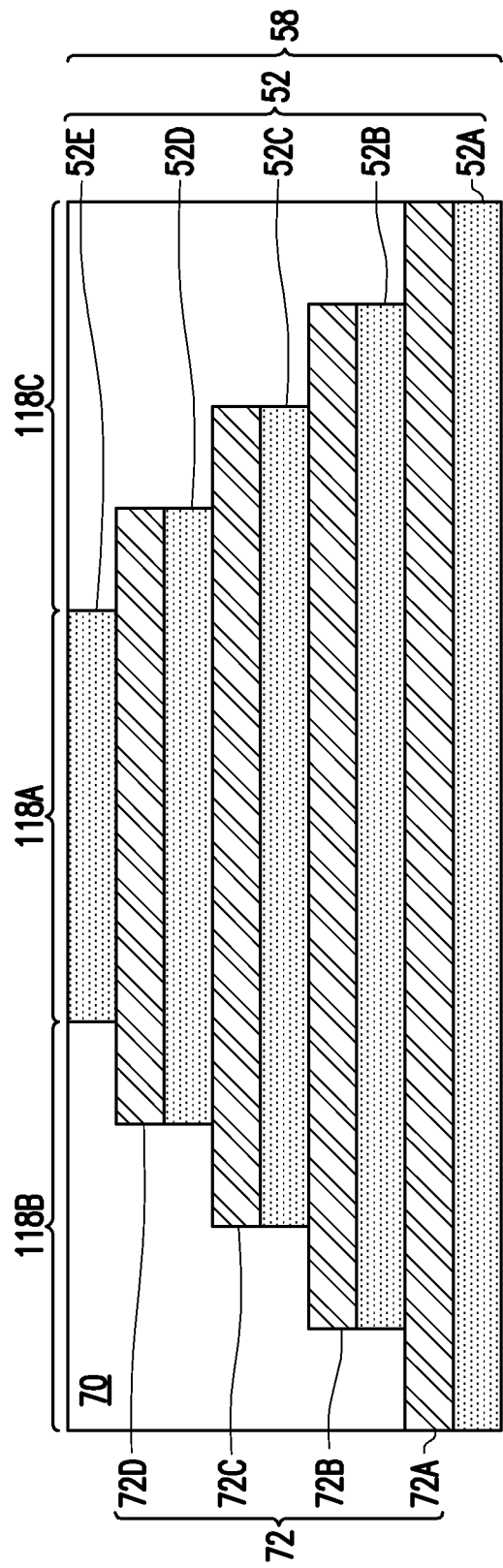
Figure 25C:
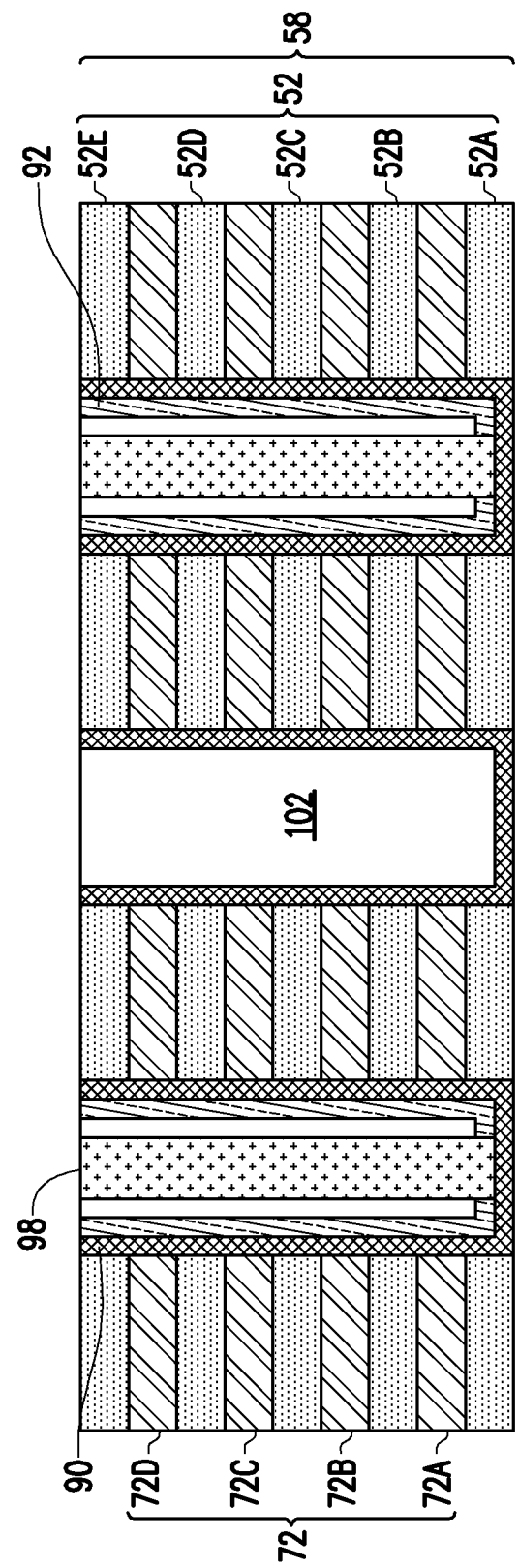
Figure 25D:
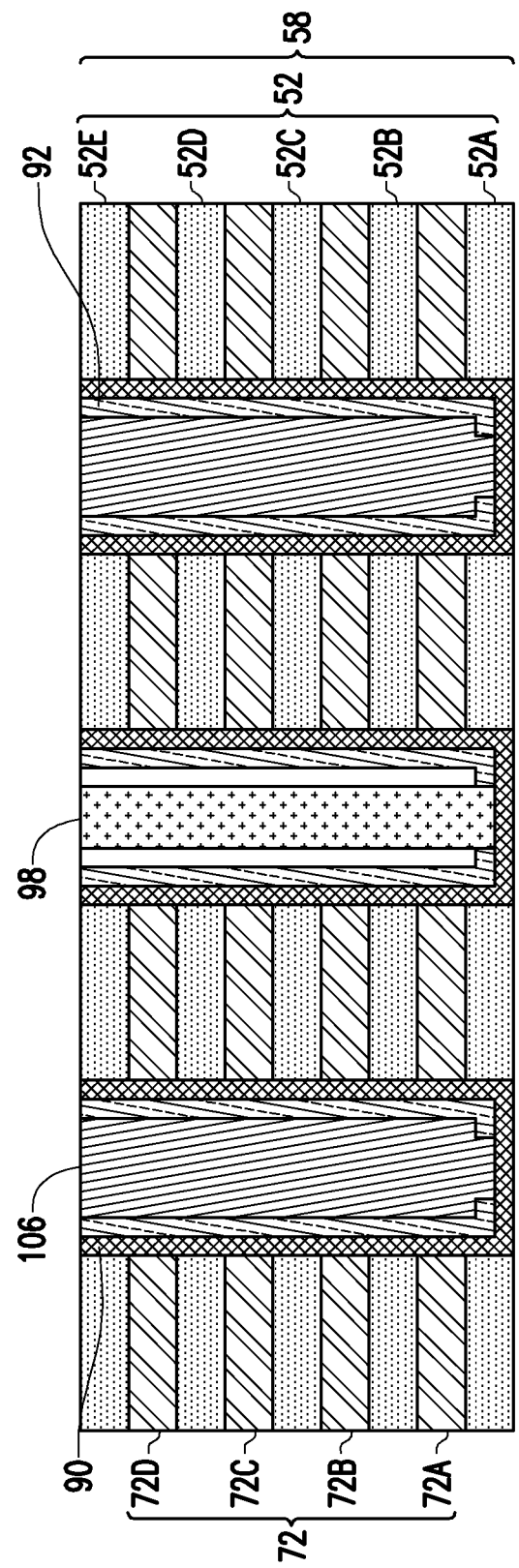
Figure 25E:
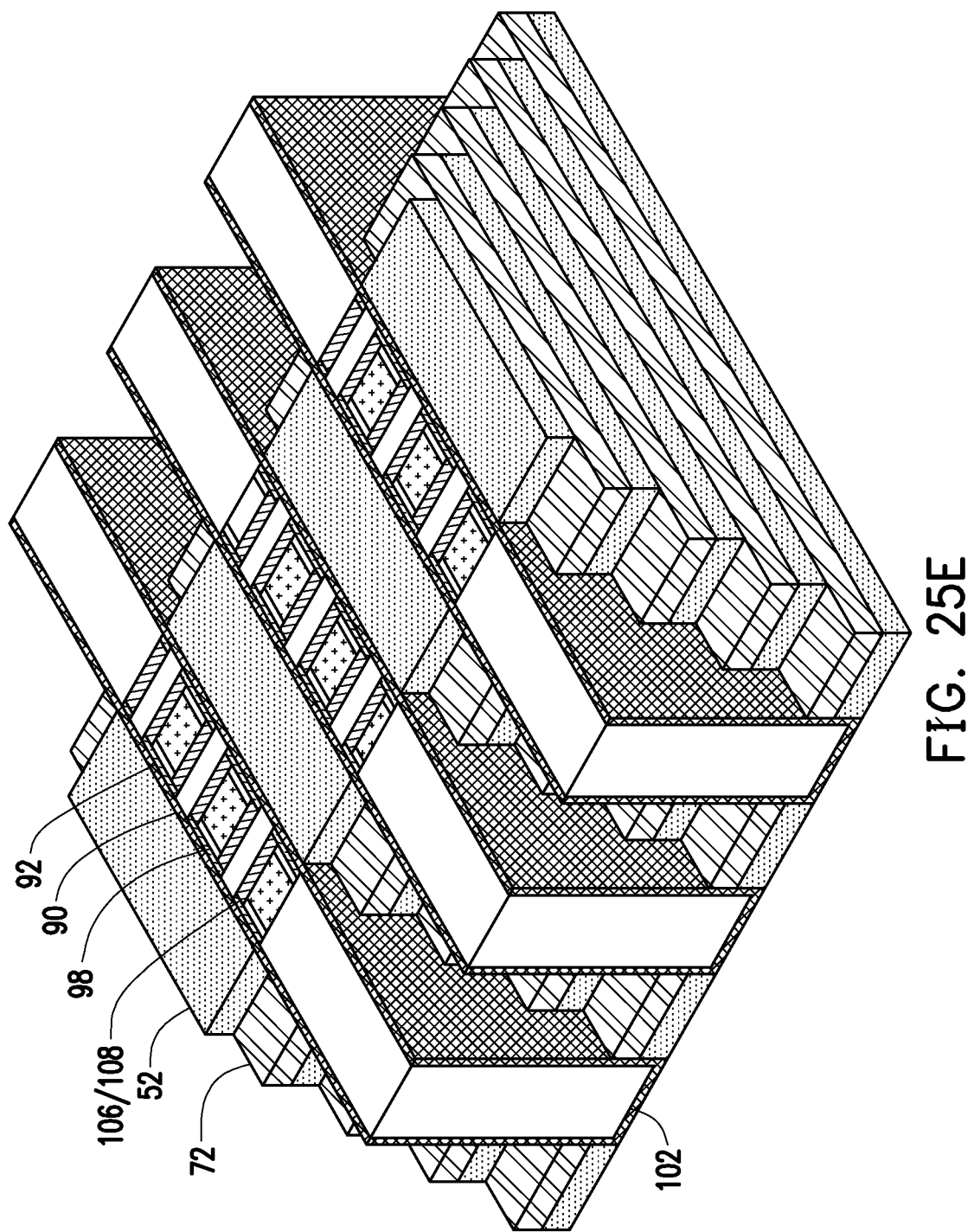

In FIGS. 25A through 25F, the trenches 104 are filled with a conductive material to form conductive lines 106 and conductive lines 108. FIG. 25E illustrates a perspective view of the structure after forming the conductive lines 106 and the conductive lines 108 with the IMD 70 being removed for illustrative purposes. The conductive lines 106 and the conductive lines 108 may each comprise conductive materials, such as, copper, titanium, titanium nitride, tantalum, tantalum nitride, tungsten, ruthenium, aluminum, cobalt, silver, gold, nickel, chromium, hafnium, platinum, combinations thereof, or the like. The conductive lines 106 and the conductive lines 108 may be formed using, for example, CVD, ALD, PVD, PECVD, or the like. After the conductive materials are deposited, a planarization (e.g., a CMP, an etchback, or the like) may be performed to remove excess portions of the conductive materials, thereby forming the conductive lines 106 and the conductive lines 108. In the resulting structure, top surfaces of the multi-layer stack 58, the FE material 90, the OS layer 92, the dielectric materials 98, the dielectric materials 102, the IMD 70, the conductive lines 106, and the conductive lines 108 may be substantially level (e.g., within process variations). The conductive lines 106 may correspond to bit lines in the memory array 200 and the conductive lines 108 may correspond to source lines in the memory array 200. Further, the conductive lines 106 and the conductive lines 108 may provide source/drain electrodes for the transistors 204 in the memory array 200. Although FIG. 25D illustrates a cross-sectional view that only shows the conductive lines 106, a cross-sectional view of the conductive lines 108 may be similar.

As illustrated in FIGS. 25A and 25B, the memory array 200 may include a memory cell region 118A, a first staircase region 118B and a second staircase region 118C. The first staircase region 118B and the second staircase region 118C include the IMD 70, portions of the dielectric materials 102, portions of the FE material 90, portions of the conductive lines 72A-72D, and portions of the dielectric layers 52A-52D. The memory cell region 118A includes portions of the conductive lines 72A-72D, portions of the dielectric layers 52A-52D, the dielectric layer 52E, the conductive lines 106, the conductive lines 108, the dielectric materials 98, portions of the dielectric materials 102, portions of the FE material 90, and the OS layer 92.

Figure 25F:
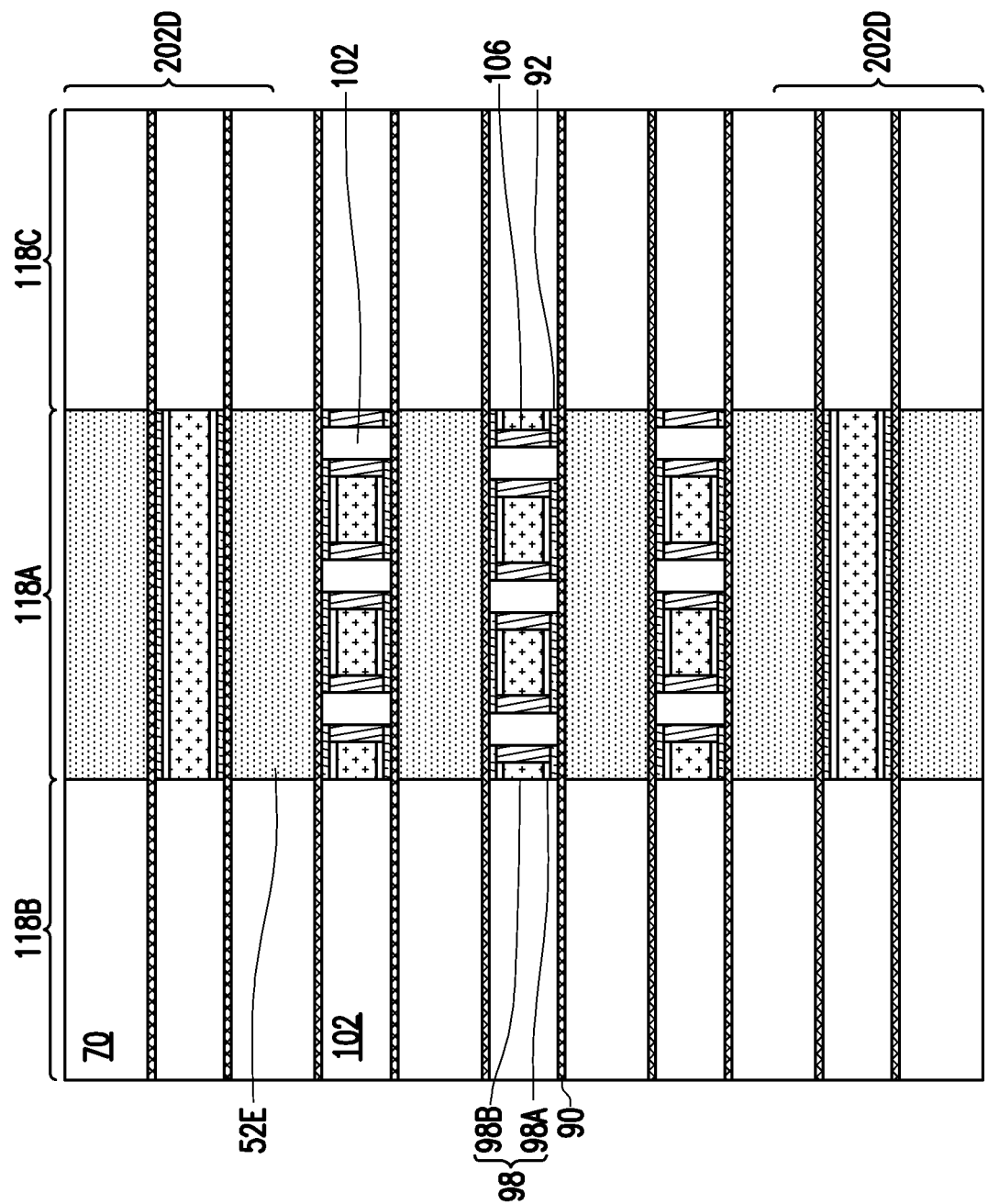

In some embodiments, dummy memory cells 202D may be formed in regions of the memory array 200. For example, FIG. 25F illustrates an embodiment in which dummy memory cells 202D are formed at boundaries of the memory array 200. The dummy memory cells 202D may include the dielectric materials 98, the OS layer 92, and the FE material 90, which are not etched to form the conductive lines 106, the conductive lines 108, and the dielectric materials 102.

Figure 26A:
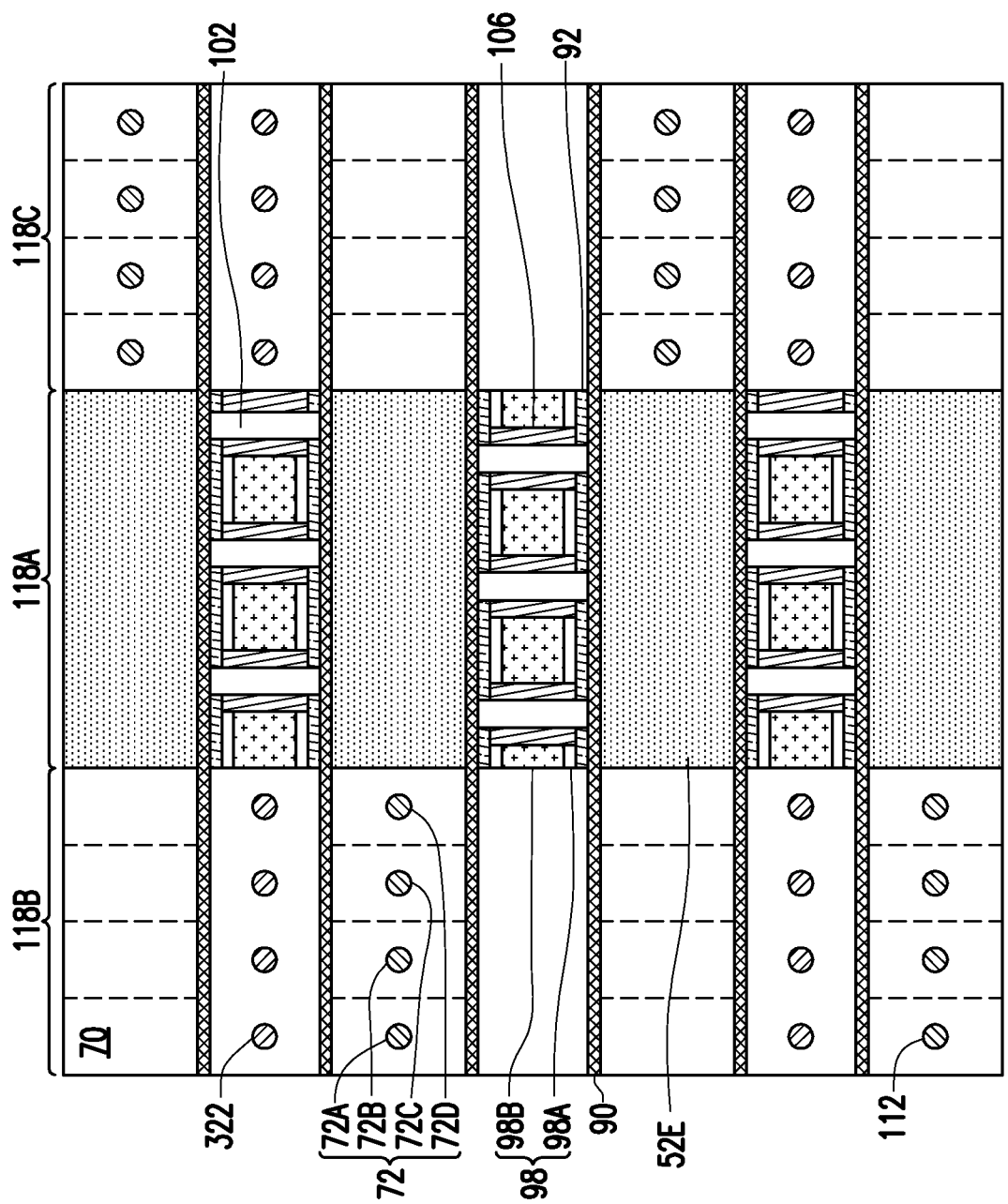
Figure 26B:
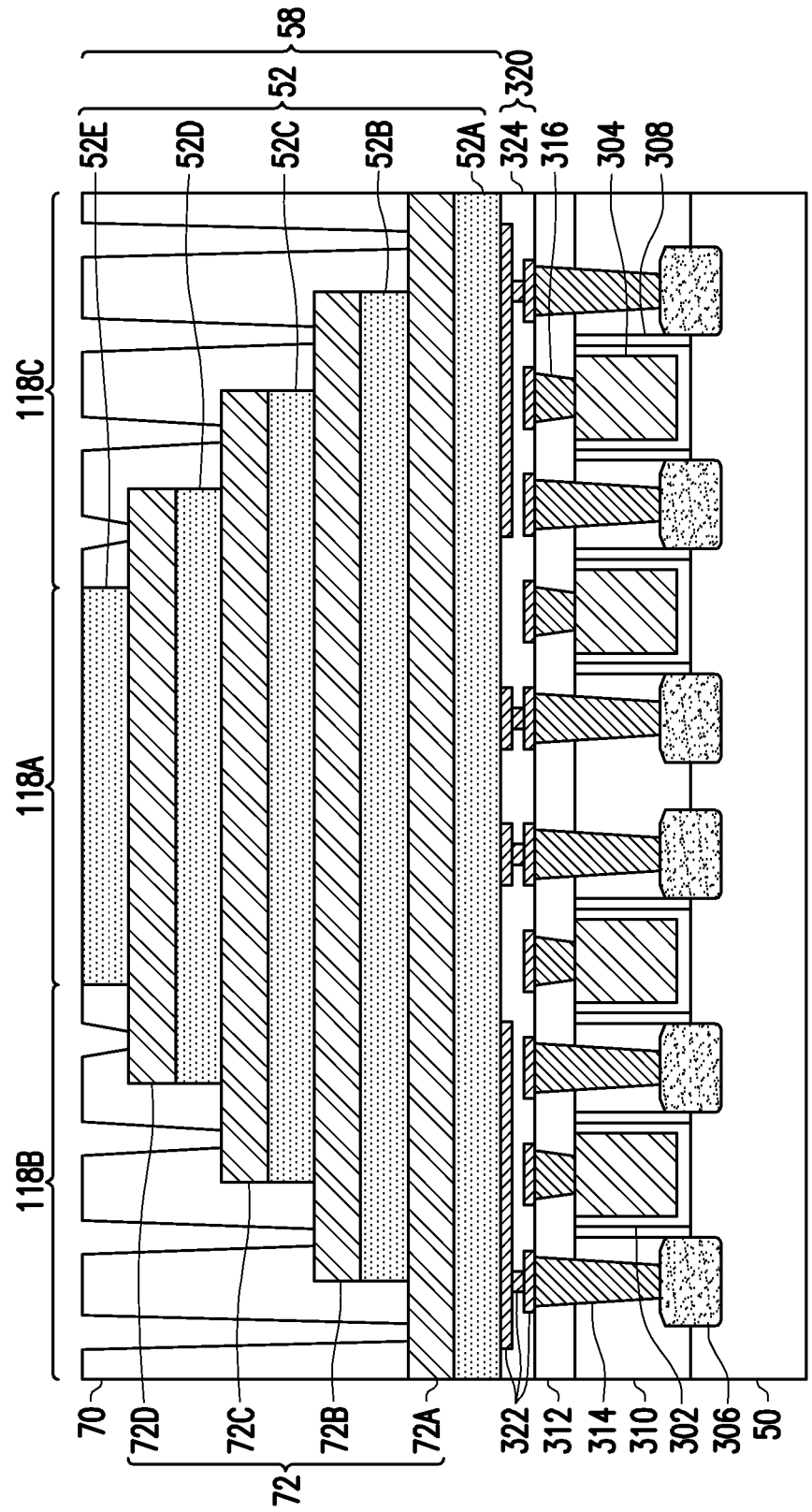
Figure 26C:
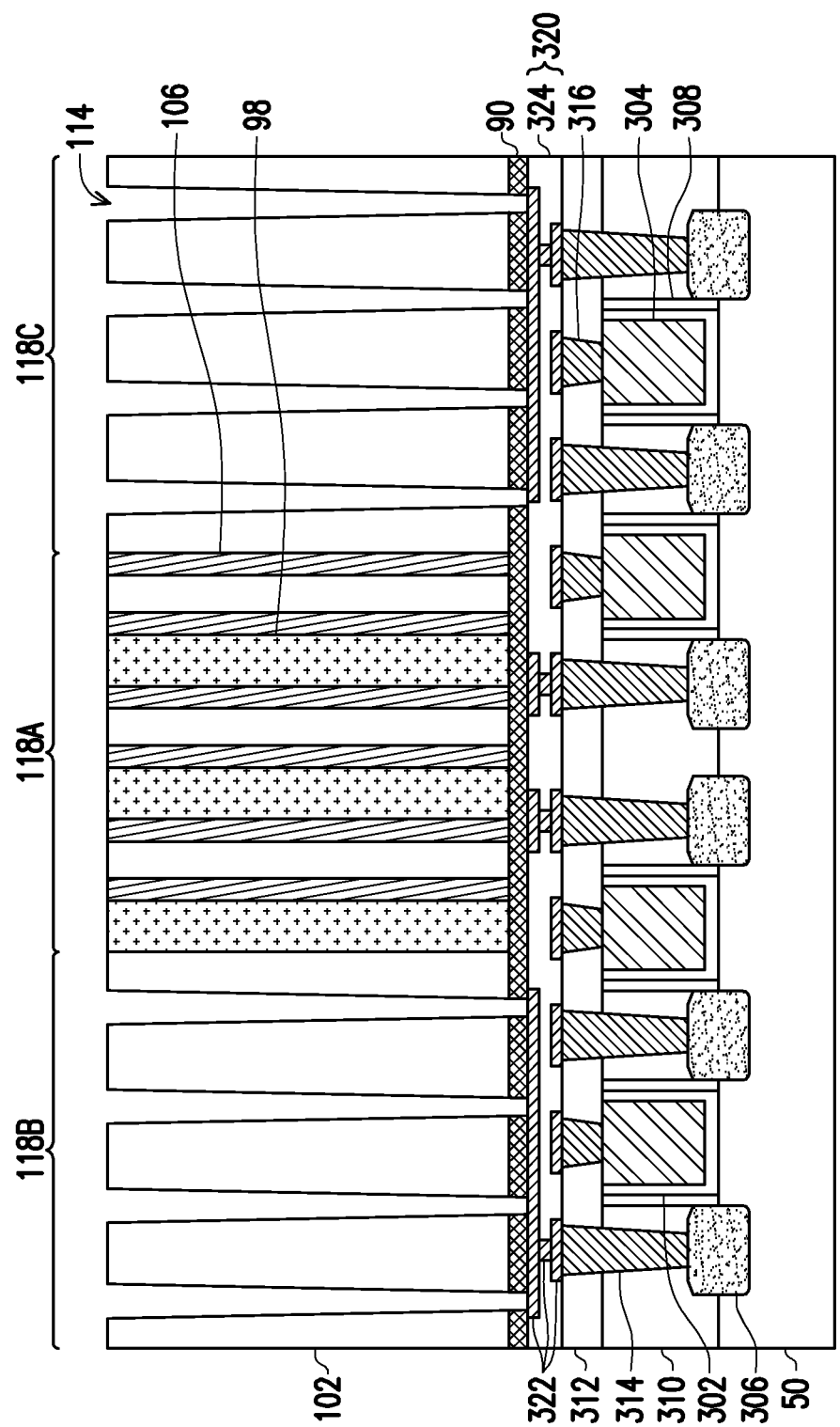
Figure 26D:
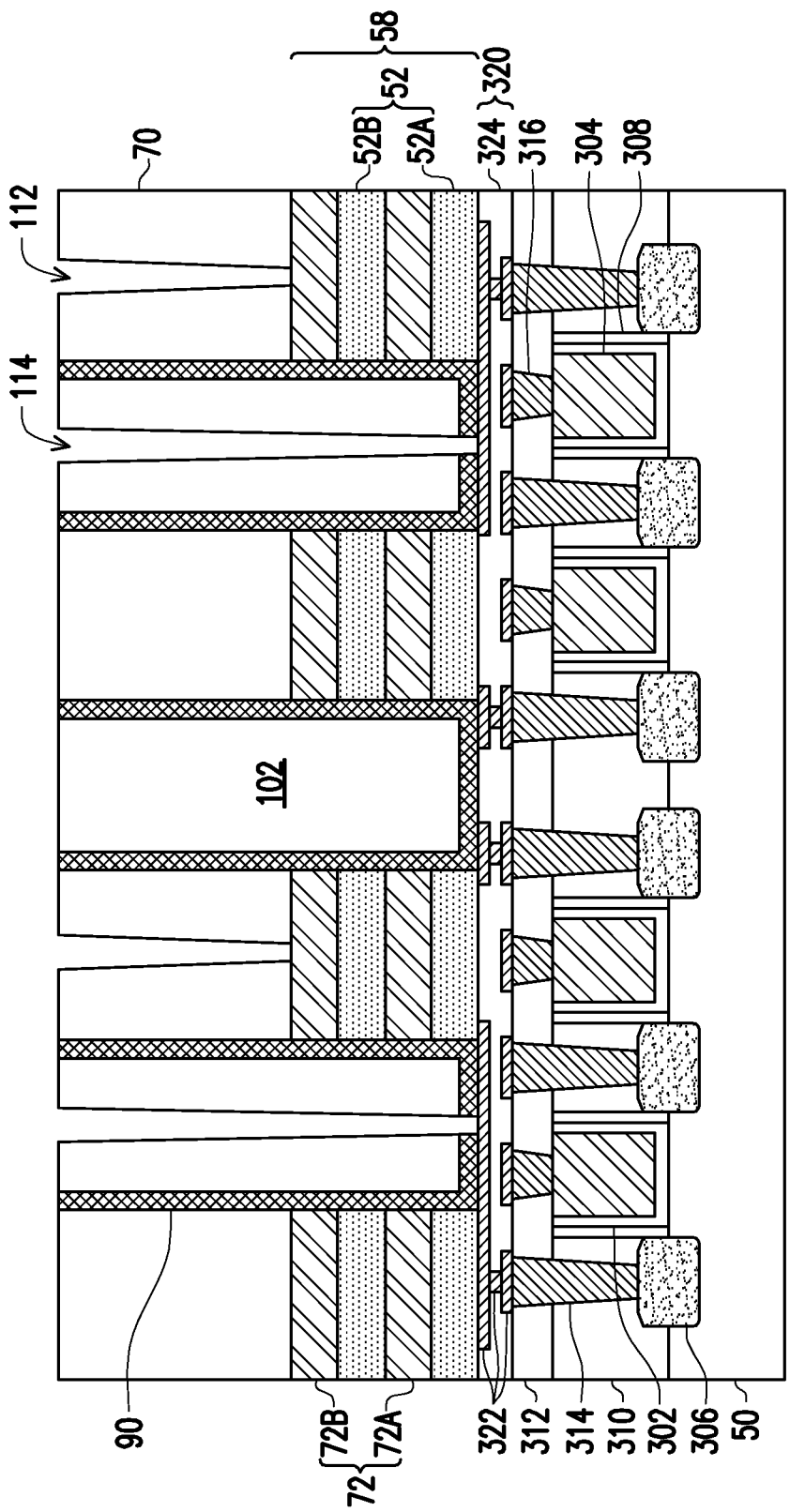

In FIGS. 26A through 26D, trenches 112 and trenches 114 are formed in the IMD 70, the dielectric materials 102, and the FE material 90. The trenches 112 and the trenches 114 may subsequently be used to form conductive contacts. More specifically, the trenches 112 may be subsequently used to form conductive contacts extending to the conductive lines 72 (e.g., word line contacts, gate contacts, or the like), and the trenches 114 may be subsequently used to form conductive contacts extending to the circuits formed over the substrate 50. As illustrated in FIG. 26B, the trenches 112 may extend through the IMD 70 and may expose top surfaces of the conductive lines 72. The staircase shape of the conductive lines 72 provides surfaces on each of the conductive lines 72 to which the trenches 112 may extend. As illustrated in FIG. 26C, the trenches 114 may extend through the dielectric materials 102 and the FE material 90. In embodiments in which bottom portions of the FE material 90 are removed, the trenches 114 may extend through the dielectric materials 102 only. The trenches 114 may expose top surfaces of the conductive features 322 of the interconnect structure 320. The trenches 112 and the trenches 114 may be formed using a combination of photolithography and etching. The etching may be any acceptable etch process, such as wet or dry etching, RIE, NBE, the like, or a combination thereof. The etching may be anisotropic. In some embodiments, the trenches 112 and the trenches 114 may be formed simultaneously; however, the trenches 112 and the trenches 114 may also be formed separately. As illustrated in FIGS. 26A and 26D, the trenches 112 and the trenches 114 may extend through adjacent portions of the IMD 70 and the dielectric materials 102 in a same cross-section, which cross-section is perpendicular to longitudinal axes of the conductive lines 72.

In FIGS. 27A through 27D, contacts 110 are formed in the trenches 112, contacts 111 are formed in the trenches 114, a dielectric layer 120 is formed over the contacts 110 and the contacts 111, and conductive lines 116 are formed in the dielectric layer 120 electrically coupling the contacts 110 to the contacts 111. The contacts 110 extend through the IMD 70 to the conductive lines 72 and may be electrically coupled to the conductive lines 72. In some embodiments, the contacts 110 may be referred to as word line contacts, gate contacts, or the like. The contacts 111 extend through the memory array 200, such as through the dielectric materials 102 and the FE material 90. In embodiments in which bottom portions of the FE material 90 are removed, the contacts 111 may extend through the dielectric materials 102 only. The contacts 111 may be electrically coupled to underlying conductive features, such as the conductive features 322 of the interconnect structure 320.

The dielectric layer 120 may be formed over the contacts 110, the contacts 111, the IMD 70, the dielectric materials 102, the dielectric materials 98, the dielectric layer 52E, the conductive lines 106, the conductive lines 108, the FE material 90, and the OS layer 92. The dielectric layer 120 is illustrated in FIGS. 27B through 27D, but is omitted from FIG. 27A in order to show connections between the conductive lines 116, the contacts 110, the contacts 111, and underlying structures. The conductive lines 116 may extend over and along surfaces of the IMD 70, the dielectric materials 102, and the FE material 90. The conductive lines 116 electrically couple the contacts 110 to the contacts 111. Although the dielectric layer 120 and the conductive lines 116 are illustrated as extending along surfaces of the IMD 70, the dielectric materials 102, and the FE material 90, the conductive lines 116 may be separated from the IMD 70, the dielectric materials 102, and the FE material 90, and one or more additional dielectric layers may be between the dielectric layer 120 and the conductive lines 116 and the IMD 70, the dielectric materials 102, and the FE material 90. The contacts 110 and the contacts 111 may further extend through the additional dielectric layers.

The staircase shape of the conductive lines 72 provides surfaces on each of the conductive lines 72 for the contacts 110 to land on. The contacts 110 may be formed by forming a liner (not separately illustrated), such as a diffusion barrier layer, an adhesion layer, or the like, and a conductive material in the trenches 112 and the trenches 114. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from surfaces of the IMD 70, the dielectric materials 102, and the FE material 90. The contacts 111 may be formed by similar or the same processes and materials as the contacts 110. In some embodiments, the contacts 110 in the trenches 112 and the contacts 111 in the trenches 114 may be formed simultaneously. In some embodiments, the contacts 110 in the trenches 112 may be formed before or after the contacts 111 formed in the trenches 114.

The dielectric layer 120 may comprise a dielectric material, such as a low-k dielectric material, an extra low-k (ELK) dielectric material, or the like. In some embodiments, the dielectric layer 120 may comprise insulating materials, such as silicon oxide, silicon nitride, silicon oxynitride, combinations thereof, or the like. The dielectric layer 120 may be deposited using an appropriate process, such as, CVD, ALD, PVD, PECVD, or the like.

In some embodiments, the conductive lines 116 may be formed using a damascene process in which the dielectric layer 120 is patterned utilizing a combination of photolithography and etching techniques to form trenches corresponding to the desired pattern of the conductive lines 116. An optional diffusion barrier and/or optional adhesion layer may be deposited and the trenches may then be filled with a conductive material. Suitable materials for the barrier layer include titanium, titanium nitride, titanium oxide, tantalum, tantalum nitride, tantalum oxide, combinations thereof, or the like, and suitable materials for the conductive material include copper, silver, gold, tungsten, aluminum, combinations thereof, or the like. In an embodiment, the conductive lines 116 may be formed by depositing a seed layer of copper or a copper alloy, and filling the trenches by electroplating. A chemical mechanical planarization (CMP) process or the like may be used to remove excess conductive material from a surface of the dielectric layer 120 and to planarize surfaces of the dielectric layer 120 and the conductive lines 116 for subsequent processing.

Figure 27A:
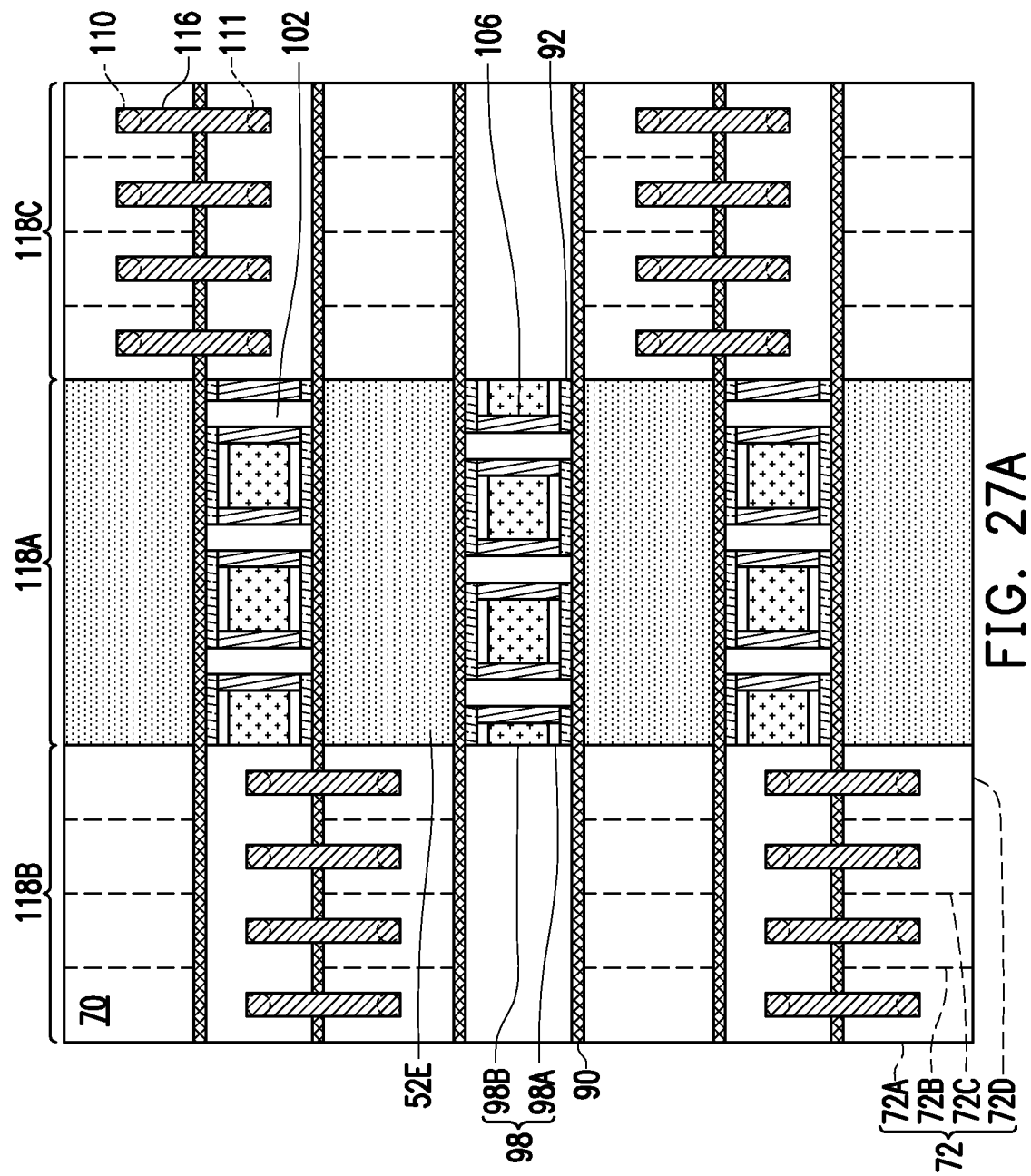
Figure 27B:
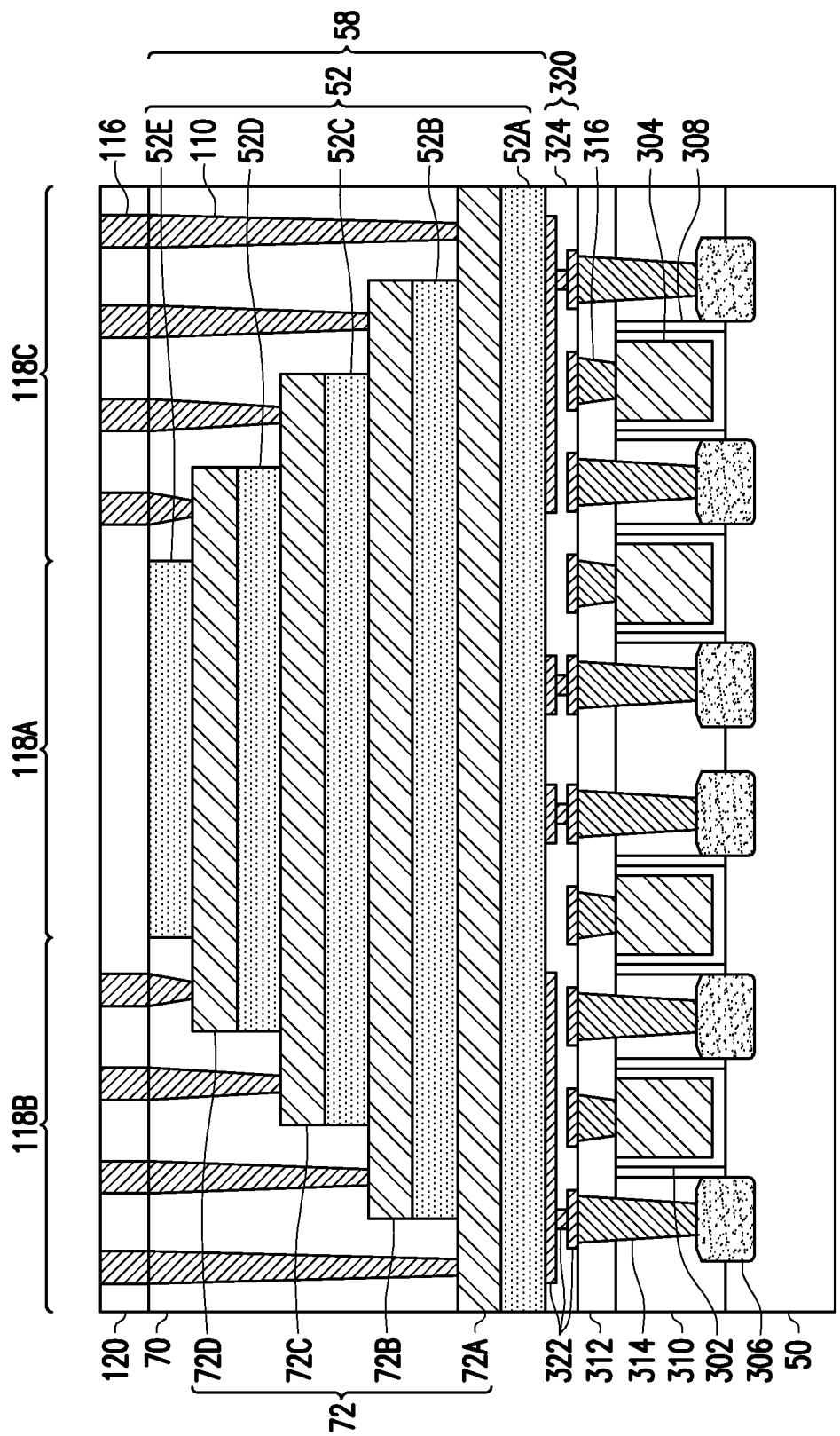
Figure 27C:
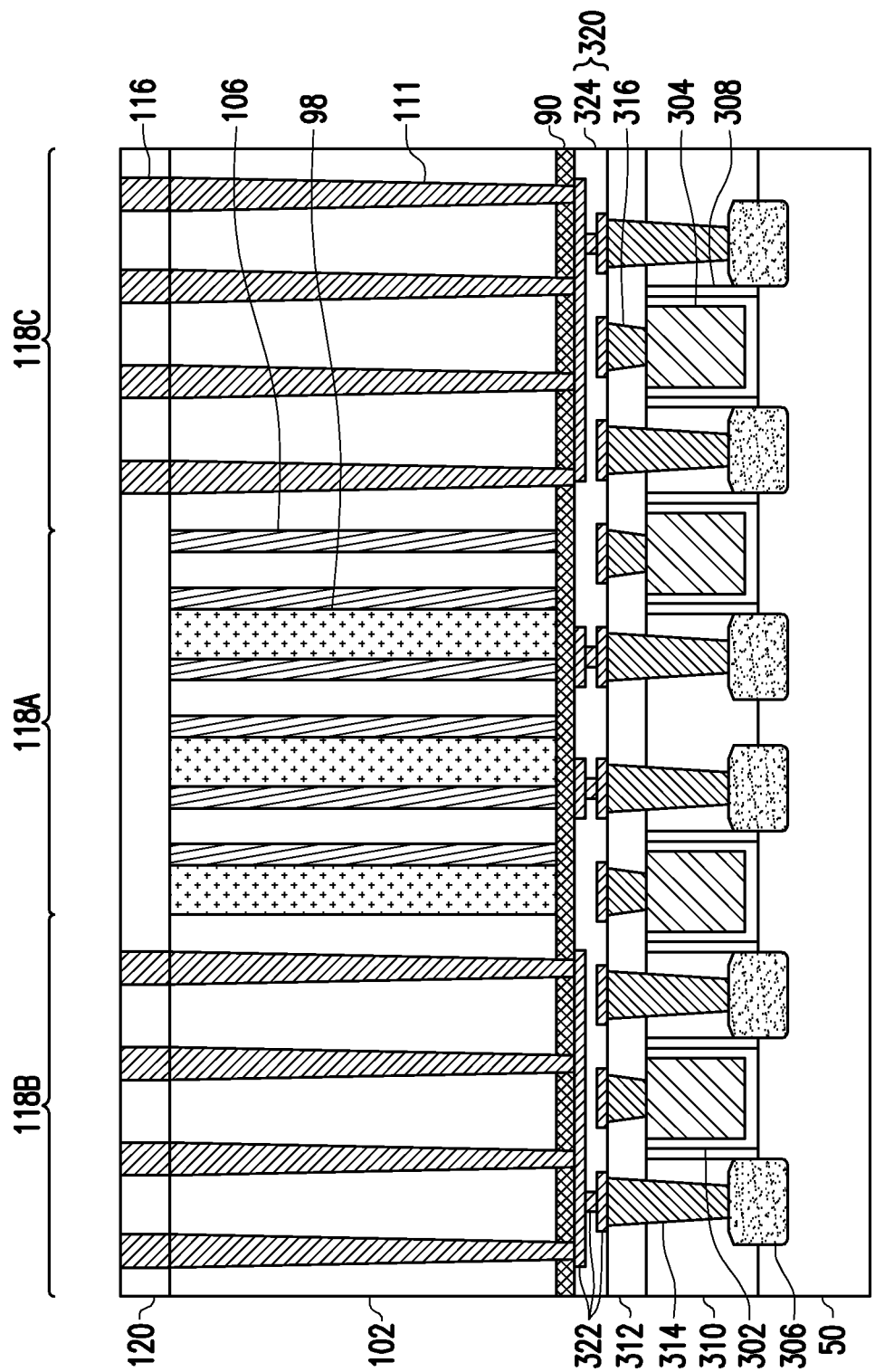
Figure 27D:
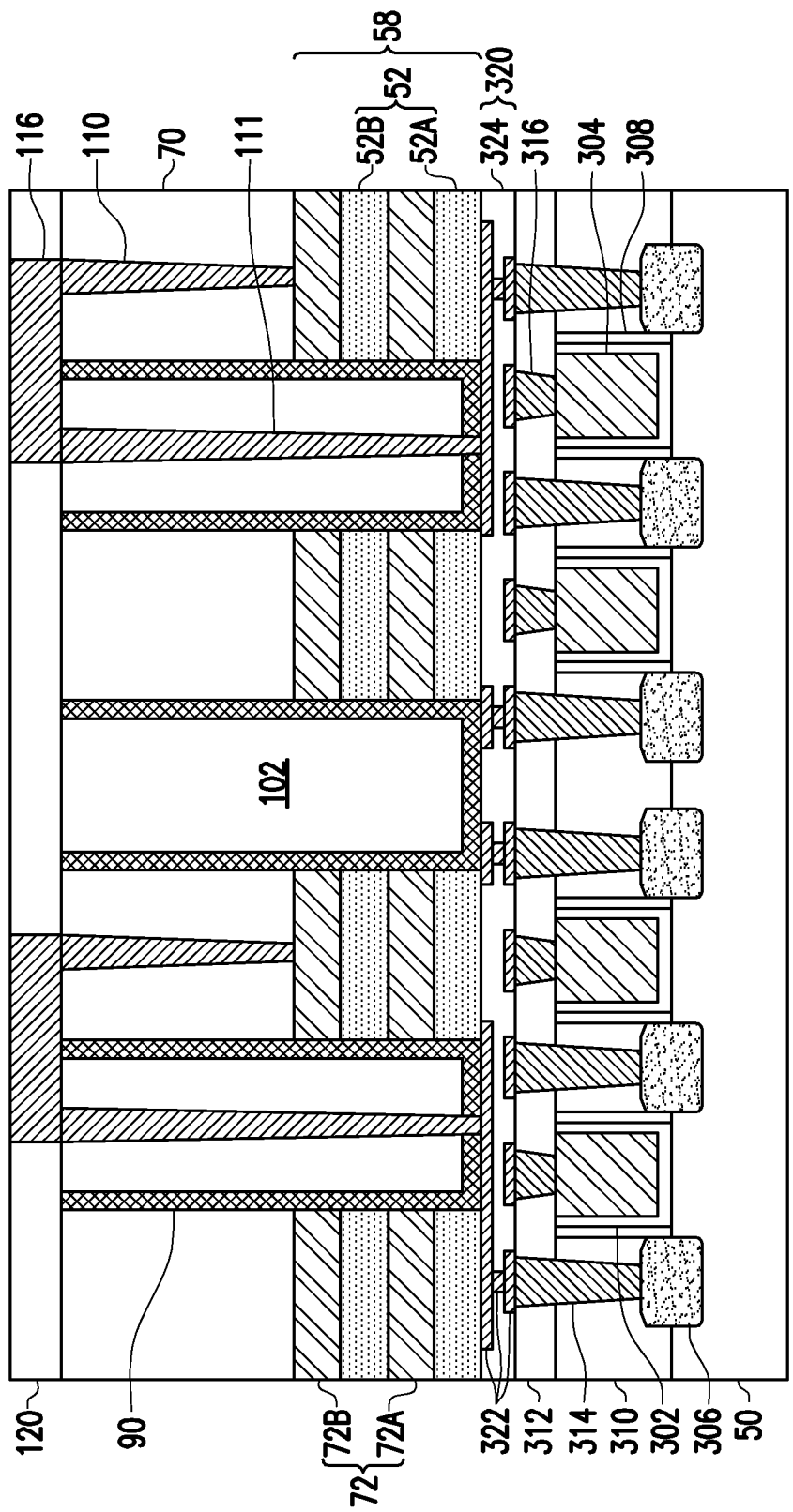

As illustrated in FIGS. 27A and 27D, the conductive lines 116 extend over the IMD 70 and the dielectric materials 102 in the first staircase region 118B and the second staircase region 118C in a direction perpendicular to longitudinal axes of the conductive lines 72. The conductive lines 116 may electrically couple the conductive lines 72 to the interconnect structure 320 through the contacts 111 in the dielectric materials 102 adjacent the conductive lines 72. As illustrated in FIG. 27A, connections to parallel conductive lines 72 may be routed through the dielectric materials 102 formed in the same trenches 100 (see FIGS. 22A through 22C), with connections to one set of the conductive lines 72 being routed in the first staircase region 118B and connections to a parallel set of the conductive lines 72 being routed in the second staircase region 118C. Connections to each set of stacked conductive lines 72 may be staggered in the first staircase region 118B and the second staircase region 118C, which may improve isolation between the connections. For example, the contacts 111 which are electrically coupled to a stack of the conductive lines 72 may be routed through the dielectric materials 102 in the first staircase region 118B and the contacts 111 which are electrically coupled to an adjacent stack of the conductive lines 72 may be routed through the dielectric materials 102 in the second staircase region 118C.

Routing connections between the conductive lines 72 and the underlying interconnect structure 320 by providing the conductive lines 116 disposed within the first staircase region 118B and the second staircase region 118C requires less area than conventional designs, which allows for greater device densities to be achieved. The connections may also be shorter than conventional designs, which reduces resistance and improves device performance. Moreover, because the trenches 112 and the trenches 114 may be formed simultaneously, and the contacts 110 and the contacts 111 may also be formed simultaneously, less lithography steps and deposition steps may be used, which reduces costs and production time.

Figure 28B:
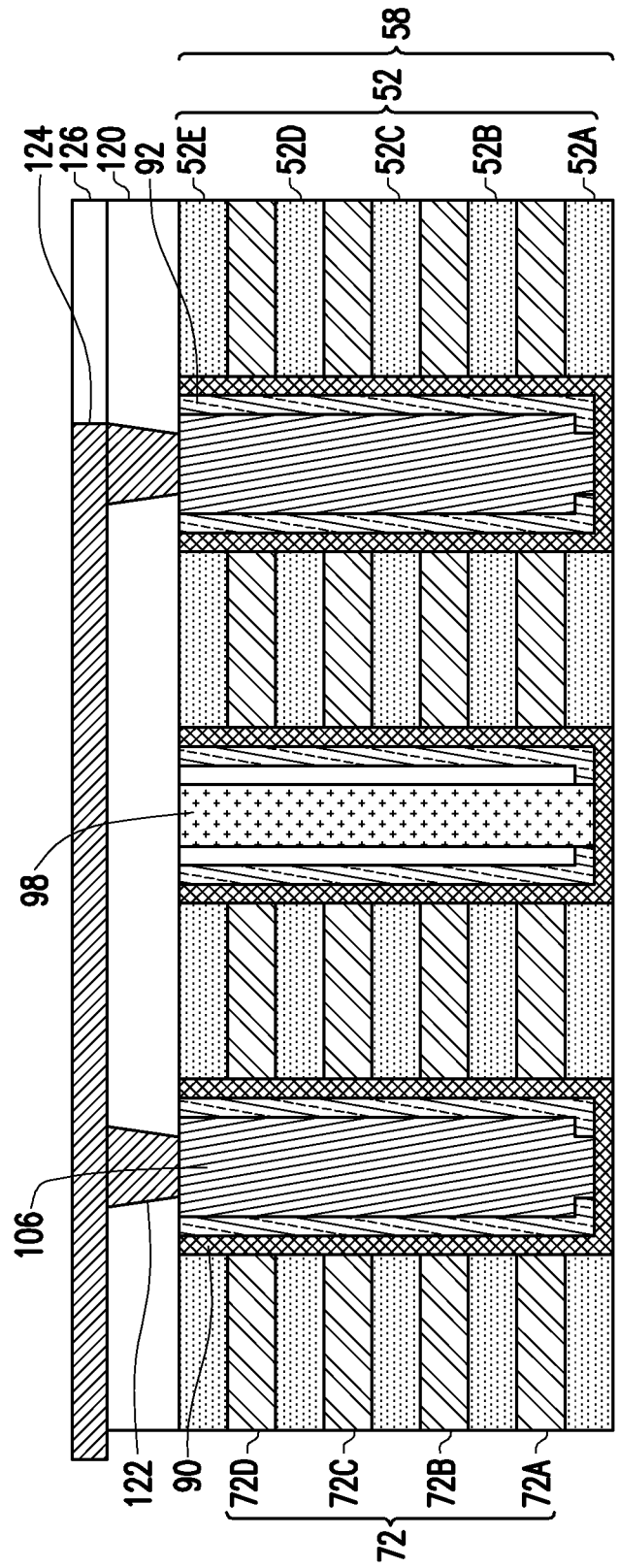

In FIGS. 28A and 28B, contacts 122 are formed in the dielectric layer 120, a dielectric layer 126 is formed over the contacts 122 and the dielectric layer 120, and conductive lines 124 are formed in the dielectric layer 126. The contacts 122 may be formed extending to and electrically coupled to the conductive lines 106 and the conductive lines 108 (not separately illustrated, but which may be similar to the conductive lines 106). In some embodiments, the contacts 122 may be referred to as source line contacts, bit line contacts, or the like. The contacts 122 may extend through the dielectric layer 120. In some embodiments, the contacts 122 may further extend through one or more additional dielectric layers formed over the dielectric layer 120. The contacts 122 may be formed using processes and materials the same as or similar to those used to form the contacts 110 and the contacts 111.

Further in FIGS. 28A and 28B, a dielectric layer 126 is formed over the dielectric layer 120 and the contacts 122 and conductive lines 124 are formed over the and electrically coupled to the contacts 122. The dielectric layer 120 and the dielectric layer 126 are illustrated in FIG. 28B, but are omitted from FIG. 28A in order to show connections between the conductive lines 124, the contacts 122, and underlying structures. The contacts 122 may be formed using processes and materials the same as or similar to those used to form the dielectric layer 120. The conductive lines 124 may be formed using processes and materials the same as or similar to those used to form the conductive lines 116. The conductive lines 124 may extend in a direction parallel to a direction in which the conductive lines 116 extend. The conductive lines 124 may be used to electrically couple the conductive lines 106 and the conductive lines 108 to the interconnect structure 320. As illustrated in FIG. 28B, the conductive lines 124 may extend along top surfaces of the dielectric layer 120.

Figure 29:
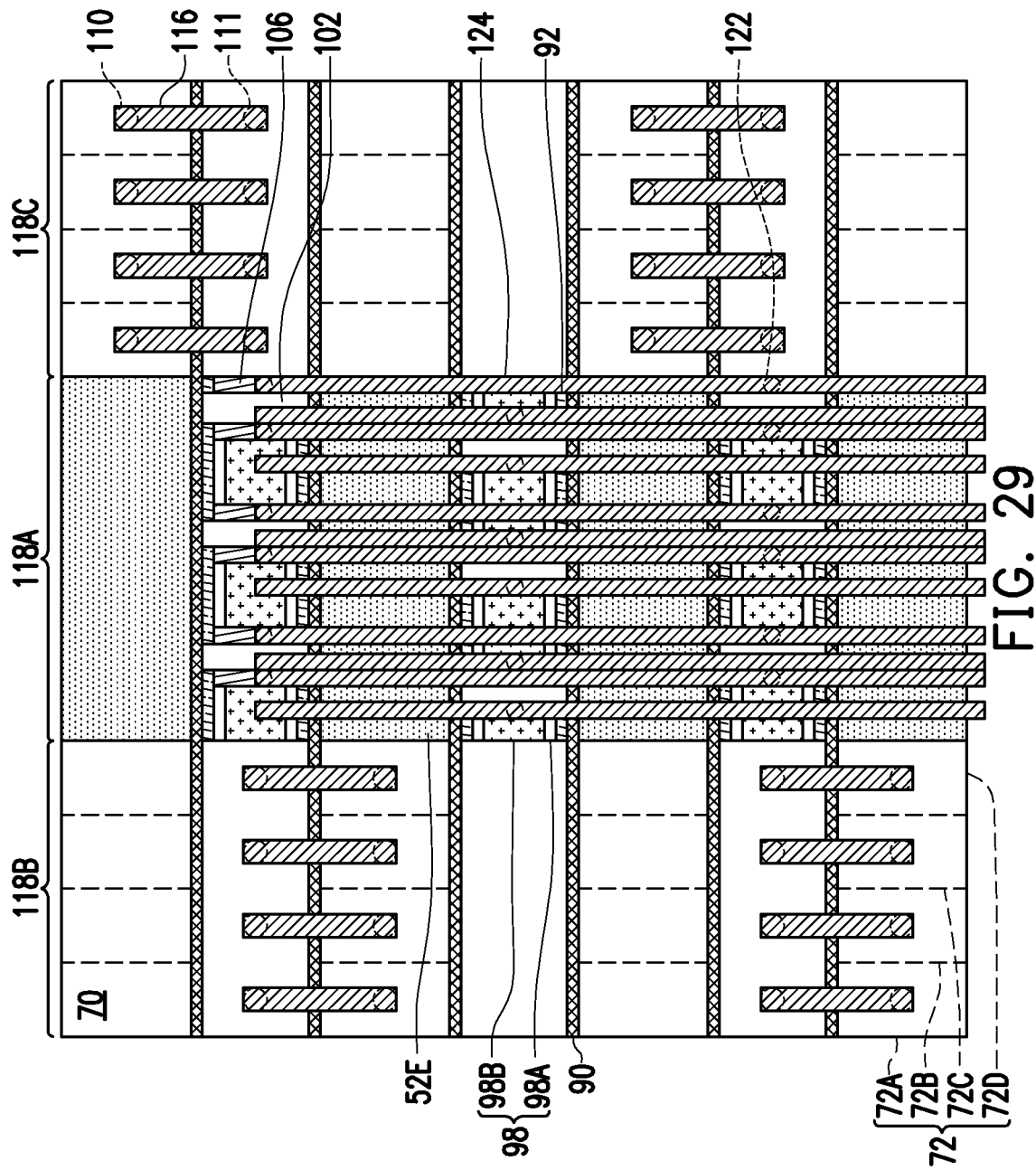

FIG. 29 illustrates an embodiment in which contacts 110 extend to each of the conductive lines 72 in both the first staircase region 118B and the second staircase region 118C. The embodiment illustrated in FIG. 29 provides double the number of drivers to the conductive lines 72 and provides drivers for each of the conductive lines 72 in both the first staircase region 118B and the second staircase region 118C. The conductive lines 116 may extend from the contacts 110 to the contacts 111 in a first direction in the first staircase region 118B, while the conductive lines 116 extend from the contacts 110 to the contacts 111 in a second direction opposite the first direction in the second staircase region 118C. The double-sided word line driving reduces word line resistance loading, which improves device performance. Moreover, routing connections between the conductive lines 72 and the underlying interconnect structure 320 by providing the conductive lines 116 disposed within the first staircase region 118B and the second staircase region 118C requires less area than conventional designs, which allows for greater device densities to be achieved. The connections may also be shorter than conventional designs, which reduces resistance and improves device performance. The trenches 112 and the trenches 114 may be formed simultaneously and the contacts 110 and the contacts 111 may be formed simultaneously such that less lithography steps and less deposition steps may be used, which reduces costs and production time.

Figure 30:
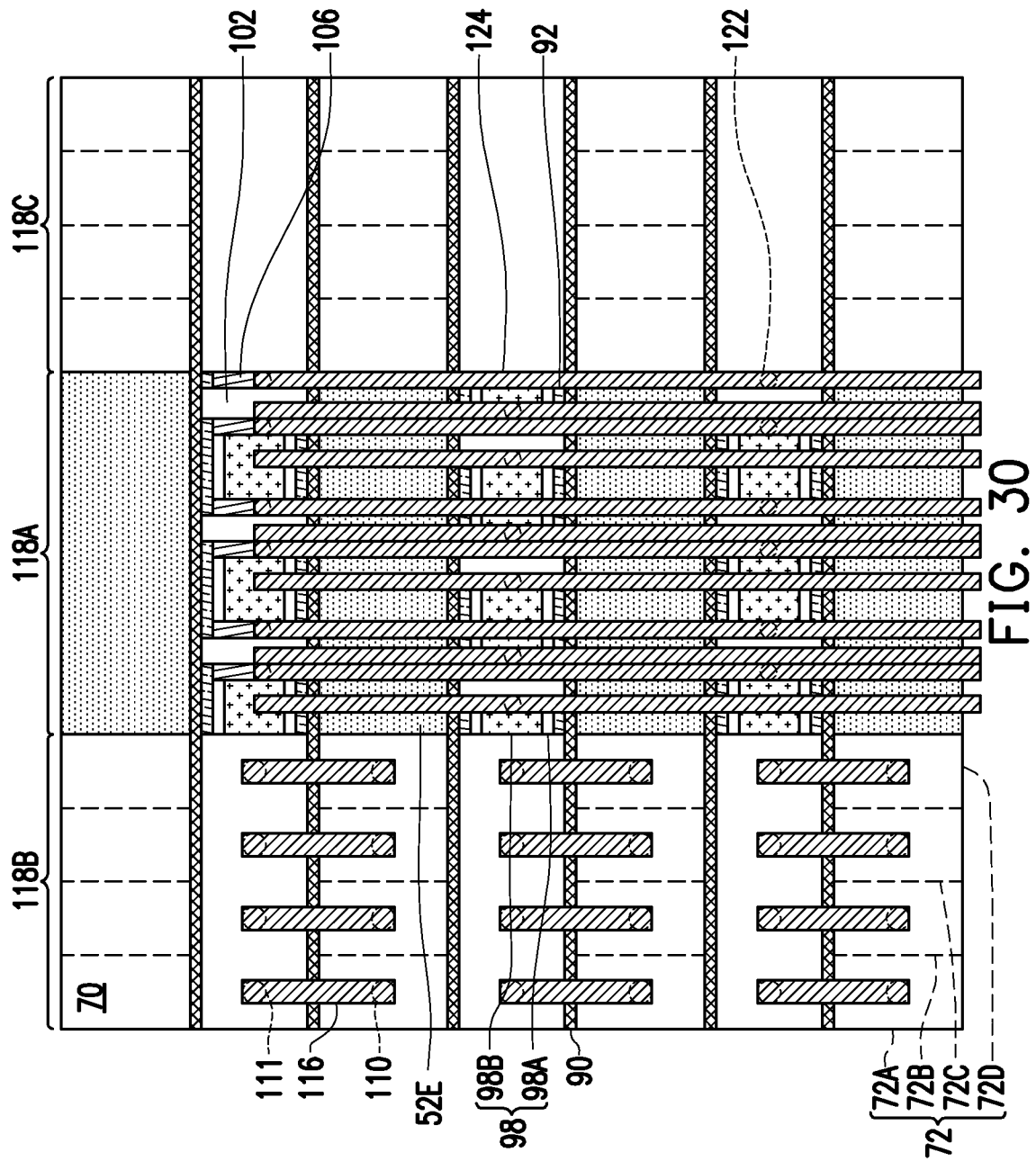

FIG. 30 illustrates an embodiment in which contacts 110 extend to each of the conductive lines 72 in the first staircase region 118B only. This embodiment allows for the second staircase region 118C to be used for other connections to the conductive lines 72 and the like, while providing connections to each of the conductive lines 72 in the first staircase region 118B. Moreover, routing connections between the conductive lines 72 and the underlying interconnect structure 320 by providing the conductive lines 116 disposed within the first staircase region 118B requires less area than conventional designs, which allows for greater device densities to be achieved. The connections may also be shorter than conventional designs, which reduces resistance and improves device performance. The trenches 112 and the trenches 114 may be formed simultaneously and the contacts 110 and the contacts 111 may be formed simultaneously such that less lithography steps and less deposition steps may be used, which reduces costs and production time.

Figure 31B:
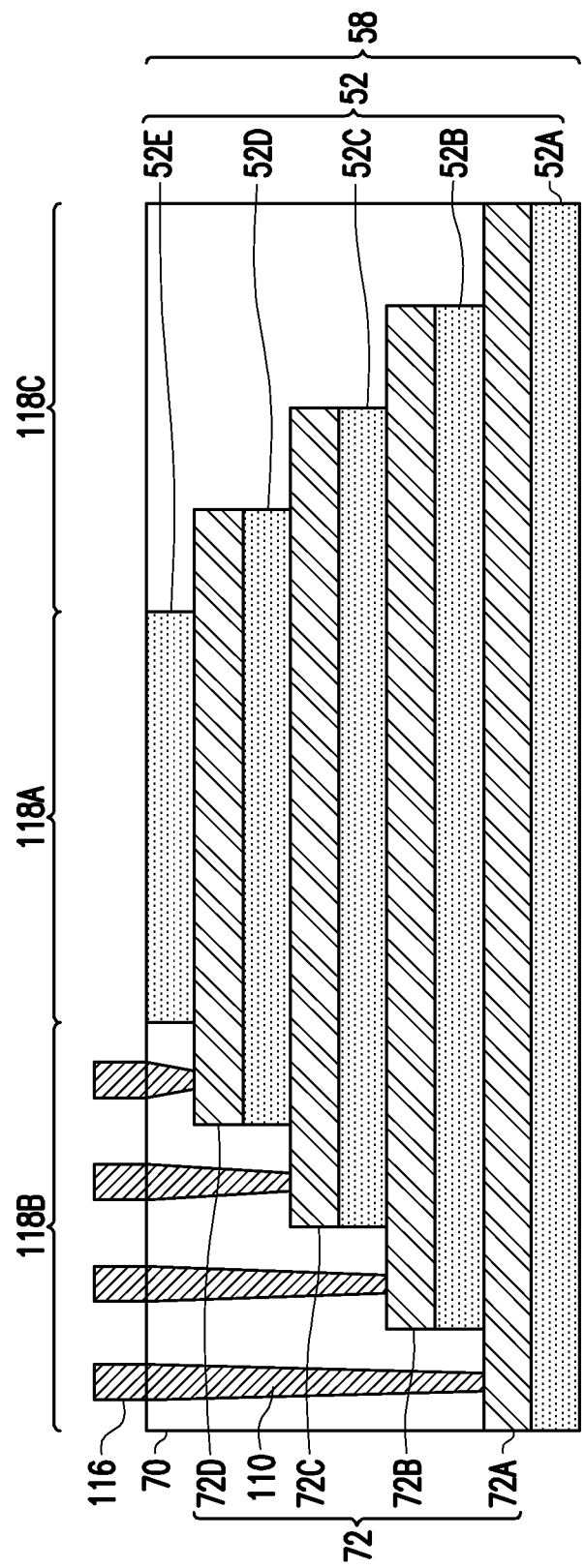
Figure 32A:
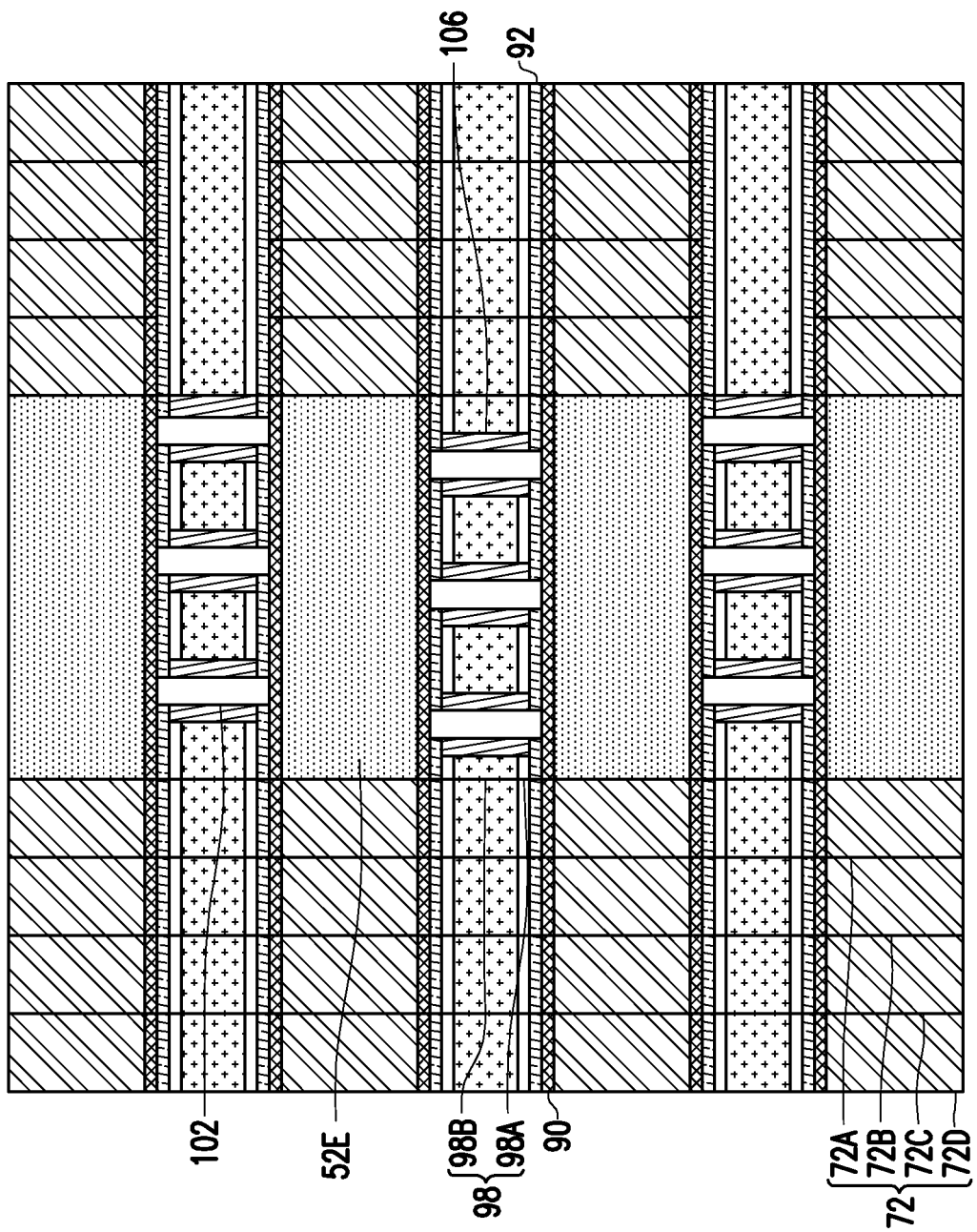
Figure 32B:
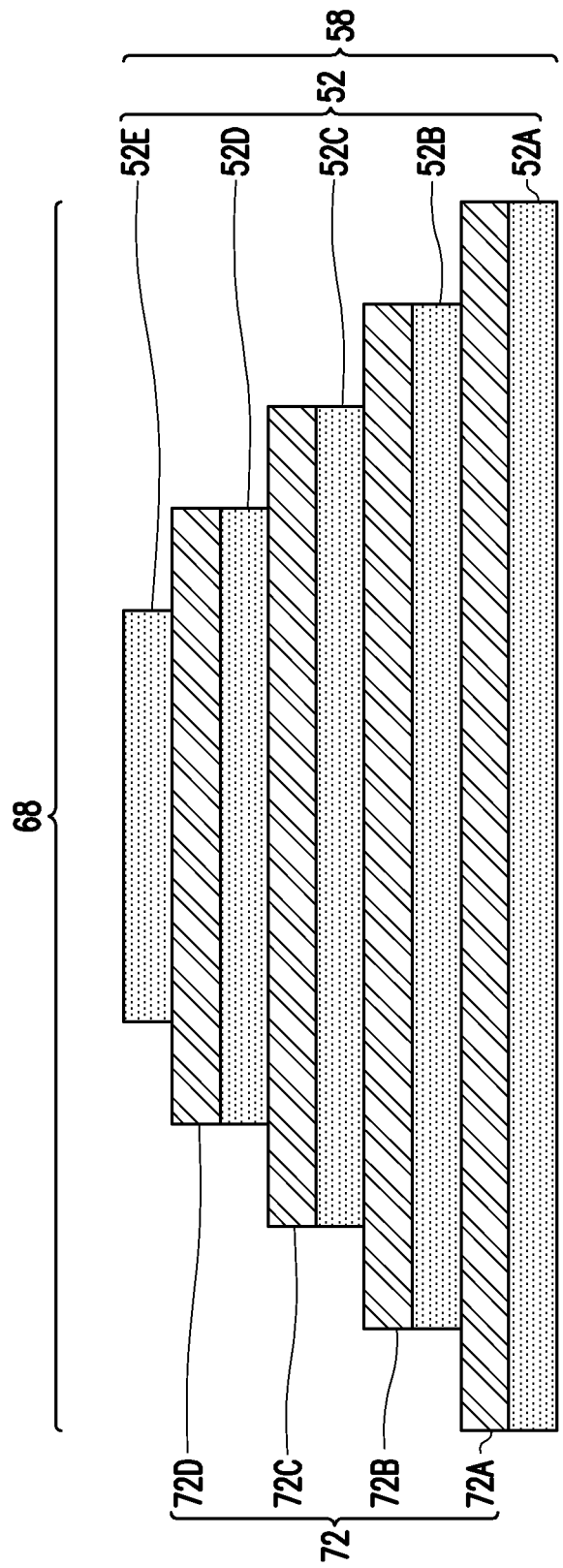
Figure 32C:
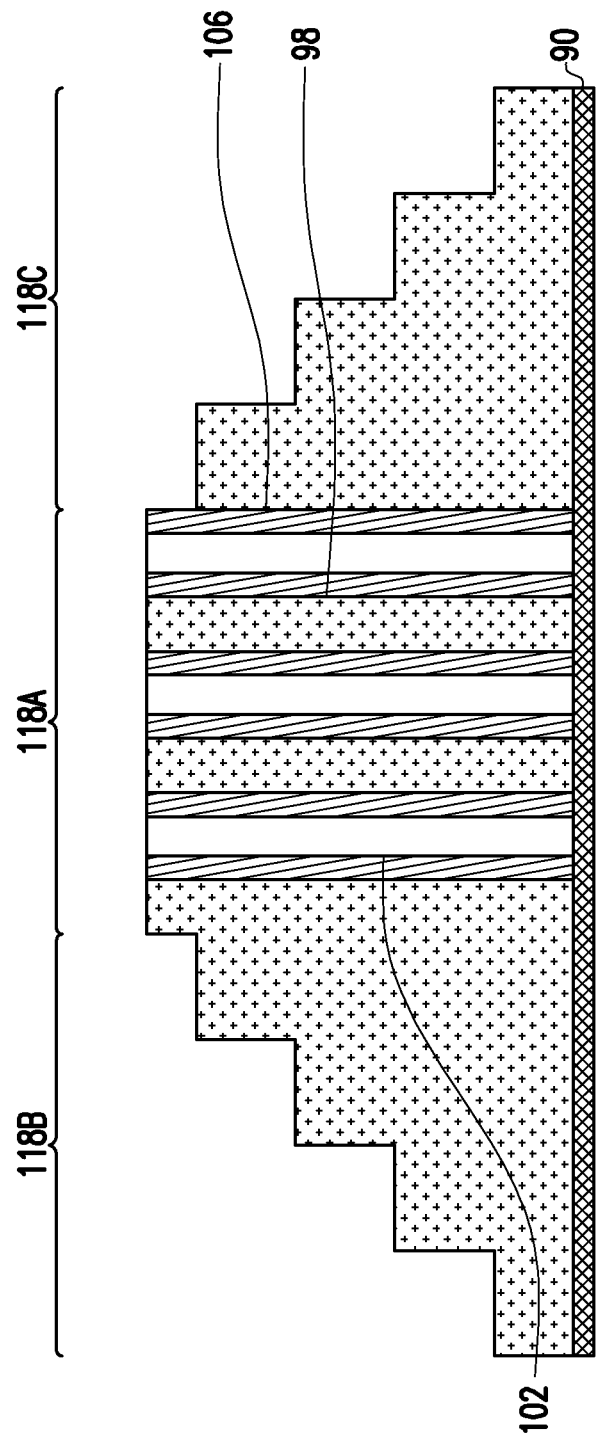
Figure 32D:
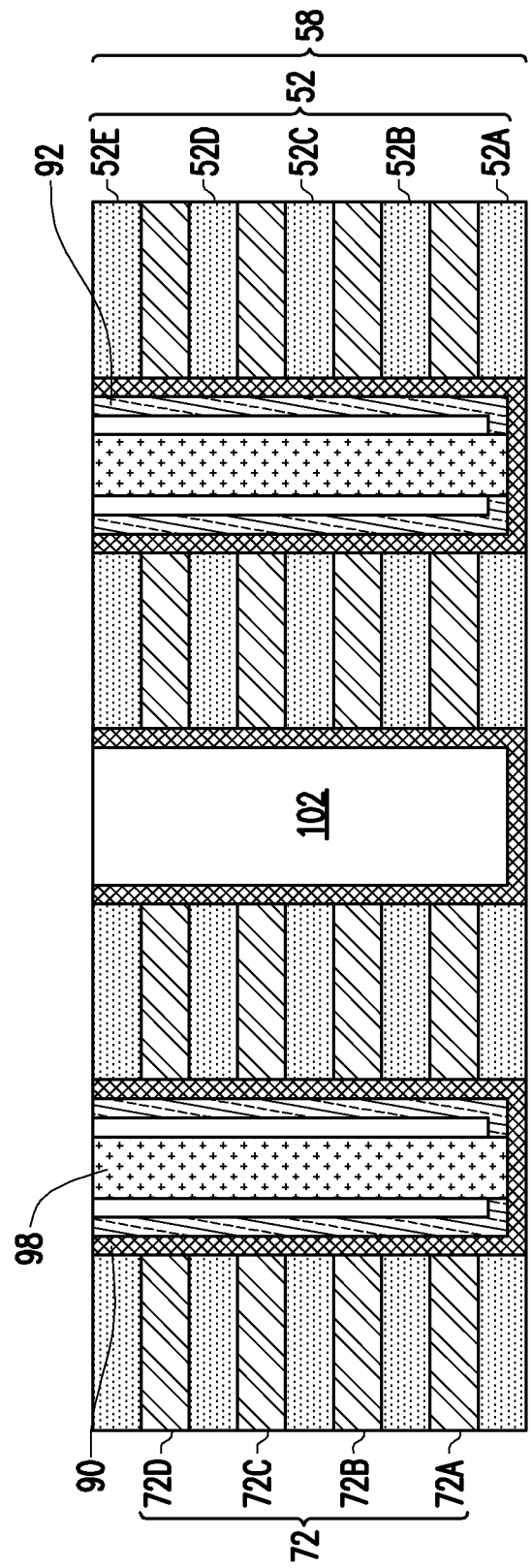
Figure 32E:
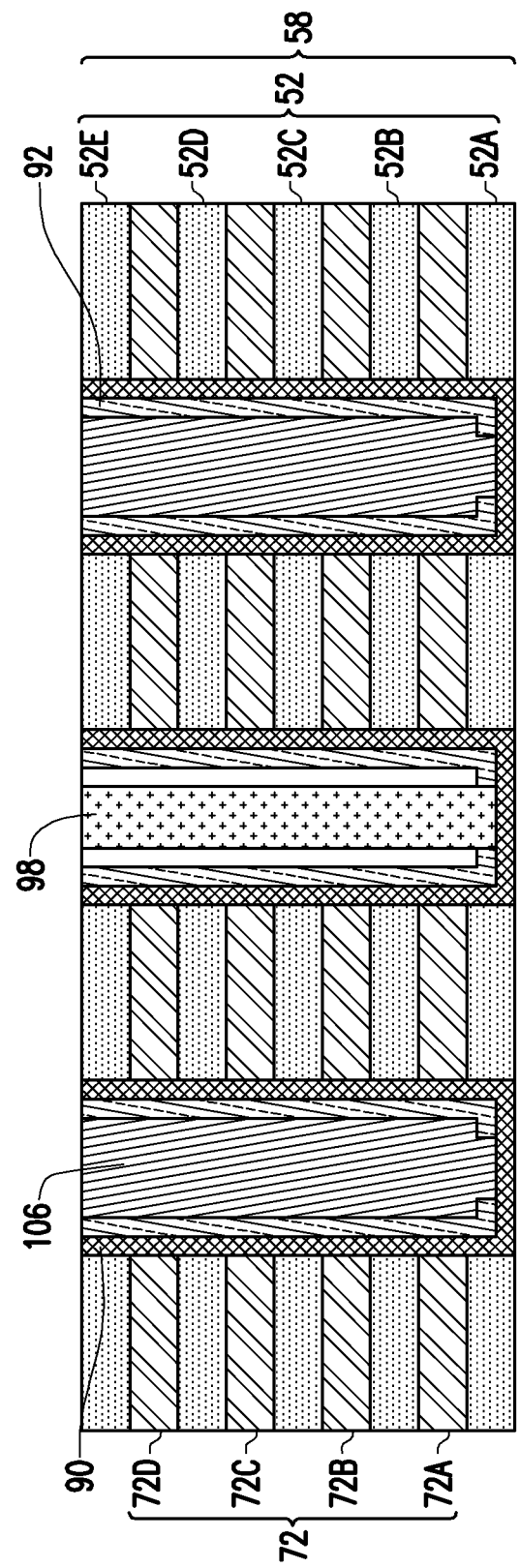
Figure 32F:
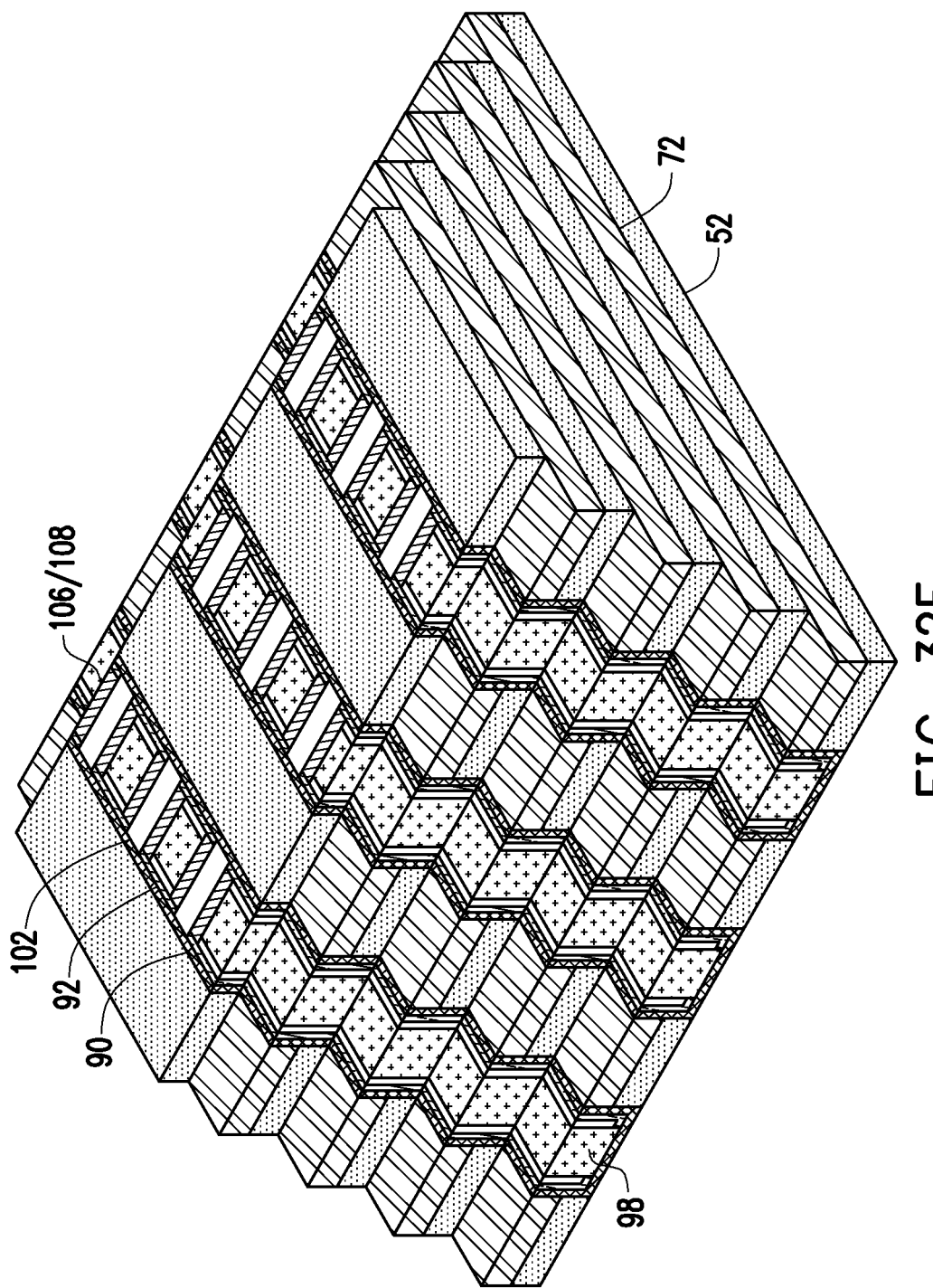

FIGS. 31A and 31B illustrate an embodiment in which contacts 110 extend to each of the conductive lines 72 in the first staircase region 118B only and the first staircase region 118B and the second staircase region 118C are asymmetrical. This embodiment allows for the second staircase region 118C to be used for other connections to the conductive lines 72 and the like, while providing connections to each of the conductive lines 72 in the first staircase region 118B. In the embodiment illustrated in FIGS. 31A and 31B, portions of the dielectric layers 52D and 52C and the conductive lines 72C and 72D in the second staircase region 118C may have the same lengths; portions of the dielectric layer 52B and the conductive lines 72B in the second staircase region 118C may have lengths greater than the portions of the dielectric layers 52D and 52C and the conductive lines 72C and 72D in the second staircase region 118C; and portions of the dielectric layer 52A and the conductive lines 72A in the second staircase region 118C may have lengths greater than the portions of the dielectric layer 52B and the conductive lines 72B in the second staircase region 118C.

Portions of the dielectric layers 52 and the conductive lines 72 in the second staircase region 118C may have lengths different from portions of the dielectric layers 52 and the conductive lines 72 in the first staircase region 118B, which may be used to provide area savings and increase device density. In some embodiments, providing different lengths for the portions of the dielectric layers 52 and the conductive lines 72 in the second staircase region 118C and the first staircase region 118B provides greater flexibility for the connections made in the second staircase region 118C. Moreover, routing connections between the conductive lines 72 and the underlying interconnect structure 320 by providing the conductive lines 116 disposed within the first staircase region 118B requires less area than conventional designs, which allows for greater device densities to be achieved. The connections may also be shorter than conventional designs, which reduces resistance and improves device performance. The trenches 112 and the trenches 114 may be formed simultaneously and the contacts 110 and the contacts 111 may be formed simultaneously such that less lithography steps and less deposition steps may be used, which reduces costs and production time.

FIGS. 32A through 36 illustrate embodiments in which the IMD 70 is formed after the staircase structure 68, the dielectric materials 98, the dielectric materials 102, the conductive lines 106, the conductive lines 108, the FE material 90, and the OS layer 92 are formed and the conductive lines 72, the dielectric layers 52, the FE material 90, the OS layer 92, and the dielectric materials 98 are patterned in the staircase structure 68. Specifically, the multi-layer stack 58 may be formed. The FE material 90, the OS layer 92, and the dielectric materials 98 may be formed in the multi-layer stack 58 using processes the same as or similar to those described above with respect to FIGS. 15A through 21C. Portions of the dielectric materials 98 and the OS layer 92 may be replaced with the dielectric materials 102 using processes the same as or similar to those described above with respect to FIGS. 22A through 23C. Portions of the dielectric materials 98 may be replaced with the conductive lines 106 and the conductive lines 108 using processes the same as or similar to those described above with respect to FIGS. 24A through 25D.

The multi-layer stack 58, the dielectric materials 98, the FE material 90, and the OS layer 92 may then be patterned to form the staircase structure 68 using processes the same as or similar to those described above with respect to FIGS. 4 through 12. The processes used to etch the staircase structure 68 in the dielectric materials 98, the FE material 90, and the OS layer 92 along with the multi-layer stack 58 may use multiple etchants and additional etching processes as compared to the embodiments described with respect to FIGS. 4 through 12. The dielectric materials 98, the FE material 90, and the OS layer 92 may be patterned using timed etching processes. FIGS. 32A through 32F illustrate the structure prior to the IMD 70 being formed. As illustrated in FIGS. 32A through 32C, the dielectric materials 102 may have the same staircase structure as the conductive lines 72 and the dielectric layers 52.

In FIGS. 33A through 33D, an IMD 70 is formed over the structures illustrated in FIGS. 32A through 32F. The IMD 70 may be formed of a dielectric material, and may be deposited by any suitable method, such as CVD, PECVD, FCVD, or the like. The dielectric materials may include phospho-silicate glass (PSG), boro-silicate glass (BSG), boron-doped phospho-silicate glass (BPSG), undoped silicate glass (USG), or the like. In some embodiments, the IMD 70 may comprise an oxide (e.g., silicon oxide or the like), a nitride (e.g., silicon nitride or the like), a combination thereof or the like. Other dielectric materials formed by any acceptable process may be used. Further in FIGS. 33A through 33D, a removal process is applied to the IMD 70 to remove excess dielectric material over the multi-layer stack 58. In some embodiments, the removal process may be a planarization process, such as a CMP, an etch-back process, combinations thereof, or the like. The planarization process exposes the multi-layer stack 58 such that top surfaces of the multi-layer stack 58 and IMD 70 are level after the planarization process is complete. Following the planarization process, the IMD 70 extends along sidewalls of the conductive lines 72B-72D, sidewalls of the dielectric layers 52B-52E, sidewalls of the dielectric materials 102, sidewalls of the dielectric materials 98, sidewalls of the conductive lines 106, and sidewalls of the conductive lines 108. Further, the IMD 70 may contact top surfaces of the conductive lines 72A-72D and top surfaces of the dielectric materials 102.

Figure 33A:
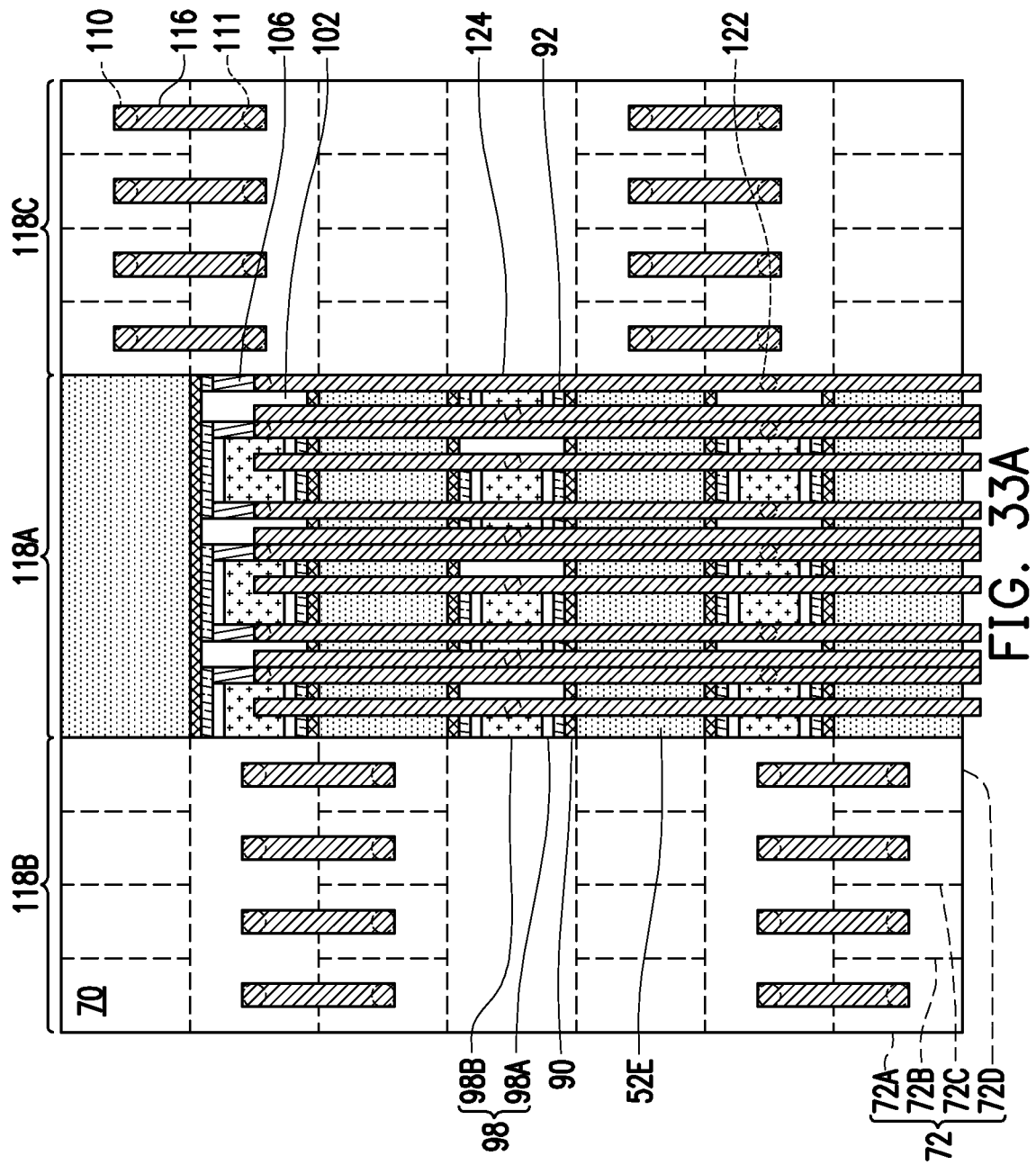
Figure 33B:
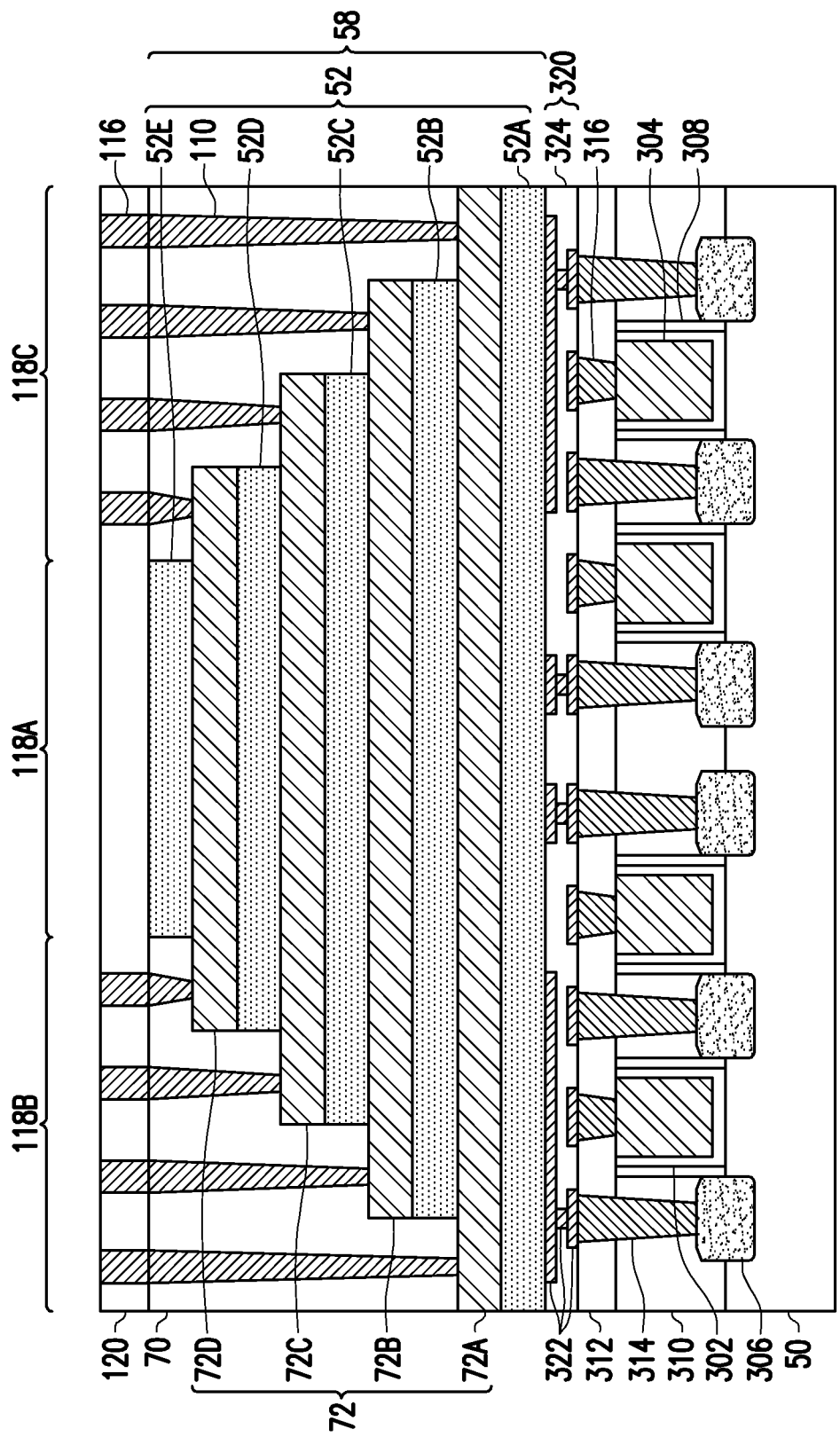
Figure 33C:
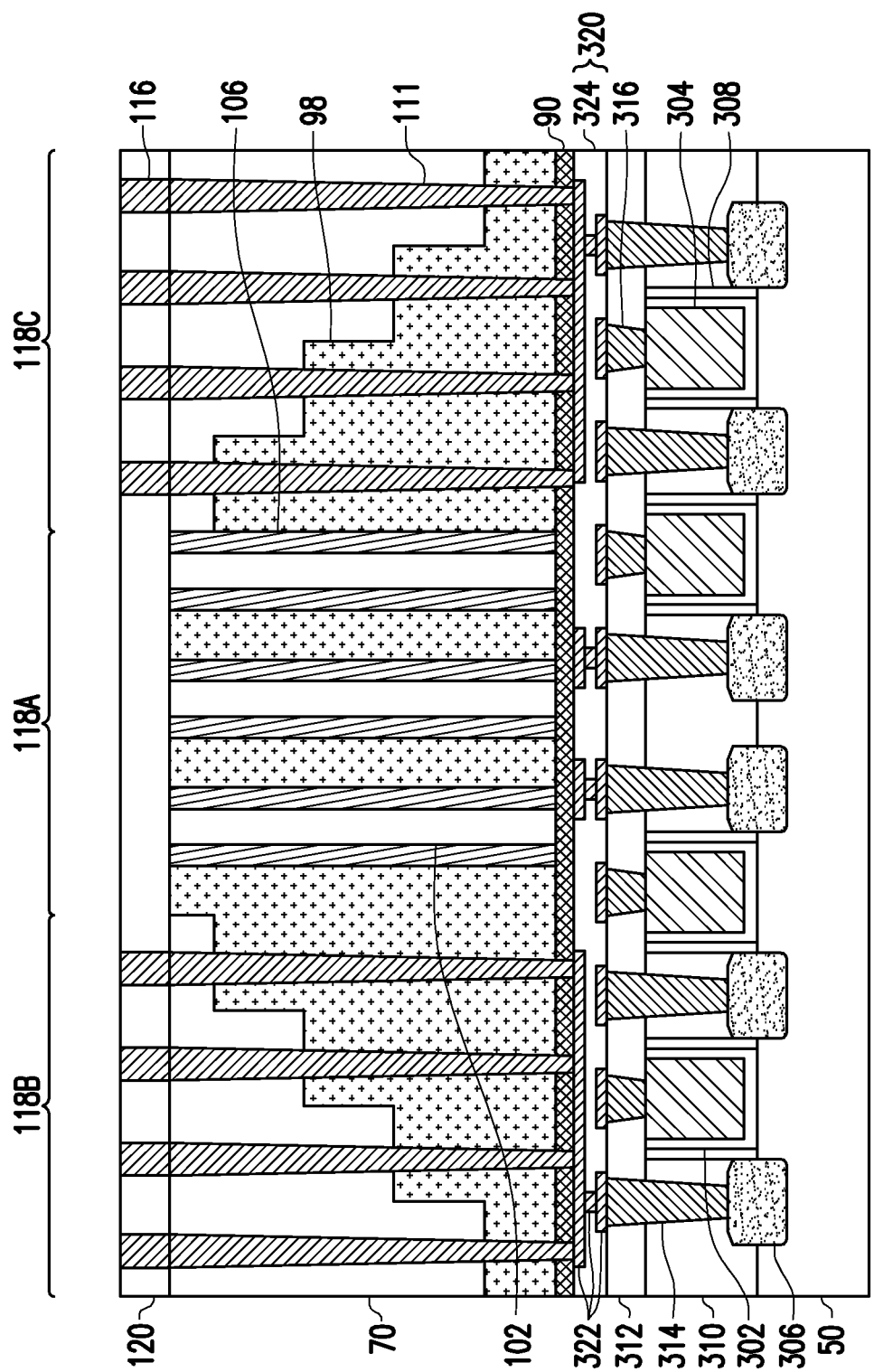
Figure 33D:
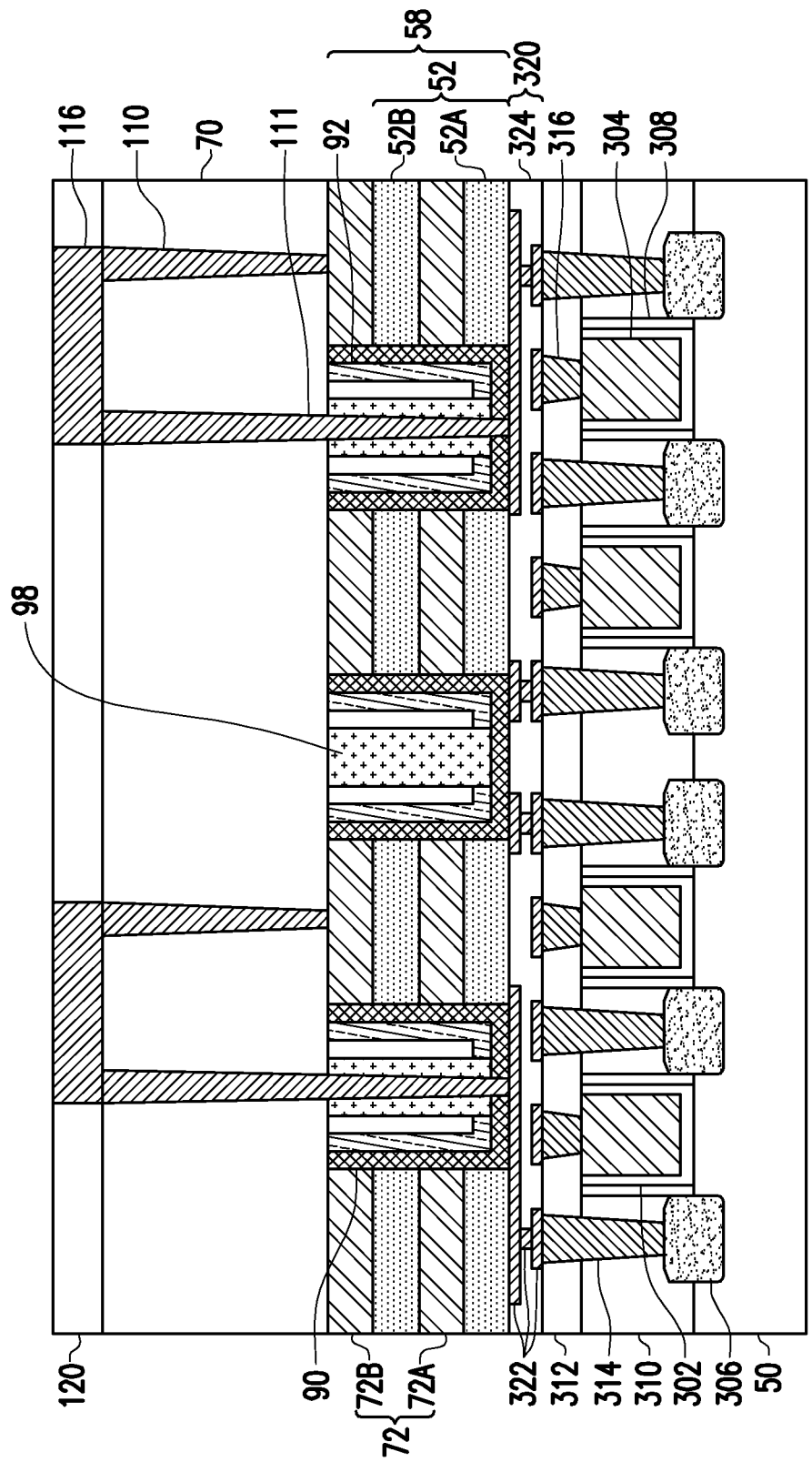

Further in FIGS. 33A through 33D, contacts 110, contacts 111, contacts 122, conductive lines 116, and conductive lines 124 are formed. The contacts 110, the contacts 111, the contacts 122, the conductive lines 116, and the conductive lines 124 may be formed of materials and by processes similar to or the same as those described above with respect to FIGS. 27A through 28B. As illustrated in FIG. 33B, the contacts 110 may extend through the IMD 70 to contact and be electrically coupled to the conductive lines 72. The contacts 111 may extend through the IMD 70 and the dielectric materials 102 and may be electrically coupled to the conductive features 322 of the underlying interconnect structure 320. The contacts 122 may extend to and be electrically coupled to the conductive lines 106 and the conductive lines 108.

As illustrated in FIGS. 33A and 33D, the conductive lines 116 extend over the IMD 70 in the first staircase region 118B and the second staircase region 118C in a direction perpendicular to longitudinal axes of the conductive lines 72. The conductive lines 116 may electrically couple the conductive lines 72 to the interconnect structure 320 through the contacts 111 in the dielectric materials 102 adjacent the conductive lines 72. As illustrated in FIG. 27A, connections to parallel conductive lines 72 may be routed through the dielectric materials 102 formed in the same trenches 100 (see FIGS. 22A through 22C), with connections to one set of the conductive lines 72 being routed in the first staircase region 118B and connections to a parallel set of the conductive lines 72 being routed in the second staircase region 118C. Connections to each set of stacked conductive lines 72 may be staggered in the first staircase region 118B and the second staircase region 118C, which may improve isolation between the connections. For example, the contacts 111 which are electrically coupled to a stack of the conductive lines 72 may be routed through the dielectric materials 102 in the first staircase region 118B and the contacts 111 which are electrically coupled to an adjacent stack of the conductive lines 72 may be routed through the dielectric materials 102 in the second staircase region 118C.

Routing connections between the conductive lines 72 and the underlying interconnect structure 320 by providing the conductive lines 116 disposed within the first staircase region 118B and the second staircase region 118C requires less area than conventional designs, which allows for greater device densities to be achieved. The connections may also be shorter than conventional designs, which reduces resistance and improves device performance. Moreover, because the trenches 112 and the trenches 114 may be formed simultaneously, and the contacts 110 and the contacts 111 may also be formed simultaneously, less lithography steps and deposition steps may be used, which reduces costs and production time.

Figure 34:
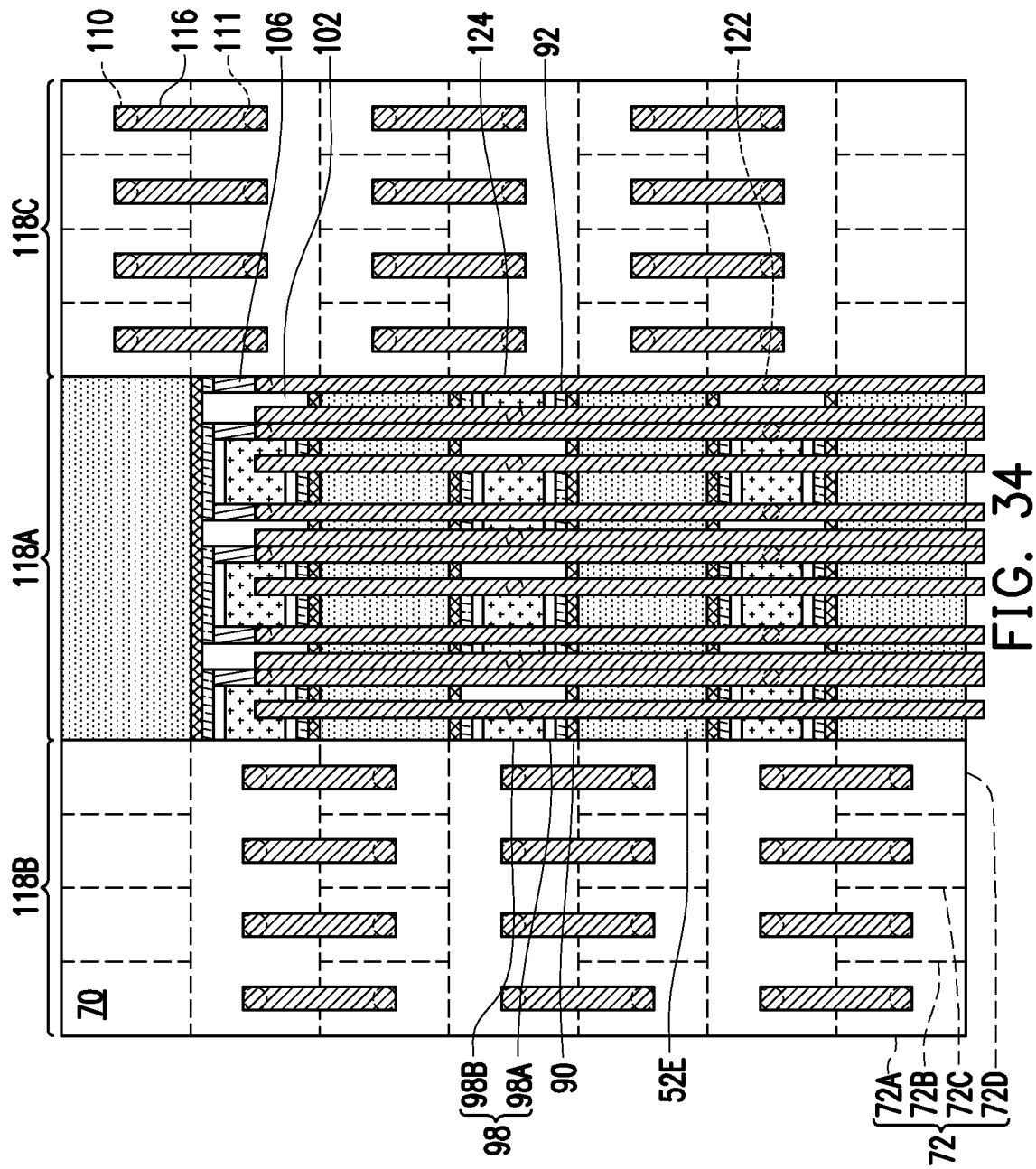

FIG. 34 illustrates an embodiment in which contacts 110 extend to each of the conductive lines 72 in both the first staircase region 118B and the second staircase region 118C. The embodiment illustrated in FIG. 34 provides double the number of drivers to the conductive lines 72 and provides drivers for each of the conductive lines 72 in both the first staircase region 118B and the second staircase region 118C. The conductive lines 116 may extend from the contacts 110 to the contacts 111 in a first direction in the first staircase region 118B, while the conductive lines 116 extend from the contacts 110 to the contacts 111 in a second direction opposite the first direction in the second staircase region 118C. The double-sided word line driving reduces word line resistance loading, which improves device performance. Moreover, routing connections between the conductive lines 72 and the underlying interconnect structure 320 by providing the conductive lines 116 disposed within the first staircase region 118B and the second staircase region 118C requires less area than conventional designs, which allows for greater device densities to be achieved. The connections may also be shorter than conventional designs, which reduces resistance and improves device performance. The trenches 112 and the trenches 114 may be formed simultaneously and the contacts 110 and the contacts 111 may be formed simultaneously such that less lithography steps and less deposition steps may be used, which reduces costs and production time.

Figure 35:
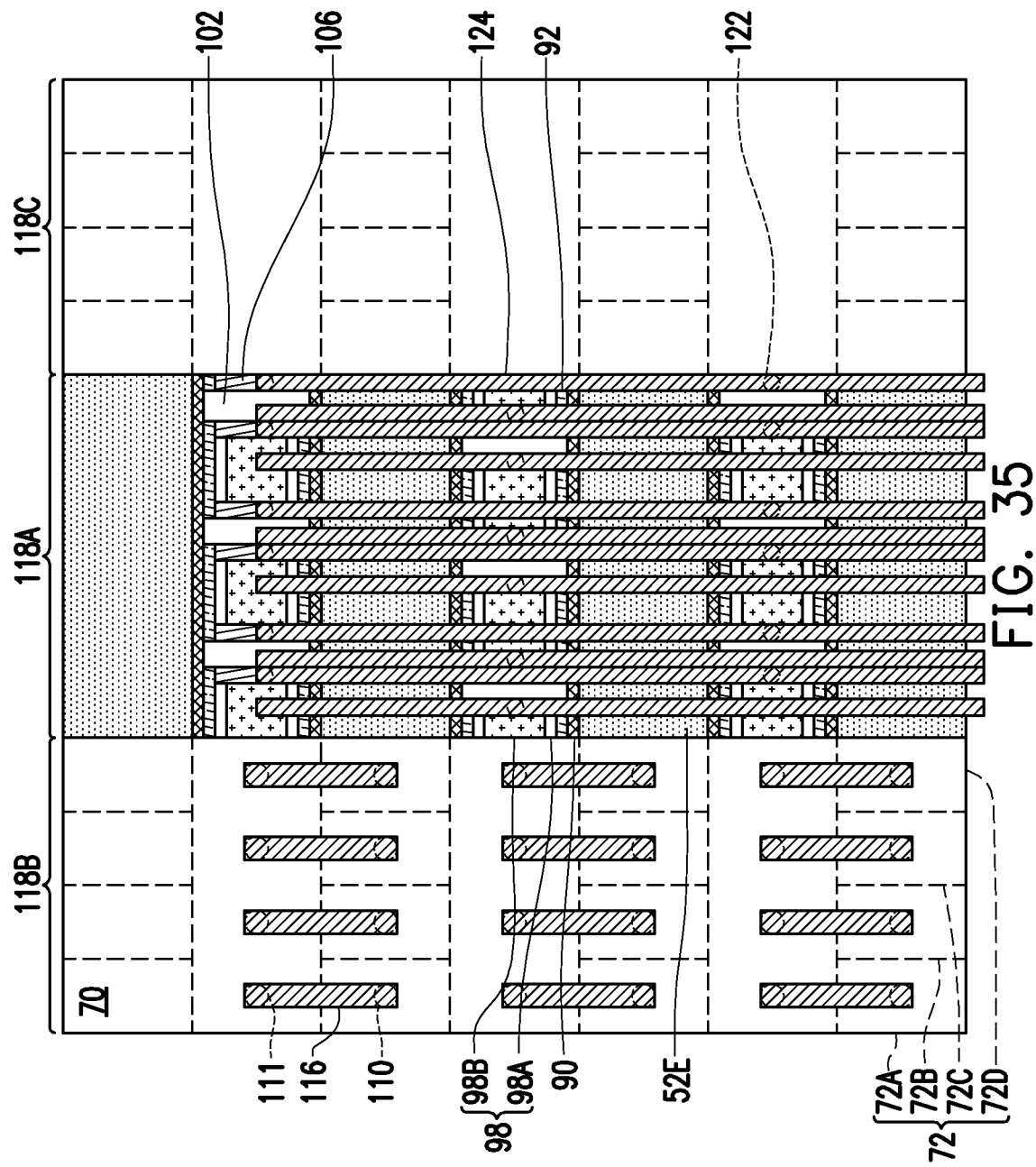

FIG. 35 illustrates an embodiment in which contacts 110 extend to each of the conductive lines 72 in the first staircase region 118B only. This embodiment allows for the second staircase region 118C to be used for other connections to the conductive lines 72 and the like, while providing connections to each of the conductive lines 72 in the first staircase region 118B. Moreover, routing connections between the conductive lines 72 and the underlying interconnect structure 320 by providing the conductive lines 116 disposed within the first staircase region 118B requires less area than conventional designs, which allows for greater device densities to be achieved. The connections may also be shorter than conventional designs, which reduces resistance and improves device performance. The trenches 112 and the trenches 114 may be formed simultaneously and the contacts 110 and the contacts 111 may be formed simultaneously such that less lithography steps and less deposition steps may be used, which reduces costs and production time.

Figure 36:
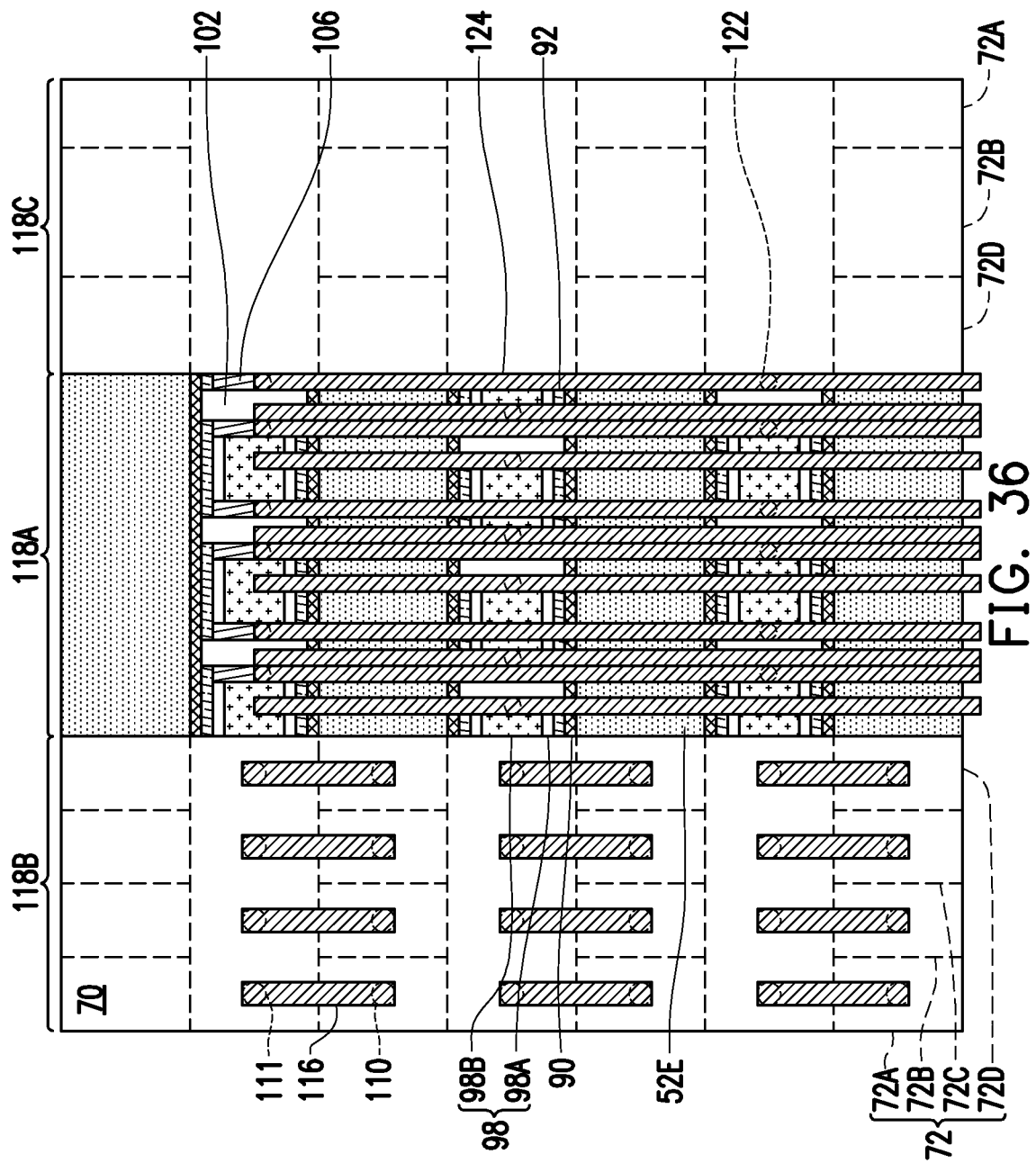

FIG. 36 illustrates an embodiment in which contacts 110 extend to each of the conductive lines 72 in the first staircase region 118B only and the first staircase region 118B and the second staircase region 118C are asymmetrical. This embodiment allows for the second staircase region 118C to be used for other connections to the conductive lines 72 and the like, while providing connections to each of the conductive lines 72 in the first staircase region 118B. In the embodiment illustrated in FIG. 36, portions of the dielectric layers 52D and 52C and the conductive lines 72C and 72D in the second staircase region 118C may have the same lengths; portions of the dielectric layer 52B and the conductive lines 72B in the second staircase region 118C may have lengths greater than the portions of the dielectric layers 52D and 52C and the conductive lines 72C and 72D in the second staircase region 118C; and portions of the dielectric layer 52A and the conductive lines 72A in the second staircase region 118C may have lengths greater than the portions of the dielectric layer 52B and the conductive lines 72B in the second staircase region 118C.

Portions of the dielectric layers 52 and the conductive lines 72 in the second staircase region 118C may have lengths different from portions of the dielectric layers 52 and the conductive lines 72 in the first staircase region 118B, which may be used to provide area savings and increase device density. In some embodiments, providing different lengths for the portions of the dielectric layers 52 and the conductive lines 72 in the second staircase region 118C and the first staircase region 118B provides greater flexibility for the connections made in the second staircase region 118C. Moreover, routing connections between the conductive lines 72 and the underlying interconnect structure 320 by providing the conductive lines 116 disposed within the first staircase region 118B requires less area than conventional designs, which allows for greater device densities to be achieved. The connections may also be shorter than conventional designs, which reduces resistance and improves device performance. The trenches 112 and the trenches 114 may be formed simultaneously and the contacts 110 and the contacts 111 may be formed simultaneously such that less lithography steps and less deposition steps may be used, which reduces costs and production time.

Embodiments may achieve various advantages. For example, forming a memory array in which connections between word lines and an underlying interconnect structure are routed through dielectric materials adjacent the word lines and inside a staircase region reduces the area required for interconnections, reduces the length of conductive lines used for the interconnections, and reduces the masking steps required to form the interconnections. This improves device density, reduces resistance, improves device performance, and reduces manufacturing time and costs.

In accordance with an embodiment, a memory array includes a ferroelectric (FE) material contacting a first word line; an oxide semiconductor (OS) layer contacting a source line and a bit line, the FE material being disposed between the OS layer and the first word line; a dielectric material contacting the FE material, the FE material being between the dielectric material and the first word line; an inter-metal dielectric (IMD) over the first word line; a first contact extending through the IMD to the first word line, the first contact being electrically coupled to the first word line; a second contact extending through the dielectric material and the FE material; and a first conductive line electrically coupling the first contact to the second contact. In an embodiment, a bottom surface of the second contact is below a bottom surface of the first contact. In an embodiment, the memory array further includes an interconnect structure under the FE material, the first word line, and the dielectric material, the second contact being electrically coupled to the interconnect structure. In an embodiment, the first conductive line extends in a direction perpendicular to a longitudinal axis of the first word line. In an embodiment, the IMD extends over the dielectric material, and the second contact further extends through the IMD. In an embodiment, the memory array further includes a transistor, the transistor including a portion of the FE material, a portion of the first word line, a portion of the OS layer, a portion of the source line, and a portion of the bit line. In an embodiment, the memory array further includes a second word line extending in a direction parallel to the first word line; a third contact extending through a second IMD to the second word line, the third contact being electrically coupled to the second word line, the third contact and the first contact being on opposite sides of the transistor in a direction parallel to a longitudinal axis of the first word line; a fourth contact extending through the dielectric material and the FE material, a line parallel to the longitudinal axis of the first word line passing through the second contact and the fourth contact; and a second conductive line electrically coupling the third contact to the fourth contact.

In accordance with another embodiment, a memory array includes a word line over a semiconductor substrate; an inter-metal dielectric (IMD) over the word line; a dielectric material adjacent the word line; a ferroelectric (FE) material in contact with the word line and the dielectric material; an oxide semiconductor (OS) layer over the FE material, the OS layer contacting a source line and a bit line, the FE material being between the OS layer and the word line; a memory cell region including a portion of the FE material, a portion of the word line, the OS layer, the source line, and the bit line; a first contact on a first side of the memory cell region, the first contact extending through the IMD, the first contact being electrically coupled to the word line; a second contact on the first side of the memory cell region, the second contact extending through the dielectric material and the FE material; and a first conductive line electrically coupling the first contact to the second contact, the first conductive line extending in a direction perpendicular to a longitudinal axis of the word line. In an embodiment, the memory array further includes a second word line contacting the FE material opposite the word line; a second IMD over the second word line; a third contact on a second side of the memory cell region opposite the first side of the memory cell region, the third contact extending through the second IMD, the third contact being electrically coupled to the second word line; a fourth contact on the second side of the memory cell region, the fourth contact extending through the dielectric material and the FE material; and a second conductive line electrically coupling the third contact to the fourth contact, the second conductive line extending in the direction perpendicular to the longitudinal axis of the word line. In an embodiment, the memory array further includes a second FE material contacting the word line; a second dielectric material contacting the second FE material; a fifth contact on the second side of the memory cell region, the fifth contact extending through the IMD, the fifth contact being electrically coupled to the word line; a sixth contact on the second side of the memory cell region, the sixth contact extending through the second dielectric material and the second FE material; and a third conductive line electrically coupling the fifth contact to the sixth contact, the third conductive line extending in the direction perpendicular to the longitudinal axis of the word line. In an embodiment, the IMD extends over the word line, the second IMD extends over the second word line, the second contact further extends through the IMD, and the fourth contact further extends through the second IMD. In an embodiment, the memory array further includes a second FE material contacting the word line; a second dielectric material contacting the second FE material; a second word line contacting the second FE material; a second IMD over the second word line; a third contact on the first side of the memory cell region, the third contact extending through the second IMD, the third contact being electrically coupled to the second word line; a fourth contact on the first side of the memory cell region, the fourth contact extending through the second dielectric material and the second FE material; and a second conductive line electrically coupling the third contact to the fourth contact, the second conductive line extending in the direction perpendicular to the longitudinal axis of the word line. In an embodiment, the IMD extends over the word line and the dielectric material, the second contact further extending through the IMD. In an embodiment, the memory array further includes a second FE material contacting the word line; a second dielectric material contacting the second FE material; a second word line contacting the second FE material, the IMD extending over the FE material, the second FE material, the dielectric material, the second dielectric material, the word line, and the second word line, the second contact further extending through the IMD; a third contact on the first side of the memory cell region, the third contact extending through the IMD, the third contact being electrically coupled to the second word line; a fourth contact on the first side of the memory cell region, the fourth contact extending through the second dielectric material, the second FE material, and the IMD; and a second conductive line electrically coupling the third contact to the fourth contact, the second conductive line extending in the direction perpendicular to the longitudinal axis of the word line.

In accordance with yet another embodiment, a method includes forming a multi-layer stack over a semiconductor substrate, the multi-layer stack including alternating conductive layers and dielectric layers; patterning a first trench extending through the multi-layer stack; depositing a ferroelectric (FE) material along sidewalls and a bottom surface of the first trench; depositing an oxide semiconductor (OS) layer over the FE material; depositing a dielectric material over the FE material; forming an inter-metal dielectric (IMD) over the multi-layer stack; forming a first conductive contact extending through the IMD to a first conductive layer of the multi-layer stack, the first conductive contact being electrically coupled to the first conductive layer; forming a second conductive contact extending through the dielectric material and the FE material; and forming a conductive line electrically coupling the second conductive contact with the first conductive contact. In an embodiment, forming the first conductive contact includes forming a second trench extending through the IMD, the second trench exposing a top surface of the first conductive layer, forming the second conductive contact including forming a third trench extending through the dielectric material and the FE material, and the second trench and the third trench being formed simultaneously. In an embodiment, the method further includes patterning the multi-layer stack such that the conductive layers and the dielectric layers have a staircase shape in a cross-sectional view. In an embodiment, the method further includes patterning the dielectric material to have the staircase shape in the cross-sectional view, the IMD being formed over the multi-layer stack and the dielectric material after patterning the dielectric material and the multi-layer stack to have the staircase shape. In an embodiment, the dielectric material is formed extending through the IMD. In an embodiment, the first conductive contact and the second conductive contact are formed by separate processes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
depositing a ferroelectric (FE) material on a first word line;
depositing an oxide semiconductor (OS) layer on the FE material;
patterning a first trench in the OS layer;
depositing a dielectric material in the first trench and on the FE material;
depositing an inter-metal dielectric (IMD) on the first word line;
patterning the IMD to form a second trench exposing the first word line;
patterning the dielectric material and the FE material to form a third trench;
forming a first contact in the second trench;
forming a second contact in the third trench; and
forming a first conductive line electrically coupling the first contact to the second contact.

2. The method of claim 1, wherein the third trench is patterned to a depth greater than the second trench.

3. The method of claim 1, wherein the IMD, the dielectric material, and the FE material are patterned simultaneously to form the second trench and the third trench.

4. The method of claim 1, wherein the first word line is on an interconnect structure wherein the second contact is electrically coupled to the interconnect structure.

5. The method of claim 1, wherein the third trench is patterned through the IMD.

6. The method of claim 1, wherein the first contact and the second contact are formed simultaneously.

7. The method of claim 1, further comprising forming a patterned photoresist on the IMD, wherein the second trench and the third trench are patterned through the patterned photoresist.

8. A method comprising:
patterning a conductive layer in a multi-layer stack to form a word line and a first trench adjacent the word line;
depositing a ferroelectric (FE) material in the first trench;
depositing an oxide semiconductor (OS) layer in the first trench and on the FE material;
patterning the OS layer to form a second trench exposing the FE material;
forming a dielectric material in the second trench;
patterning the dielectric material and the FE material to form a third trench;
forming a first contact in the third trench; and
forming a first conductive line electrically coupled to the first contact and the word line.

9. The method of claim 8, further comprising forming the multi-layer stack on a first interconnect structure, wherein the first contact is electrically coupled to the first interconnect structure.

10. The method of claim 8, further comprising:
forming an inter-metal dielectric on the word line;
patterning the inter-metal dielectric to form a fourth trench exposing the word line; and
forming a second contact in the fourth trench, wherein the second contact electrically couples the word line to the first conductive line.

11. The method of claim 10, wherein the third trench is patterned through the inter-metal dielectric.

12. The method of claim 8, further comprising patterning the multi-layer stack to form a first staircase structure adjacent a first end of the word line and a second staircase structure adjacent a second end of the word line, wherein the first staircase structure and the second staircase structure are asymmetric in a cross-sectional view.

13. The method of claim 8, further comprising forming an inter-metal dielectric on the word line, wherein the third trench is patterned through the inter-metal dielectric.

14. The method of claim 13, further comprising planarizing the first contact, the inter-metal dielectric, and the multi-layer stack.

15. A method comprising:
forming a multi-layer stack over a semiconductor substrate, the multi-layer stack comprising alternating conductive layers and dielectric layers;
patterning a first trench extending through the multi-layer stack;
depositing a ferroelectric (FE) material along sidewalls and a bottom surface of the first trench;
depositing an oxide semiconductor (OS) layer over the FE material;
depositing a dielectric material over the FE material;
forming an inter-metal dielectric (IMD) over the multi-layer stack;
forming a first conductive contact extending through the IMD to a first conductive layer of the multi-layer stack, wherein the first conductive contact is electrically coupled to the first conductive layer;
forming a second conductive contact extending through the dielectric material and the FE material; and
forming a conductive line electrically coupling the second conductive contact with the first conductive contact.

16. The method of claim 15, wherein forming the first conductive contact comprises forming a second trench extending through the IMD, wherein the second trench exposes a top surface of the first conductive layer, wherein forming the second conductive contact comprises forming a third trench extending through the dielectric material and the FE material, and wherein the second trench and the third trench are formed simultaneously.

17. The method of claim 15, further comprising patterning the multi-layer stack such that the conductive layers and the dielectric layers have a staircase shape in a cross-sectional view.

18. The method of claim 17, further comprising patterning the dielectric material to have the staircase shape in the cross-sectional view, wherein the IMD is formed over the multi-layer stack and the dielectric material after patterning the dielectric material and the multi-layer stack to have the staircase shape.

19. The method of claim 15, wherein the dielectric material is formed extending through the IMD.

20. The method of claim 15, wherein the first conductive contact and the second conductive contact are formed by separate processes.

* * * * *